(12) United States Patent
Maekawa et al.

(10) Patent No.: US 8,293,457 B2
(45) Date of Patent: Oct. 23, 2012

(54) SUBSTRATE HAVING FILM PATTERN AND MANUFACTURING METHOD OF THE SAME, MANUFACTURING METHOD OF SEMICONDUCTOR DEVICE, LIQUID CRYSTAL TELEVISION, AND EL TELEVISION

(75) Inventors: Shinji Maekawa, Kanagawa (JP); Gen Fujii, Kanagawa (JP); Hiroko Shiroguchi, Kanagawa (JP); Masafumi Morisue, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/537,005

(22) Filed: Aug. 6, 2009

(65) Prior Publication Data
US 2009/0291552 A1 Nov. 26, 2009

Related U.S. Application Data

(63) Continuation of application No. 11/025,921, filed on Jan. 3, 2005.

(30) Foreign Application Priority Data

Jan. 16, 2004 (JP) .................................. 2004-009232
Apr. 28, 2004 (JP) .................................. 2004-134898

(51) Int. Cl.
*G03F 7/26* (2006.01)
(52) U.S. Cl. ....................................................... 430/311
(58) Field of Classification Search .................. 430/311, 430/313, 315
See application file for complete search history.

(56) References Cited

U.S. PATENT DOCUMENTS

| | | |
|---|---|---|
| 6,337,222 B1 | 1/2002 | Shimoda et al. |
| 6,524,972 B1 | 2/2003 | Maeda |
| 6,610,552 B2 | 8/2003 | Fujimori et al. |
| 6,670,104 B2 | 12/2003 | Kido |
| 6,727,513 B2 | 4/2004 | Fujimori et al. |
| 6,734,029 B2 | 5/2004 | Furusawa |
| 6,838,361 B2 | 1/2005 | Takeo |
| 6,838,696 B2 | 1/2005 | Kobayashi et al. |
| 6,861,377 B1 | 3/2005 | Hirai et al. |
| 6,906,779 B2 | 6/2005 | Chan-Park et al. |

(Continued)

FOREIGN PATENT DOCUMENTS

CN 1263602 8/2000

(Continued)

OTHER PUBLICATIONS

English translation of JP Publication 2001-039713, Feb. 2001.*

(Continued)

*Primary Examiner* — Brittany Raymond
(74) *Attorney, Agent, or Firm* — Nixon Peabody LLP; Jeffrey L. Costellia

(57) ABSTRACT

The invention provides a manufacturing method of a substrate having a film pattern including an insulating film, a semiconductor film, a conductive film and the like by simple steps, and also a manufacturing method of a semiconductor device which is low in cost with high throughput and yield. According to the invention, after forming a first protective film which has low wettability on a substrate, a material which has high wettability is applied or discharged on an outer edge of a first mask pattern, thereby a film pattern and a substrate having the film pattern are formed.

20 Claims, 34 Drawing Sheets

U.S. PATENT DOCUMENTS

| | | | |
|---|---|---|---|
| 6,939,665 B2 | 9/2005 | Ishida et al. | |
| 7,084,017 B2 | 8/2006 | Nakamura et al. | |
| 7,157,788 B2 | 1/2007 | Murofushi et al. | |
| 7,394,097 B2 | 7/2008 | Kobayashi et al. | |
| 7,399,704 B2 | 7/2008 | Fujii et al. | |
| 7,405,033 B2 | 7/2008 | Yamazaki et al. | |
| 7,544,536 B2 | 6/2009 | Murofushi et al. | |
| 7,645,648 B2 | 1/2010 | Kobayashi et al. | |
| 7,755,088 B2 | 7/2010 | Kobayashi et al. | |
| 8,053,171 B2 | 11/2011 | Maekawa et al. | |
| 2001/0017409 A1* | 8/2001 | Hiroki et al. | 257/723 |
| 2002/0053320 A1* | 5/2002 | Duthaler et al. | 118/249 |
| 2003/0180451 A1* | 9/2003 | Kodas et al. | 427/123 |
| 2004/0129978 A1* | 7/2004 | Hirai | 257/347 |
| 2004/0147113 A1* | 7/2004 | Yamazaki et al. | 438/660 |
| 2005/0025880 A1 | 2/2005 | Masuda | |

FOREIGN PATENT DOCUMENTS

| | | |
|---|---|---|
| CN | 1462484 | 12/2003 |
| EP | 0 978 737 A1 | 2/2000 |
| EP | 1 037 276 A1 | 9/2000 |
| EP | 1 139 455 A2 | 10/2001 |
| EP | 1 213 759 A1 | 6/2002 |
| EP | 1 363 348 A1 | 11/2003 |
| JP | 06-182980 | 7/1994 |
| JP | 10-283847 | 10/1998 |
| JP | 2000-039213 | 2/2000 |
| JP | 2000-089213 | 3/2000 |
| JP | 2001-039713 * | 2/2001 |
| JP | 2001-339072 | 12/2001 |
| JP | 2002-164635 | 6/2002 |
| JP | 2002-237383 | 8/2002 |
| JP | 2002-289859 | 10/2002 |
| JP | 2002-311592 | 10/2002 |
| JP | 2003-124210 | 4/2003 |
| JP | 2003-124215 | 4/2003 |
| JP | 2003-282559 | 10/2003 |
| JP | 2003-309265 | 10/2003 |
| JP | 2003-332552 | 11/2003 |
| JP | 2004-006700 | 1/2004 |
| JP | 2004-241769 | 8/2004 |
| JP | 2005-334864 | 12/2005 |
| KR | 2003-0023624 | 3/2003 |
| TW | 526393 | 4/2003 |
| TW | 552639 | 9/2003 |
| TW | 556044 | 10/2003 |
| TW | 559687 | 11/2003 |
| WO | WO-02/065215 A2 | 8/2002 |
| WO | WO-02/067357 A1 | 8/2002 |
| WO | WO 02/073712 A1 | 9/2002 |

OTHER PUBLICATIONS

Office Action (Chinese Patent Application No. 200510004768.7), dated Jan. 18, 2008.

Chinese Office Action (Application No. 200910161174.5), dated Jan. 5, 2011.

Korean Office Action (Application No. 2005-0003904), dated May 27, 2011 with English Translation.

Taiwanese Office Action (Application No. 94100657), dated Sep. 16, 2011.

* cited by examiner

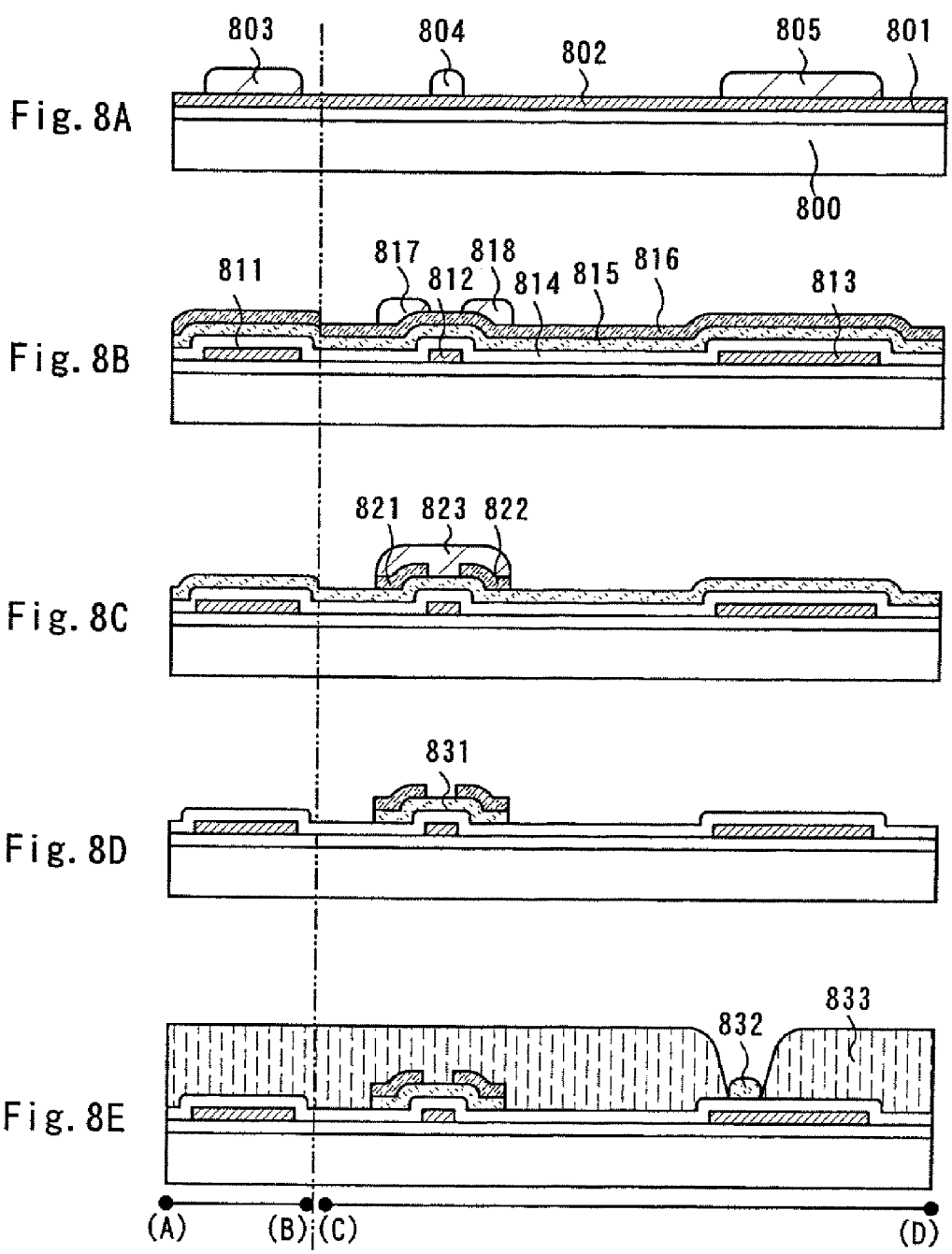

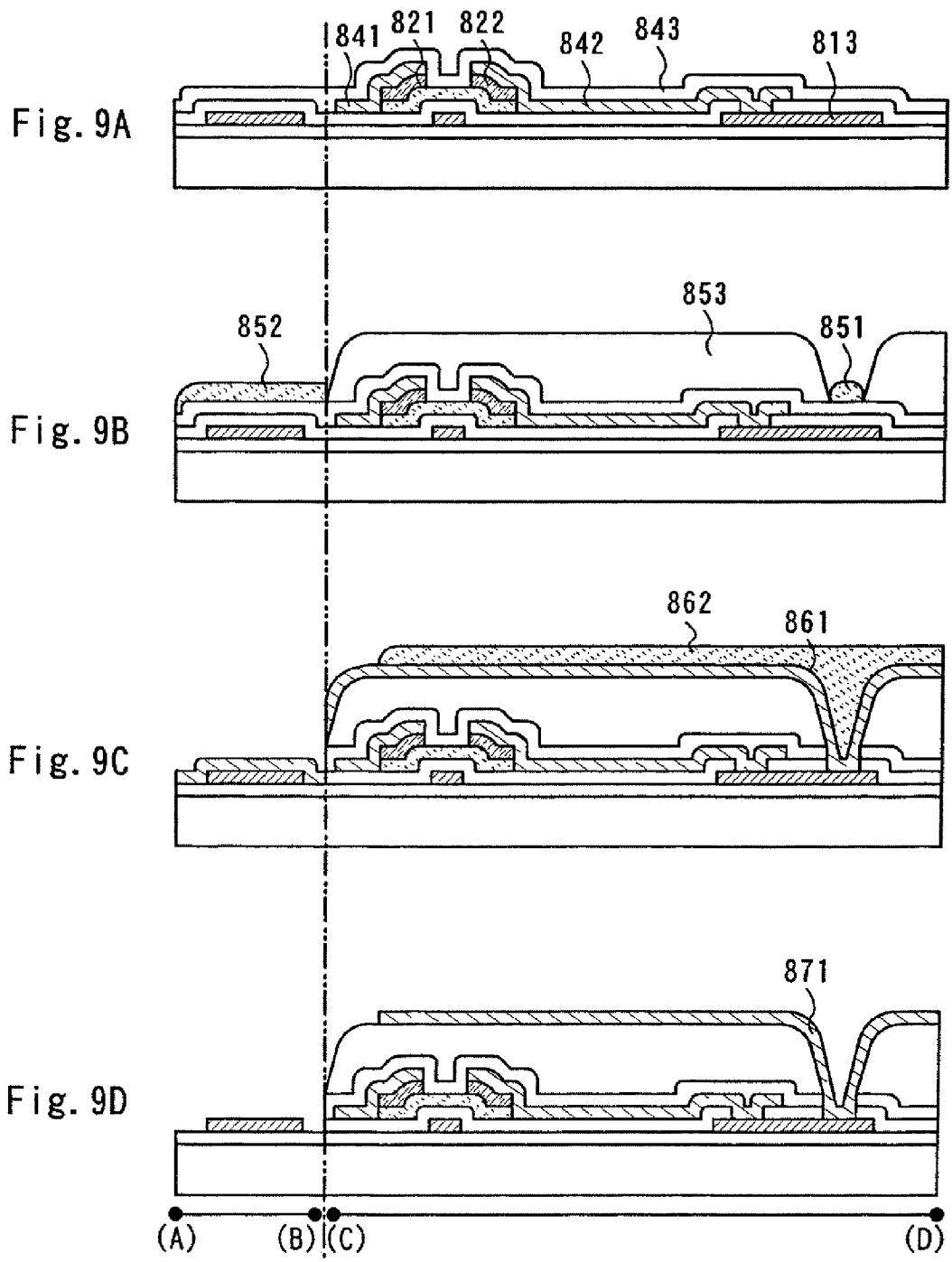

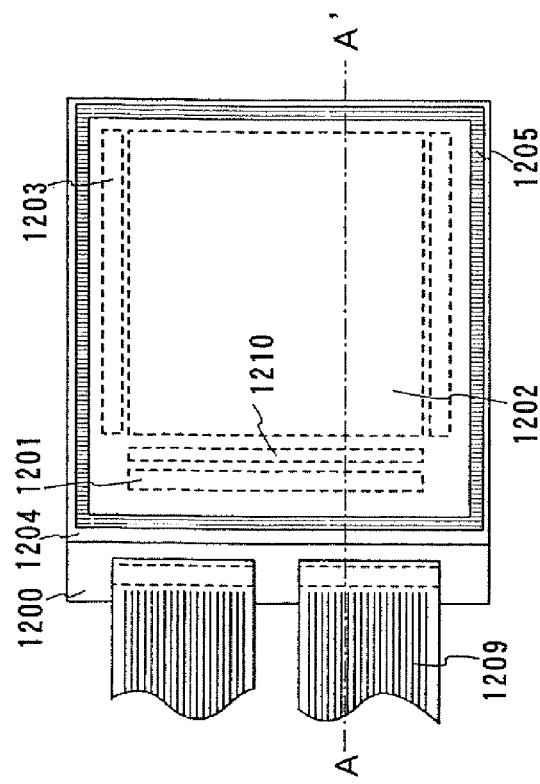
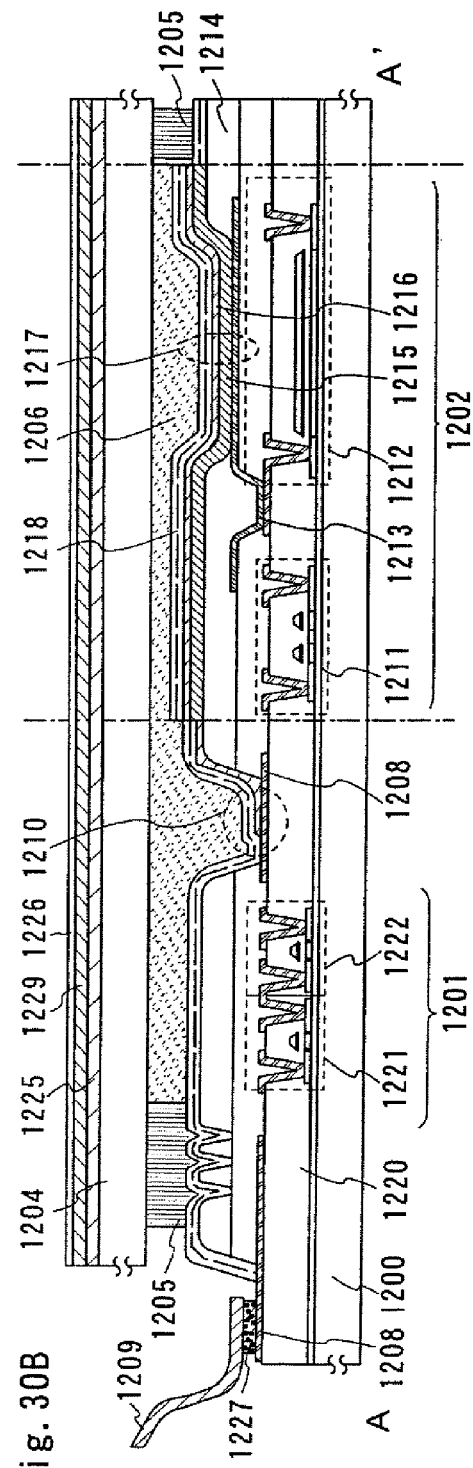
Fig. 30A
Fig. 30B

SUBSTRATE HAVING FILM PATTERN AND MANUFACTURING METHOD OF THE SAME, MANUFACTURING METHOD OF SEMICONDUCTOR DEVICE, LIQUID CRYSTAL TELEVISION, AND EL TELEVISION

BACKGROUND OF THE INVENTION

1. Field of the Invention

The present invention relates to a manufacturing method of a semiconductor device having a semiconductor element formed by using a droplet discharging method represented by an ink-jetting method, and to a technique to form a mask pattern, a contact hole, and a film of each portion of a semiconductor element.

2. Description of the Related Art

It is examined that a droplet discharging apparatus is used for forming a pattern of a thin film and a wiring used for a semiconductor element in order to realize low cost equipment and simplify the process in manufacturing a semiconductor device.

A contact hole of a semiconductor element is formed by a photolithography process in which resist is applied on an entire surface of the substrate, prebaked, an ultraviolet ray and the like are irradiated to the substrate through a mask pattern, and a resist pattern is formed by development. Then, an insulating film formed on a portion to be a contact hole is removed by etching with the resist pattern as a mask pattern, thus the contact hole is formed.

Further, a film pattern of a desired shape is formed by etching a semiconductor film, an insulating film, a metal film and the like by using a resist pattern.

[Patent Document 1]

Japanese Patent Laid-Open No. 2000-89213

SUMMARY OF THE INVENTION

However, in the conventional process for forming a film pattern, an insulating film having a contact hole, and the like, bulk of materials of the film pattern and the resist are wasted and a large number of steps are required for forming a mask pattern, which decreases throughput.

In the case where the amount of application of resist and a surface condition of a base film are not controlled sufficiently when opening a contact hole, the resist spreads over the contact hole and a defective contact may occur.

The invention is made in view of the aforementioned problems to provide a manufacturing method of a substrate having a film pattern of an insulating film, a semiconductor film, a conductive film and the like through simple steps, and a manufacturing method of a low cost semiconductor device with high throughput and yield.

According to the invention, after a first protective film (hereinafter referred to as a mask pattern) which has low wettability is formed on a substrate, a highly wettable material is applied or discharged on an outer edge of the first mask pattern to form a film pattern and a substrate having the film pattern.

According to the invention, after the first mask pattern which has low wettability is formed on the substrate, a highly wettable material is applied or discharged on a region except for the first mask pattern to form a film pattern and a substrate having the film pattern.

According to the invention, after the first mask pattern which has low wettability is formed on the substrate, a highly wettable material is applied or discharged in a region on which the first mask pattern is not formed to form a film pattern and a substrate having the film pattern.

According to the invention, after the first mask pattern which has low wettability is formed on a thin film or a member, a second mask pattern which has high wettability is formed, the first mask pattern and a thin film or a member covered with the first mask pattern are removed, and an insulating film having a film pattern or a contact hole is formed. Note that the second mask pattern can be removed later.

The first mask pattern which has low wettability easily repels liquid while liquid spreads over the second mask pattern which has high wettability. Liquid solution as a material of for the second mask pattern is repelled in a semispherical shape on a surface of the first mask pattern, therefore, the second mask pattern can be formed in a self-aligned manner.

The first mask pattern which has low wettability can be formed by irradiating plasma fluoride to an insulating layer. The plasma fluoride can be generated in fluorine or fluoride atmosphere, or by using an electrode having a dielectric including fluoroplastic.

For forming the first mask pattern which has low wettability, a material which has low wettability may be discharged or applied on a predetermined position. The material which has low wettability is, for example, a compound containing a fluorocarbon chain.

It is preferable that a contact angle of the first mask pattern which has low wettability be larger than a contact angle of the second mask pattern which has high wettability, and a difference between these contact angles be 30°, or preferably 40° or more. As a result, each mask pattern can be formed in a self-aligned manner as the material of the second mask pattern is repelled in a semispherical shape on the surface of the first mask pattern.

The second mask pattern is preferably used for a mask for forming a film pattern.

The film pattern is an insulating film, a semiconductor film, a conductive film having desired shapes, or an insulating film having a contact hole. Typically, a gate insulating film, an interlayer insulating film, a protective film, an insulating film such as an insulting film having a contact hole, a semiconductor film of a channel forming region, a source region, and a drain region, and a conductive film such as a source electrode, a drain electrode, a wiring, a gate electrode, a pixel electrode, and an antenna are used. After removing the mask pattern, composition of the mask pattern still exists in the periphery of the film pattern (a region in which the mask pattern was formed).

The first mask pattern which has low wettability is formed by using a liquid phase method or a printing method. The liquid phase method includes the droplet discharging method, the ink-jetting method and the like representatively.

The second mask pattern which has high wettability is formed by using the liquid phase method. The liquid phase method includes a droplet discharging method, an ink-jetting method, a spin coating method, a roll coating method, a slot coating method and the like representatively.

According to the invention, a semiconductor element is formed by using a film pattern or a member formed by using the first mask pattern which has low wettability and the second mask pattern which has high wettability. The semiconductor element is, for example, a TFT, a field effect transistor (FET), a MOS transistor, a bipolar transistor, an organic semiconductor transistor, an MIM element, a memory element, a diode, a photoelectric converter, a capacitor, a resistor and the like.

According to the invention, a semiconductor device having a film pattern formed by using the first mask pattern which has low wettability and the second mask pattern which has high wettability, a substrate having the film pattern, or a semiconductor element, and a manufacturing method thereof are provided. The semiconductor device is, for example, an integrated circuit, a display device, a wireless tag, an IC tag, an IC card and the like formed of a semiconductor element. The display device includes a liquid crystal display device, a light emitting display device, a DMD (Digital Micromirror Device), a PDP (Plasma Display Panel), an FED (Field Emission Display), an electrophoresis display device (electronic paper) and the like representatively. The TFT is, for example, a staggered TFT, an inverted staggered TFT (a channel-etch type TFT or a channel protective type TFT), a top gate coplanar TFT, a bottom gate coplanar TFT and the like.

In the invention, a display device means a device using a display element, that is an image display device. Further, a module in which a connector such as a flexible printed circuit (FPC) or a TAB (Tape Automated Bonding) tape or a TCP (Tape Carrier Package) are attached to a display panel, a module in which an IC (Integrated Circuit) and a CPU are directly mounted on a display element by a COG (Chip On Glass) method are all included in the display device.

The invention provides the aforementioned film pattern, a substrate having the film pattern, a semiconductor element, or a liquid crystal television or an EL television having a semiconductor device.

According to the invention, after forming a mask pattern by using a material for forming a liquid repellent surface on a lyophilic surface, a film pattern and a substrate having the film pattern are formed by using a lyophilic material on an outer edge of the mask pattern.

According to the invention, after forming a mask pattern by using a material for forming a liquid repellent surface on a lyophilic surface, a film pattern and a substrate having the film pattern are formed by using a lyophilic material in a region except for the mask pattern.

According to the invention, after forming a mask pattern by using a material for forming a liquid repellent surface on a lyophilic surface, a film pattern and a substrate having the film pattern are formed by using a lyophilic material in a region where the mask pattern is not formed.

According to the invention, after forming a first mask pattern by using a material for forming a liquid repellent surface on a film or a member having a lyophilic surface, a second mask pattern is formed by using a lyophilic material, and the first mask pattern and the film or the member having a lyophilic surface covered with the first mask pattern are removed to form a film pattern or an insulating film having a contact hole. Note that the second mask pattern can be removed as well.

The film pattern is an insulating film having a desired shape, a semiconductor film, a conductive film, or an insulating film having a contact hole. Typically, a gate insulating film, an interlayer insulating film, a protective film, an insulating film such as an insulting film having a contact hole, a semiconductor film of a channel forming region, a source region, a drain region, and the like, and a conductive film such as a source electrode, a drain electrode, a wiring, a gate electrode, a pixel electrode, and an antenna and the like are used. After removing the mask pattern, composition of the mask pattern still exists in the periphery of the film pattern (a region in which the mask pattern was formed).

A material for forming a liquid repellent surface is representatively silane coupling agent expressed by a chemical formula: $R_n$—Si—$X_{(4-n)}$ (n=1, 2, and 3). Here, R contains a comparatively inactive group such as an alkyl group. Further, X denotes hydrolysable group which can be bound by the condensation with absorptive water or hydroxyl group on a surface of a ground substance such as halogen, methoxy group, ethoxy group, or acetoxy group.

A silane coupling agent containing fluorocarbon group as R (flouroalkyl silane (FAS)) forms a liquid repellent surface which has higher liquid repellency.

A material having a fluorocarbon chain (representatively fluorocarbon resin) is an example of the material having a liquid repellent surface.

The solvent forming the water repellent surface is hydrocarbon solvent such as n-pentane, n-hexane, n-heptane, n-octane, n-decane, dicyclopentane, benzene, toluene, xylene, durene, indene, tetrahydronaphthalene, decabydronaphthalene, and squalene, or tetrahydrofuran and the like.

By irradiating plasma, laser or electron beam to the material having a liquid repellent surface, the liquid repellency can be improved.

As the lyophilic material, a substituent (hydroxyl group, hydrogen group) which can be bonded to the lyophilic surface by hydrolysis or a substituent (hydroxyl group, hydrogen group, carbonyl group, amino group, sulfonyl group, ether group and the like) which is capable of hydrogen bonding are used. Representatively, organic resin such as acryl resin, polyimide resin, melamine resin, polyester resin, polycarbonate resin, phenol resin, epoxy resin, polyacetal, polyether, polyurethane, polyamide (nylon), furan resin, diallyl phthalate resin, and also siloxane and polysilazane can be used. Siloxane is a polymer material which contains a bond of silicon (Si) and oxygen (O) as a backbone structure and contains at least hydrogen as a substituent or at least one of fluoride, alkyl group, or aromatic carbon hydride as a substituent. Polysilazane is a polymer material containing a bond of silicon (Si) and nitrogen (Ni), that is a liquid material containing polysilazane.

A lyophilic surface has a reactive group having polarity on the surface, representatively a substituent (hydroxyl group, hydrogen group) which can be bonded to the lyophilic surface by hydrolysis or a substituent (hydroxyl group, hydrogen group, carbonyl group, amino group, sulfonyl group, ether group and the like) which is capable of hydrogen bonding.

A mask pattern formed of a material for forming a liquid repellent surface is formed by using the liquid phase method. The liquid phase method includes the droplet discharging method, the ink-jetting method and the like representatively.

A mask pattern or a film pattern formed of lyophilic solution is formed by using the liquid phase method. The liquid phase method is, for example, the droplet discharging method, the ink-jetting method, the spin coating method, the roll coating method, the slot coating method and the like representatively.

According to the invention, a semiconductor element is formed by using a film pattern or a member formed by using the mask pattern formed of a material for forming a liquid repellent surface. The semiconductor element includes a TFT, a field effect transistor (FET), a MOS transistor, a bipolar transistor, an organic semiconductor transistor, an MIM element, a memory element, a diode, a photoelectric converter, a capacitor, a resistor and the like.

The invention provides a film pattern formed by using the mask pattern having a liquid repellent surface, a substrate having the film pattern, or a semiconductor device having a semiconductor element, and a manufacturing method thereof. The semiconductor device is, for example, an integrated circuit, a display device, a wireless tag, an IC tag, and the like formed of a semiconductor element. The display device is, for example, a liquid crystal display device, a light emitting display, device, a DMD (Digital Micromirror Device), a PDP (Plasma Display Panel), an FED (Field Emission Display), an electrophoresis display device (electronic paper) and the like. The TFT is, for example, a staggered TFT, and an inverted staggered TFT (a channel-etch type TFT or a channel protective type TFT).

In the invention, a display device means a device using a display element, that is an image display device. Further, a module in which a connector such as a flexible printed circuit (FPC) or a TAB (Tape Automated Bonding) tape or a TCP (Tape Carrier Package) is attached to a display panel, a module in which an IC (Integrated Circuit) and a CPU (Central Processing Unit) are directly mounted on a display element by a COG (Chip On Glass) method are all included in the display device.

The invention provides the aforementioned film pattern, a substrate having the film pattern, a semiconductor element, or a liquid crystal television and an EL television having the semiconductor element.

By using the first mask pattern which has low wettability and the second mask pattern which has high wettability according to the invention, a film pattern of a desired shape can be formed on a desired position. A film which functions as an interlayer insulating film, a planarizing film, a gate insulating film and the like can be formed selectively on a desired position. Moreover, as an insulating film having a film pattern and a contact hole can be formed without exposure and development processes using a resist mask pattern, the process can considerably be simplified as compared to a conventional technique.

By irradiating plasma, laser or electron beam and the like on a mask pattern which has low wettability, the wettability can be further decreased.

By using a mask pattern formed of a material for forming a liquid repellent surface, a film pattern of a desired shape can be formed at a desired position. A film which functions as an interlayer insulating film, a planarizing film, a gate insulating film and the like can be formed selectively on a desired position. Moreover, as an insulating film having a film pattern and a contact hole can be formed without exposure and development processes using a resist mask pattern, therefore, the process can considerably be simplified as compared to a conventional technique. As the mask pattern has a liquid repellent surface, a film formed of a lyophilic material is not formed, thus the mask pattern can easily be removed and a favorable contact hole can be formed through a simplified process.

By irradiating plasma, laser, or electron beam and the like to a mask pattern formed of a material for forming a liquid repellent surface, the liquid repellency can be further improved.

By applying the droplet discharging method before forming a mask pattern which has low wettability, a mask pattern formed of a material for forming a liquid repellent surface, a conductive film and the like, droplets can be discharged on an arbitrary position by changing a relative positions of a substrate and a nozzle which is an discharging hole of the droplets containing a material of the aforementioned films. As a thickness and a width of a pattern to be formed can be controlled according to a relative relationship of a nozzle diameter, an amount of the droplets to be discharged, and a moving rate of the nozzle and a substrate on which the discharged droplets are formed, those films can be formed at a desired position with high accuracy by discharge. Since a patterning process, namely the exposure and development processes using a mask pattern can be omitted, the process can considerably be simplified and cost can be reduced. By using the droplet discharging method, a pattern can be formed at an arbitrary position and a thickness and a width of the pattern can be controlled. Therefore, even a large semiconductor substrate of which one side is longer than 1 to 2 m can be manufactured at low cost with high yield.

In this manner, according to the invention, a film pattern, a substrate having the film pattern, an insulating film having a contact hole, and moreover a semiconductor element and a semiconductor device having these can be formed through a simple process with high precision. Furthermore, the invention can provide a manufacturing method of a semiconductor element and a semiconductor device at low cost with high throughput and high yield.

BRIEF DESCRIPTION OF THE DRAWINGS

FIGS. 8A to 8E are sectional views showing manufacturing steps of a semiconductor device according to the invention.

FIGS. 9A to 9D are sectional views showing manufacturing steps of a semiconductor device according to the invention.

FIGS. 30A and 30B are views showing a structure of a light emitting display module according to the invention.

DETAILED DESCRIPTION OF THE INVENTION

Figure 1A:
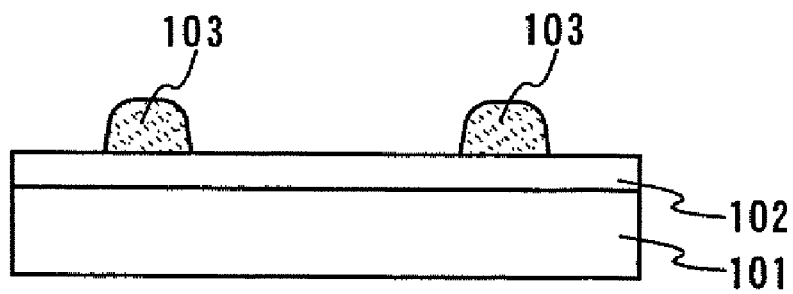
FIGS. 1A to 1C are sectional views showing steps of forming a film pattern according to the invention.

Although the present invention will be fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein. Note that identical portions in embodiment modes are denoted by the same reference numerals and detailed descriptions thereof are omitted.

Embodiment Mode 1

In this embodiment mode, a step for forming a film pattern having a desired shape by using a mask pattern which has low wettability is described with reference to FIG. 1. Note that the mask pattern described in this embodiment mode is a mask pattern used for forming a film pattern.

As shown in FIG. 1A, a first film 102 is formed on a substrate 101. A first mask pattern 103 which has low wettability is formed thereon by the droplet discharging method, the ink-jetting method and the like. Here, the droplet discharging method is used as a method for forming the mask pattern.

As the substrate 101, a glass substrate, a quartz substrate, a substrate formed of an insulating substance such as alumina, a plastic substrate which can resist a processing heat of a subsequent step, a silicon wafer, a metal substrate and the like can be used. In this case, it is preferable to form an insulating film for preventing impurities and the like from dispersing from a substrate side, such as silicon oxide (SiOx), silicon nitride (SiNx), silicon oxynitride (SiOxNy) (x>y), and silicon nitride oxide (SiNxOy) (x>y) films. Metal plate such as stainless or a semiconductor substrate over which an insulating film such as silicon oxide and silicon nitride are formed can be used as well. Also, a substrate of which size is 320×400 mm, 370×470 mm, 550×650 mm, 600×720 mm, 680×880 mm, 1000×1200 mm, 1100×1250 mm, or 1150×1300 mm can be used as the substrate 101. Here, a glass substrate is used as the substrate 101.

In the case of using a plastic substrate as the substrate 101, it is preferable to use PC (polycarbonate), PES polyethylene sulfone), PET (polyethylene terephthalate), PEN (polyethylene naphthalate) or the like which has relatively high glass transition temperatures.

As the first film 102, any of an insulating layer, a conductive layer, and a semiconductor layer which are formed by a sputtering method, a vapor deposition method, a CVD method, an application method and the like can be used. A known inorganic insulating material or an organic insulating material is appropriately used for the first film 102 formed of an insulating layer. Representatively, $SiO_2$ and the like having a Si—$CH_3$ bond which is typically polyimide, polyamide, polyester, acryl, a PSG (Phosphor Silicate Glass), a BPSG (Boron Phosphorous Silicon Glass), a film, silicate SOG (Spin On Glass), alkoxysilicate SOG, polysilazane SOG, and siloxane polymer can be formed by the droplet discharging method, the application method, or the printing method. Also, silicon nitride, silicon nitride oxide, silicon oxide and the like can be formed by a PVD (Physical Vapor Deposition) method, a CVD (Chemical Vapor Deposition) method, and a thermal oxidizing method. Moreover, a metal oxide such as Ag, Cu, Ni, Pt, Pd, Ir, Rh, W, Al, Ta, Mo, Cd, Zn, Fe, Ti, Si, Ge, Zr, and Ba can be formed by a vapor deposition method, an anode oxidizing method and the like. Here, a silicon oxide film is formed by the sputtering method.

As a material for the first film 102 formed of a conductive layer, metal, alloy, or metal nitride of Ag, Au, Cu, Ni, Pt, Pd, Ir, Rh, W, Al, Ta, Mo, Cd, Zn, Fe, Ti, Si, Ge, Zr, Ba and the like can be used. Further, indium tin oxide (ITO), zinc oxide (ZnO), indium zinc oxide (IZO), gallium-doped zinc oxide (GZO), indium tin oxide containing silicon oxide, organic indium, organotin and the like used for a light-transmitting conductive film can be appropriately used. Further, aluminum containing 1 to 20% of nickel can be used. Here, aluminum is used for forming the first conductive layer.

As a material for the first film 102 formed of a semiconductor layer, a film having any one of an amorphous semiconductor using silicon, silicon germanium (SiGe) and the like, a semi-amorphous semiconductor which has both an amorphous state and a crystalline state, a micro-crystalline semiconductor in which crystal grains of 0.5 to 20 nm can be observed in an amorphous semiconductor, and a crystalline semiconductor can be formed. Further, an organic semiconductor material such as polythienylene vinylene, poly(2,5-thienylene vinylene), polyacetylene, polyacetylene derivative, and polyarylene vinylene can be used as well.

Here, a silicon oxide film is formed by a CVD method as the first film.

The first mask pattern functions as a mask for forming a film pattern which is formed later. Therefore, it is preferable that the first mask pattern has low wettability.

The first mask pattern 103 is formed by forming an insulating layer which has high wettability at a predetermined position and irradiating fluorine plasma on the surface. Also, plasma treatment can be performed by providing an electrode having a dielectric and generating plasma so that the dielectric is exposed to the plasma using air, oxygen or nitrogen. In this case, the dielectric is not required to cover the whole surface of the electrode. As the dielectric, fluorine resin can be used. By using the fluorine resin, a $CF_2$ bond is formed on the surface of the insulating layer, thereby the surface property is modulated and the wettability is lowered.

As a material for the insulating film, a material obtained by mixing water-soluble resin such as polyvinyl alcohol (PVA) in the solution of $H_2O$ and the like can be used. Moreover, PVA and other water-soluble resin can be mixed as well. Further, organic resin such as acryl resin, polyimide resin, melamine resin, polyester resin, polycarbonate resin, phenol resin, epoxy resin, polyacetal, polyether, polyurethane, polyamide (nylon), furan resin, diallyl phthalate resin, and a resist and the like can be used.

The insulating layer can be formed by the droplet discharging method, the screen (stencil) printing method, an offset (planograph) printing method, a relief printing method or a gravure (intaglio) printing method and the like. Thereby the insulating layer can be formed at a predetermined position.

The first mask pattern 103 can be formed by applying or discharging a material which has low wettability. The material which has low wettability is typically a compound having a fluorocarbon chain. The compound having a fluorocarbon chain is, for example, silane coupling agent expressed by a chemical formula $Rn-Si-X_{(4-n)}$ (n=1, 2, and 3). Here, R contains a relatively inactive group such as an alkyl group. Further, X denotes hydrolysable group which can be bonded by the condensation with absorptive water or hydroxyl group on a surface of a ground substance such as halogen, methoxy group, ethoxy group, or acetoxy group.

By using fluorine silane coupling agent (fluoroalkyl silane (FAS)) having a fluoroalkyl group for R as a representative example of the silane coupling agent, the wettability can be lowered. R of FAS has a structure that can be expressed as $(CF_3)(CF_2)_x(CH_2)_y$ (x: an integer from 0 to 10, y: an integer from 0 to 4). In the case where a plurality of R or X are bonded to Si, R or X may all be the same or different. Representatively, FAS is fluoroalkylsilane (hereinafter referred to as FAS) such as heptadecafluoro tetrahydrodecyl triethoxysilane, heptadecafluoro tetrahydrodecyl trichlorosilane, tridecafluoro tetrahydrooctcyl trichlorosilane, and triflouropropyl trimethoxysilane.

As solvent which has low wettability, hydrocarbon solvent such as n-pentane, n-hexane, n-heptane, n-octane, n-decane, dicyclopentane, benzene, toluene, xylene, durene, indene, tetrahydronaphthalene, decahydronaphthalene, and squalene, or tetrahydrofuran and the like are used.

As an example of a compound which has low wettability, a material (fluorine resin) having a fluorocarbon chain can be used. As fluorine resin, polytetrafluoroethylene (PTFE; polytetrafluoroethylene resin), perfluoroalkoxyalkane (PFA; tetrafluoroethylene perfluoroalkylvinylether copolymerization resin), perfluoroethylene propylene copolymer (PFEP; tetrafluoroethylene hexafluoropropylene copolymer resin), ethylene-tetrafluoroethylene copolymer (ETFE; tetrafluoroethylene-ethylene copolymer resin), polyvinylidene fluoride (PVDF; polyvinylidene fluoride resin), polychlorotrifluoroethylene (PCTFE; polytrifluorochloroethylene resin), ethylene-chlorotrifluoroethylene copolymer (ECTFE; polytrifluorochloroethylene-ethylene copolymer resin), polytetrafluoroethylene-perfluorodioxol copolymer (TFE/PDD), polyvinylfluoride (PVF; vinyl fluoride resin) and the like can be used.

Next, a surface attached with a material which has low wettability is cleaned with ethanol, thereby a first mask pattern which is quite thin and has low wettability can be formed.

Figure 7A:
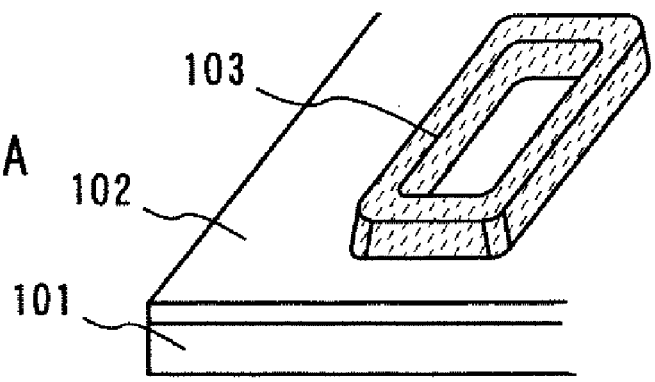
FIGS. 7A to 7C are sectional views showing steps of forming a film pattern according to the invention.
Figure 7B:
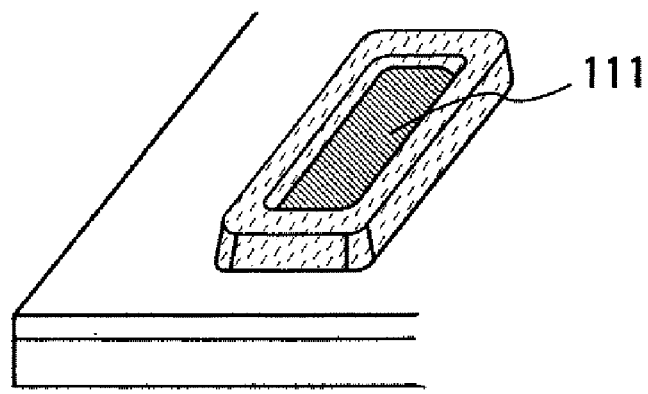
Figure 7C:
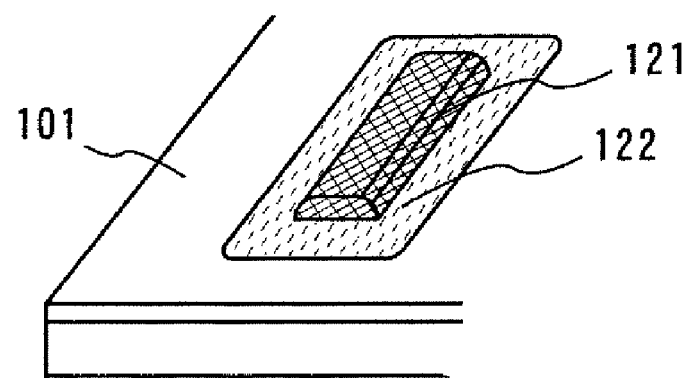

In the case of forming a film pattern having a fine shape, it is preferable that the first mask pattern 103 formed on the first film 102 has a closed curve shape as shown in FIG. 7A. In this case, as shown in FIG. 7B, a material 111 which has high wettability is discharged inside the mask pattern having a closed curve shape, and then drying or baking treatment is performed. Accordingly, a film pattern 121 which has high wettability can be formed in an arbitrary shape as shown in FIG. 7C. In FIG. 7C, the mask pattern is removed and a compound 122 of the mask pattern exists on the surface of the thin film.

A diameter of a nozzle used for the droplet discharging method is set 0.1 to 50 μm (preferably 0.6 to 26 μm) and the amount of the compound discharged from the nozzle is set 0.00001 to 50 pl (preferably 0.0001 to 10 pl). This amount increases in proportion to the diameter of the nozzle. Moreover, it is preferable that the object being processed and an discharging orifice of the nozzle be as close as possible for dropping a droplet at a desired position, which is preferably set about 0.1 to 2 mm.

Note that viscosity of the compound used for the droplet discharging method is preferably 300 mPa·s or less, or more preferably 50 mPa·s or less for preventing drying and for smoothly discharging the compound from the discharging orifice. Note that the viscosity, surface tension and the like of the compound may be appropriately controlled according to solvent used and application.

Figure 1B:
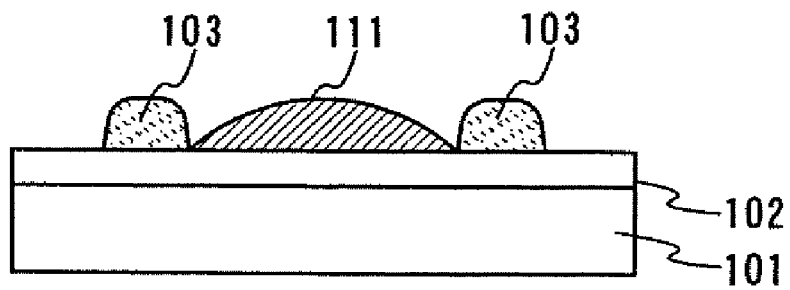

As shown in FIG. 1B, the material 111 which has high wettability as compared to the first mask pattern is applied inside the first mask pattern 103 on the first film 102.

Figure 29:
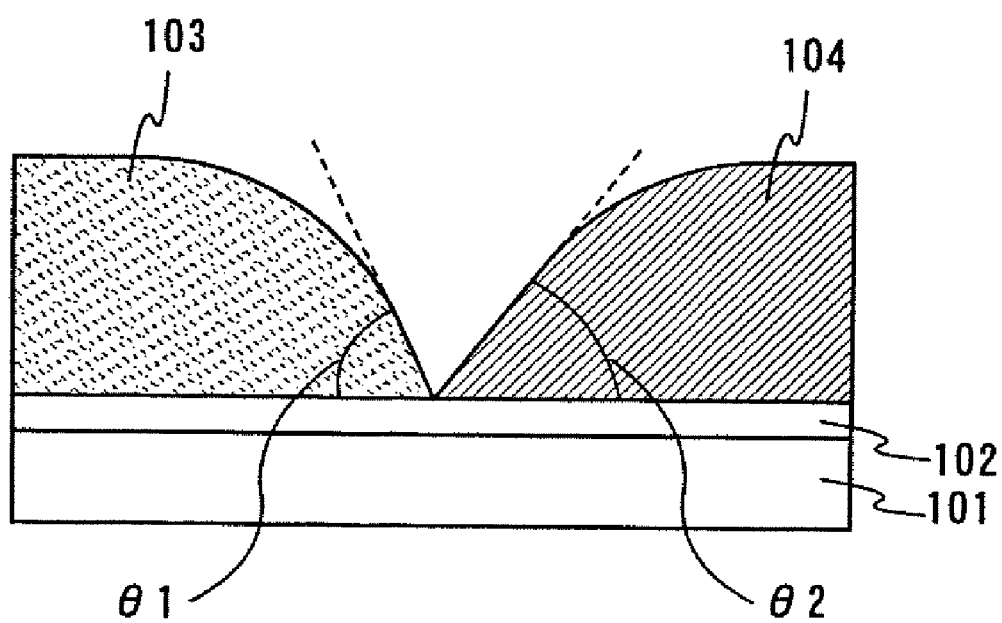
FIG. 29 is a diagram showing contact angles of a region which has low wettability and a region which has high wettability.

Here, a relation between the region which has low wettability and the region which has high wettability is described with reference to FIG. 29. The region which has low wettability (the first mask pattern 103 in FIG. 29) is a region where a contact angle θ1 of liquid with respect to the surface of the first film 102 is large as shown in FIG. 29. On this surface, liquid is repelled in a semi-sphere shape. On the other hand, the region which has high wettability (a region formed of the material 111 which has high wettability in FIG. 1B) is a region where a contact angle θ2 of liquid with respect to the surface of the first film 102 is small. On this surface, liquid is likely to spread.

Therefore, in the case where the two regions having different contact angles are in contact with each other, a region having a relatively smaller contact angle becomes a region which has high wettability while a region having a larger contact angle becomes a region which has low wettability. In the case of applying or discharging solvent on these two regions, the solvent spreads on the surface of the region which has high wettability while it is repelled in a semi-sphere shape on the boundary between the region which has low wettability and the region which has high wettability.

It is preferable that a difference between the contact angle θ1 of the region which has low wettability and the contact angle θ2 of the region which has high wettability be 30°, or more preferably 40° or more. As a result, a material of the region which has high wettability is repelled in a semi-sphere shape on the surface of the region which has low wettability, thereby each mask pattern can be formed in a self-aligned manner. Accordingly, among the substances described as the materials and the methods for forming the first mask pattern 103, in the case where a difference between the contact angles is 30° or more preferably 40° or more, the region formed of a material having a smaller contact angle becomes a region which has high wettability while the region having a larger contact angle becomes a region which has low wettability. Similarly, among substances which are to be described later as the material 111 which has high wettability, in the case where a difference between the contact angles is 30° or more preferably 40° or more, the region formed of a material having a smaller contact angle becomes a region which has high wettability while the region formed of a material having a larger contact angle becomes a region which has low wettability.

In the case where the surface has projections and depressions, a contact angle becomes smaller in the region which has low wettability. That is, the wettability is lowered. In the region which has high wettability, on the other hand, the contact angle becomes smaller. That is, the wettability is heightened. Accordingly, by applying or discharging the material which has low wettability and the material which has high wettability on each surface having projections and depressions and performing baking treatment, a layer of which end portion is uniform can be formed.

As the material 111 which has high wettability, an insulating material, a conductive material, and a semiconductor material each of which has high wettability as compared to the first mask patter can appropriately be used. The insulating material is, representatively, organic resin such as acryl resin, polyimide resin, melamine resin, polyester resin, polycarbonate resin, phenol resin, epoxy resin, polyacetal, polyether, polyurethane, polyamide (nylon), furan resin, and diallyl phthalate resin, and also siloxane polymer, polysilazane, PSG (Phosphor Silicate Glass), and BPSG (Boron Phosphorous Silicon Glass) can be used.

Also, water, alcohol solution, ether solution, solution using polar solvent such as dimethylformamide, dimethylacetoamide, dimethylsulfoxide, N-methylpyrrolidone, hexamethylphosphamidon, chloroform, methylene chloride can be used as well.

Furthermore, a conductor dissolved or dispersed in solvent can be used as a representative of the conductive material. As the conductor, metal such as Ag, Au, Cu, Ni, Pt, Pd, Ir, Rh, W, Al, Ta, Mo, Cd, Zn, Fe, Ti, Si, Ge, Zr, and Ba, fine particles of silver halide, or dispersible nanoparticles can be used. Alternatively, ITO, ITO containing silicon oxide, organic indium, organotin, zinc oxide (ZnO), titanium nitride (TiN) used for a light-transmitting film, and the like can be used.

Furthermore, a plurality of the aforementioned conductors that are dissolved or dispersed can be used as well.

As a representative of the semiconductor material, an organic semiconductor material can be used. It is preferable that p-electron conjugated high molecular weight material having a conjugated double bond as its backbone be used as the organic semiconductor material. Representatively, a fusible high molecular weight material such as polythiophene, poly (3-alkylthiophene), polythiophene derivative, and pentacene can be used.

A material which has higher wettability as compared to the first mask pattern can be applied by the droplet discharging method, the ink-jetting method, the spin coating method, the roll coating method, the slot coating method and the like.

Figure 1C:
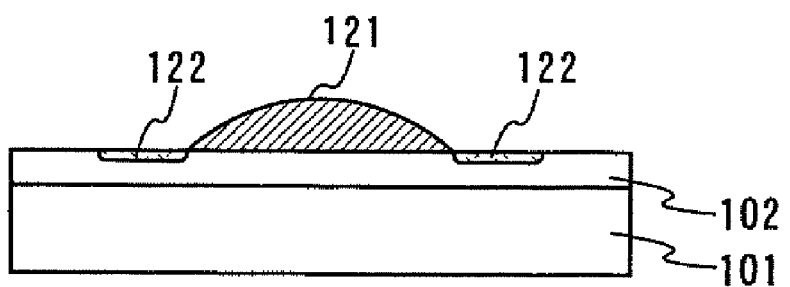

Next, a film pattern 121 is formed by drying and baking the material which has higher wettability as compared to the first mask pattern as shown in FIG. 1C. Accordingly, in the case where the insulating material has high wettability, the film pattern is formed as an insulating layer having a desired shape. Further, in the case where the conductive material has high wettability, the film pattern is formed as a conductive layer having a desired shape. In the case where the semiconductor material has high wettability, the film pattern is formed as a semiconductor layer having a desired shape. Note that the solvent of the first mask pattern is evaporated in this step and the compound is left on the surface of the first film 102 or penetrates in the film. Note that the compound left on the surface of the first film 102 can be removed by a known etching method such as ashing using oxygen, wet etching, and dry etching. In FIG. 1C, 122 denotes a compound of a mask pattern which penetrated in the first film 102. In this step, drying and baking may be performed appropriately according to the material which has high wettability.

Figure 24A:
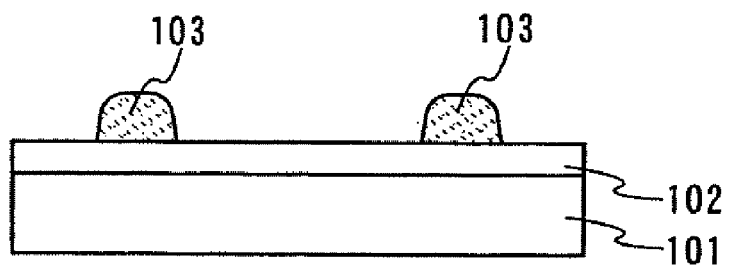
FIGS. 24A to 24C are sectional views showing steps of forming a film pattern according to the invention.
Figure 24B:
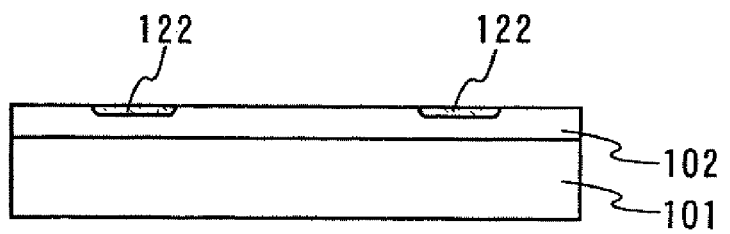
Figure 24C:
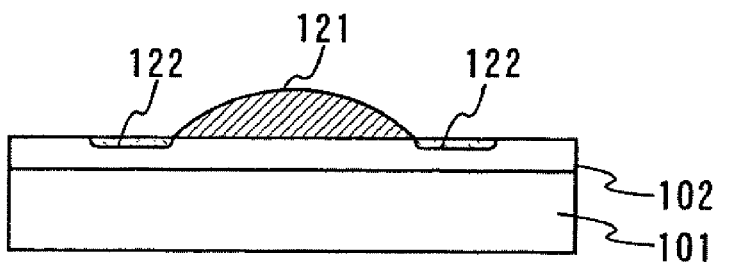

A material which has high wettability may be applied after drying the solvent of the first mask pattern instead of the aforementioned step. That is, after forming the first mask pattern 103 by using a material which has low wettability on the first film 102, the first mask pattern is dried as shown in FIG. 24B. At this time, the compound of the first mask pattern is left on the surface of the first mask or penetrates in the film. In FIG. 24B, 122 denotes a region in which the compound of the first mask pattern is penetrated. Next, a material which has high wettability as compared to the first mask pattern is discharged as shown in FIG. 24C. In this case, the compound 122 of the first mask pattern is left in a region on which the first mask pattern was formed, therefore, a material which has higher wettability as compared to the first mask pattern is repelled and selectively applied as shown in FIG. 24C. After this, the material which has higher wettability as compared to the first mask pattern is dried or baked appropriately to form the film pattern 121.

By the aforementioned step, a film pattern having a desired shape can be formed without using a known photolithography process. Accordingly, the number of manufacturing steps can considerably be reduced.

Embodiment Mode 2

In this embodiment mode, steps for forming a film pattern having a desired shape by using a mask pattern formed of a material for forming a liquid repellent surface are described with reference to FIGS. 32A to 32C. Note that the mask pattern described in this embodiment is a mask pattern used for forming a film pattern.

Figure 32A:
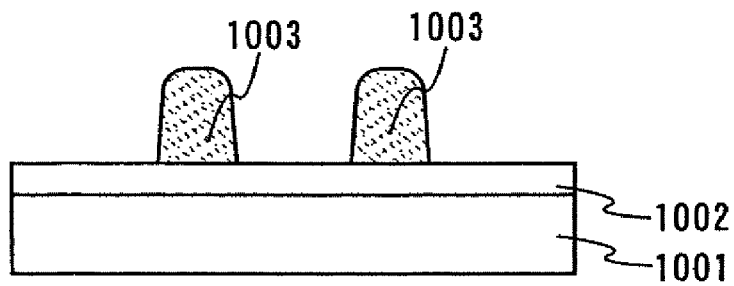
FIGS. 32A to 32C are sectional diagrams showing steps of forming a film pattern according to the invention.

As shown in FIG. 32A, a first film 1002 is formed on a substrate 1001. A protective film (first mask pattern) 1003 is formed thereon by the droplet discharging method, the ink-jetting method and the like. Here, the droplet discharging method is used for forming the mask pattern. It is preferable that the first film 1002 have a lyophilic surface. In the case where the substrate 1001 has a lyophilic surface, the first film is not required to be formed.

The substrate 1001 may be a glass substrate, a quartz substrate, a substrate formed of an insulating substance such as alumina, a plastic substrate which can resist the processing heat in a subsequent step, a silicon wafer, a metal plate and the like. In this case, it is preferable to form an insulating film for preventing impurities and the like from dispersing from the substrate side, such as silicon oxide (SiOx), silicon nitride (SiNx), silicon oxynitride (SiOxNy) (x>y) and silicon nitride oxide (SiNxOy) (x>y). Further, a metal substrate such as stainless or a semiconductor substrate of which surface is formed with an insulating film such as silicon oxide or silicon nitride can be used as well.

It is preferable that the first film 102 has a lyophilic surface. Although the film is shown here, a member having a lyophilic surface may be used as well.

The first mask pattern 1003 is formed by using solution for forming a lyophilic surface. The compound of the solution for forming a lyophilic surface is representatively silane coupling agent expressed by a chemical formula: $R_n$—Si—$X_{(4-n)}$ (n=1, 2, and 3). Here, R contains a comparatively inactive group such as an alkyl group. Further, X denotes hydrolysable group which can be bound by the condensation with absorptive water or hydroxyl group on a surface of a ground substance such as halogen, methoxy group, ethoxy group, or acetoxy group.

By using fluorine silane coupling agent (fluoroalkyl silane (FAS)) having a fluoroalkyl group for R as a representative example of the silane coupling agent, the liquid repellency can be heightened. R of FAS has a structure that can be expressed as $(CF_3)(CF_2)_x(CH_2)_y$, (x: an integer from 0 to 10, y an integer from 0 to 4). In the case where a plurality of R or X are bonded to Si, R or X may all be the same or different. Representatively, FAS is fluoroalkylsilane (hereinafter referred to as FAS) such as heptadecafluoro tetrahydrodecyl triethoxysilane, heptadecafluoro tetrahydrodecyl trichlorosilane, tridecafluoro tetrahydro octcyltrichlorosilane, and triflouropropyl trimethoxysilane.

As solvent of solution for forming a liquid repellent surface, hydrocarbon solvent such as n-pentane, n-hexane, n-heptane, n-octane, n-decane, dicyclopentane, benzene, toluene, xylene, durene, indene, tetrabydronaphthalene, decahydronaphthalene, and squalene, or tetrahydrofuran and the like are used.

As an example of a compound for forming a liquid repellent surface, a material (fluorine resin) having a fluorocarbon chain can be used. As fluorine resin, polytetrafluoroethylene (PTFE; polytetrafluoroethylene resin), perfluoroalkoxyalkane (PFA; tetrafluoroethylene perfluoroalkylvinylether copolymerization resin), perfluoroethylene propylene copolymer (PFEP; tetrafluoroethylene hexafluoropropylene copolymer resin), ethylene-tetrafluoroethylene copolymer (ETFE; tetrafluoroethylene-ethylene copolymer resin), polyvinylidene fluoride (PVDF; polyvinylidene fluoride resin), polychlorotrifluoroethylene (PCTFE; polytrifluorochloroethylene resin), ethylene-chlorotrifluoroethylene copolymer (ECTFE; polytrifluorochloroethylene-ethylene copolymer resin), polytetrafluoroethylene-perfluorodioxol copolymer (TFE/PDD), polyvinylfluoride (PVF; vinyl fluoride resin) and the like can be used.

An organic material which does not form a liquid repellent surface (that is, which forms a lyophilic surface) may also be used, in this case, the organic material should be treated with $CF_4$ plasma or the like to obtain liquid repellency. For example, a material obtained by mixing water soluble resin such as polyvinyl alcohol (PVA) into solvent of $H_2O$ or the like may be used before the plasma treatment. Further, PVA and other water soluble resin may be used in combination. Note that even in the case where the mask pattern has a liquid repellent surface, the repellency can be further heightened by performing the plasma treatment or the like.

Figure 33A:
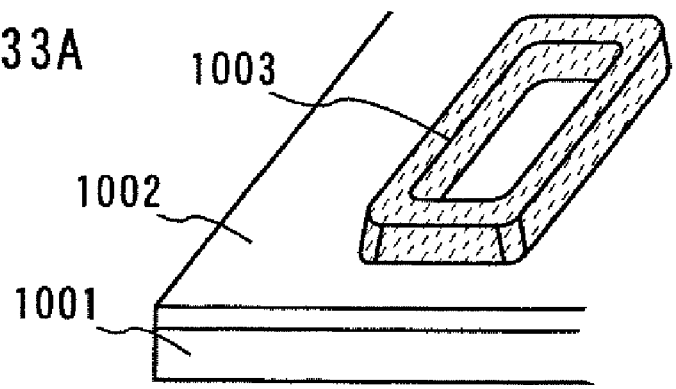
FIGS. 33A to 33C are sectional diagrams showing steps of forming a film pattern according to the invention.
Figure 33B:
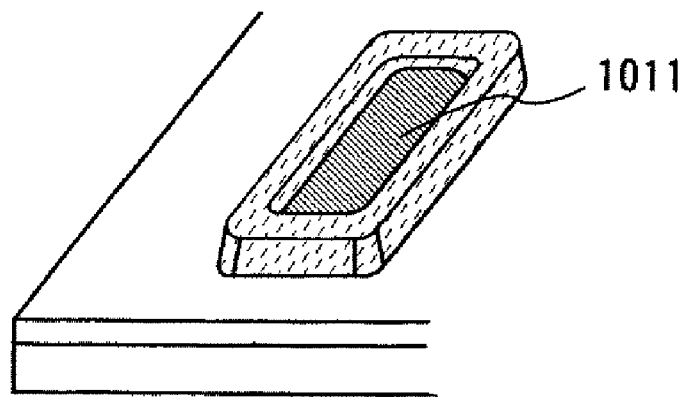
Figure 33C:
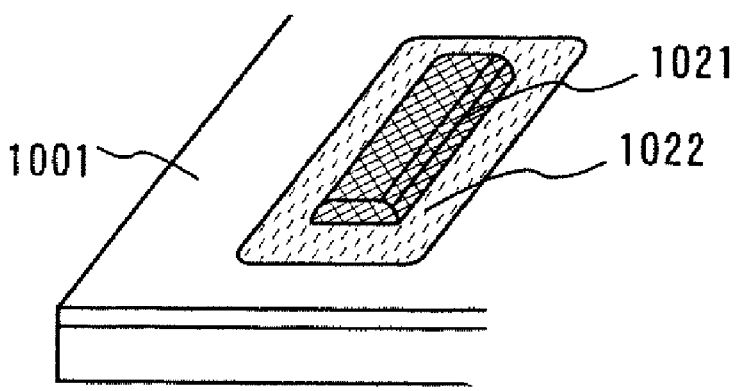

In the case of forming a film having a fine shape, it is preferable that the first mask pattern 1003 has a closed curve shape which is formed on the first film 1002 having a lyophilic surface. In this case, second solution 1011 is discharged inside the mask pattern having a closed curve shape as shown in FIG. 33B and then drying or baking treatment is performed. Consequently, a film pattern 1021 having an arbitrary shape can be formed as shown in FIG. 33C. In FIG. 33C, the mask pattern is removed and the compound 1022 of the mask pattern is left on the lyophilic surface.

A diameter of a nozzle used for the droplet discharging method is set 0.1 to 50 μm (preferably 0.6 to 26 μm) and an amount of the compound discharged from the nozzle is set 0.00001 to 50 pl (preferably 0.00001 to 10 pl). This amount increases in proportion to the diameter of the nozzle. Moreover, it is preferable that the object being processed and an discharging orifice of the nozzle be as close as possible for dropping a droplet at a desired position, which is preferably set about 0.1 to 2 mm.

Note that viscosity of the compound used for the droplet discharging method is preferably 300 mPa·s or less, or more preferably 50 mPa·s or less for preventing drying and for smoothly discharging the compound from the discharging orifice. Note that the viscosity, surface tension and the like of the compound may be appropriately controlled according to solvent used and application.

Figure 32B:
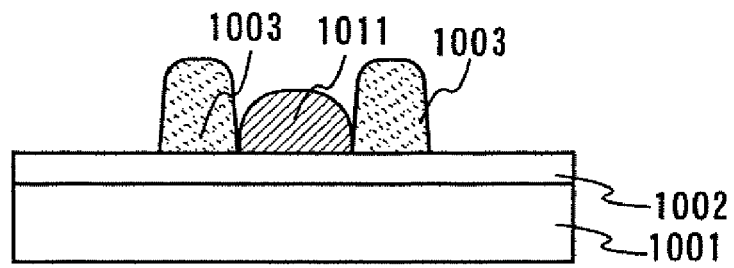

As shown in FIG. 32B, the second solution 1011 is applied inside the first mask pattern 1003. As the second solution, lyophilic solvent can be used. The lyophilic solution are representatively organic resin such as acryl resin, polyimide resin, melamine resin, polyester resin, polycarbonate resin, phenol resin, epoxy resin, polyacetal, polyether, polyurethane, polyamide (nylon), furan resin, and diallyl phthalate resin, and also siloxane and polysilazane. Also, water, alcohol group, ether group, solvent using polar solvent such as dimethylformamide, dimethylacetoamide, dimethylsulfoxide, N-methylpyrrolidone, hexametbylphosphamidon, chloroform, methylene chloride can be used as well. The second solution can be applied by the droplet discharging method, the ink-jetting method, the spin coating method, the roll coating method, the slot coating method and the like.

Figure 32C:
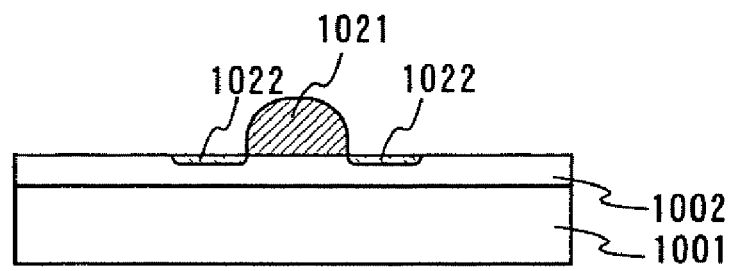

Next, as shown in FIG. 32C, the film pattern 1021 is formed by drying and baking the second solution 1011. In this process, the solvent of the mask pattern is evaporated and the compound is left on the surface of the first film 1002 or penetrates in the film. Note that the compound left on the surface of the first film 1002 can be removed by a known etching method such as $O_2$ ashing, wet etching, and dry etching. In FIG. 32C, 1022 denotes a compound of a mask pattern which penetrated in the first film 1002. In this step, drying and baking may be performed appropriately according to the material of the second solution.

Figure 34A:
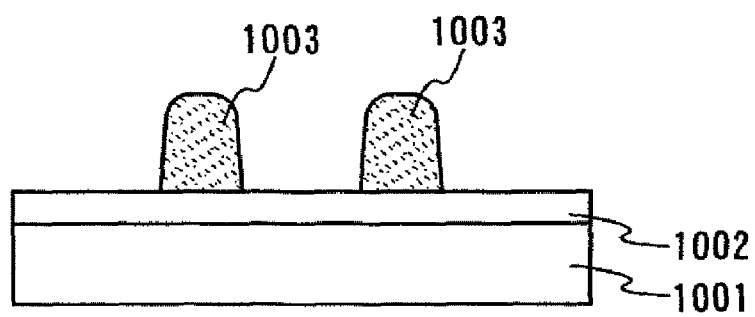
FIGS. 34A to 34C are sectional diagrams showing steps of forming a film pattern according to the invention.
Figure 34B:
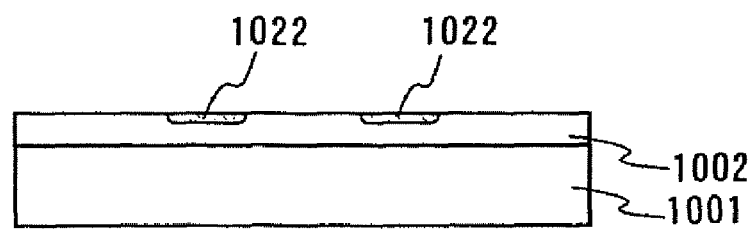
Figure 34C:
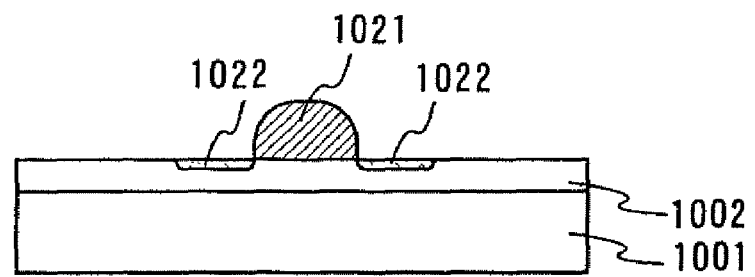

The second solution may be applied after drying the solvent of the first mask pattern instead of the aforementioned process. That is, after forming the first mask pattern 1003 by using solution for forming a liquid repellent surface on the first film 1002 as shown in FIG. 34A, the first mask pattern is dried as shown in FIG. 34B. At this time, the compound of the first mask pattern is left on the surface of the first film 1002 or penetrates in the film. In FIG. 34B, 1022 denotes a region in which the compound of the first mask pattern is penetrated in the first film. Next, the second solution which is lyophilic is applied as shown in FIG. 34C. In this case, the compound 1022 of the first mask pattern is left in a region on which the first mask pattern was formed, therefore, the second solution is repelled and selectively applied as shown in FIG. 34C. After this, the second solution is dried and baked appropriately to form the second film pattern 1021.

By the aforementioned steps, a film pattern having a desired shape can be formed without using a known photolithography process. Accordingly, the number of manufacturing steps can considerably be reduced.

Embodiment Mode 3

The following embodiment modes and embodiments are described with reference to Embodiment Mode 1. However, Embodiment Mode 2 can be applied appropriately.

In this embodiment mode, steps of forming a film pattern having a desired shape using a first mask pattern which has low wettability and a second mask pattern which has high wettability is described with reference to FIGS. 2A to 2C. Note that the first mask pattern described in this embodiment mode is a mask pattern used for forming the second mask pattern. The second mask pattern is a mask pattern used for etching.

Figure 2A:
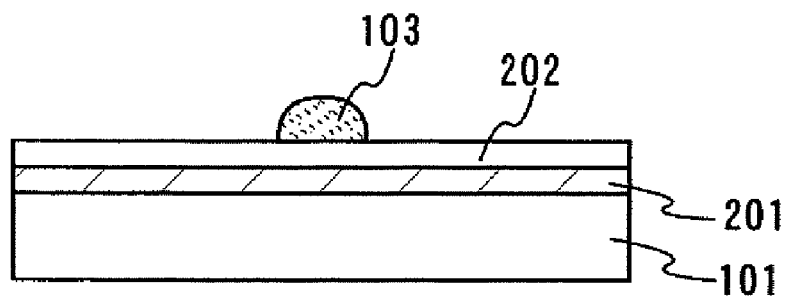
FIGS. 2A to 2D are sectional views showing steps of forming a film pattern according to the invention.

As shown in FIG. 2A, a first film 201 is formed on a first substrate 101 and a second film 202 is formed on the first film 201. An appropriate material is used for the first film. As the second film, a similar material to that of the first film 102 in Embodiment Mode 1 can be used.

Next, a first mask pattern 103 which has low wettability is formed on the second film 202 by applying a material which has low wettability by the droplet discharging method. At this time, a material which has high wettability is dried and baked in combination with the material which has low wettability.

Figure 2B:
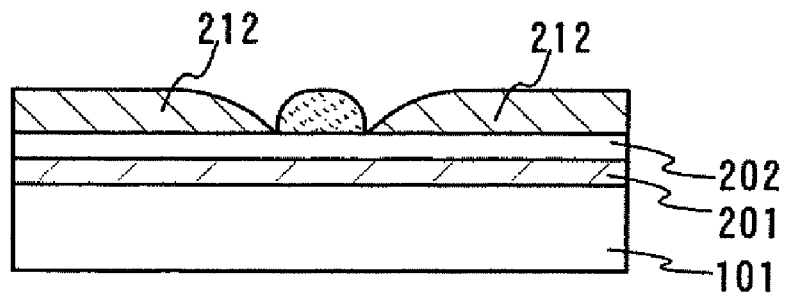

Next, a material which has high wettability is applied to form a second mask pattern 212 which has high wettability as shown in FIG. 2B. The material which has high wettability has higher wettability than the material which has low wettability, therefore, it is repelled by a portion which is in contact with the first mask pattern 103. As shown in FIG. 2B, the material which has high wettability is applied in a region on which the first mask pattern is not formed. The material which has high wettability can be applied by the droplet discharging method, the ink-jetting method, the spin coating method, the roll coating method, the slot coating method and the like. After this a material which has high wettability is dried and baked as required. Consequently, the second mask pattern 212 as a mask pattern for etching can be formed.

Figure 2C:
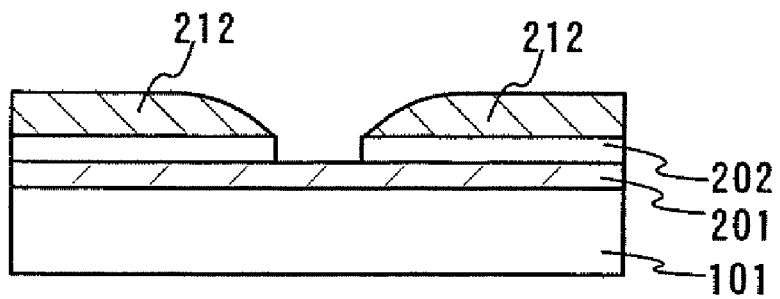

Next, as shown in FIG. 2C, the first mask pattern 103 is removed. In this embodiment mode, the first mask pattern 103 is removed by ashing. After this, an exposed region of the second film is etched by a known method such as dry etching and wet etching, thereby the film pattern 221 having a desired shape can be formed. In the case where the first mask pattern has a columnar or cylindrical shape, the film pattern is to have a contact hole.

Figure 2D:
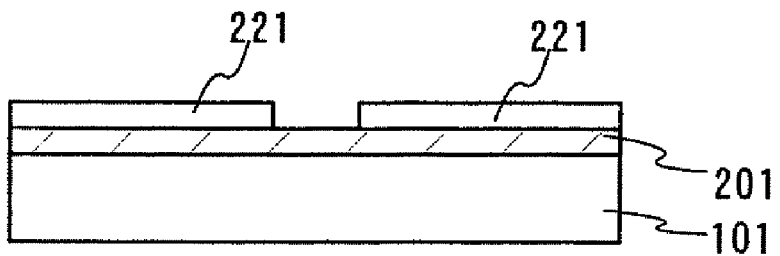

As shown in FIG. 2D, the film pattern 221 having a desired shape can be exposed by removing the second mask pattern 212.

By the aforementioned process, a film pattern having a desired shape can be formed without using a known photolithography process. Accordingly, the number of manufacturing steps can considerably be reduced. Further, a film pattern or a favorable contact hole can be formed with the less number of steps than the conventional one.

Embodiment Mode 4

Hereinafter described is a manufacturing method of a semiconductor element. Note that a TFT is taken as an example of a semiconductor element in this embodiment mode, however, the invention is not limited to this. An organic semiconductor transistor, a diode, an MIM element, a memory element, a photoelectric converter, a capacitor, a resistor and the like can be used.

In this embodiment mode, steps of forming a channel-etch type TFT as a representative of an inverted staggered TFT as a semiconductor element using the invention are described with reference to FIGS. 3A to 3D.

Figure 3A:
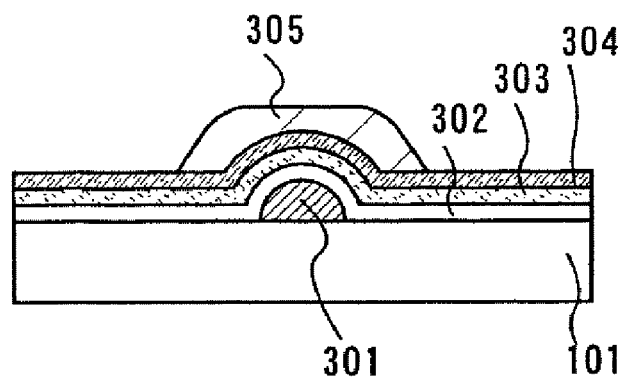
FIGS. 3A to 3D are sectional views showing manufacturing steps of a semiconductor device according to the invention.
Figure 3B:
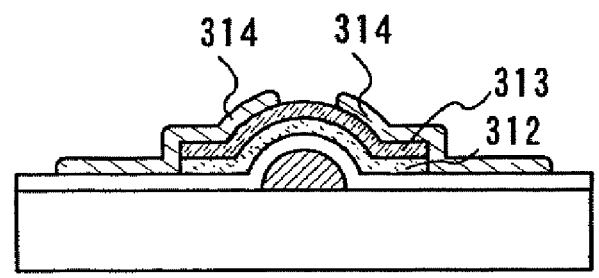

As shown in FIG. 3A, a gate electrode 301 is formed on a substrate 101. The gate electrode 301 is formed by the droplet discharging method, the printing method, an electric field plating method, a PVD method, and a CVD method. In the case of forming a conductive layer by using the PVD method and the CVD method, a mask pattern is formed on a conductive layer by the method in Embodiment Mode 3 or the photolithography process, thereby the gate electrode is formed by etching into a desired shape. In this embodiment mode, a compound containing a conductive material is selectively discharged on the substrate 101. In this case, as the etching step using the mask pattern is not required, the manufacturing steps can considerably be simplified.

In the case of forming the gate electrode by the droplet discharging method, the compound discharged from an discharging orifice may be a conductor selected from the materials which have low wettability described in Embodiment Mode 1 dissolved or dispersed in solvent. Further, the gate electrode 301 can be formed by laminating conductive layers.

It is preferable that the compound discharged from the discharging orifice be any one of gold, silver or copper dissolved or dispersed in solvent be used in consideration of the resistivity. More preferably, silver or copper which is low in resistance and cost is used. In the case of using copper, however, a barrier film is preferably provided in combination for preventing impurities. The solvent may be organic solvent such as esters such as butyl acetate, and ethyl acetate, alcohols such as isopropyl alcohol, and ethyl alcohol, organic solvent such as methyl ethyl ketone, and acetone, and the like.

As a barrier film in the case of using copper as a wiring, an insulating or conductive substance containing nitrogen such as silicon nitride, silicon oxynitride, aluminum nitride, titanium nitride, and tantalum nitride (TaN) are preferably used. The aforementioned substances may be formed by the droplet discharging method as well.

Note that viscosity of the compound used for the droplet discharging method is preferably 5 to 20 mPa·s for preventing drying and for smoothly discharging the compound from the discharging orifice. It is preferable that the surface tension be 40 mN/m or less. Note that the viscosity, and the like of the compound may be appropriately controlled according to solvent used and application. As an example, the viscosity of the compound obtained by dissolving or dispersing indium tin oxide (ITO), zinc oxide (ZnO), indium zinc oxide (IZO), gallium-doped zinc oxide (GZO), and indium tin oxide containing silicon oxide, or organotin in solvent is 5 to 20 mPa·s, the viscosity of the compound obtained by dissolving or dispersing silver in solvent is 5 to 20 mPa·s, and the viscosity of the compound obtained by dissolving or dispersing gold in solvent is 10 to 20 mPa·s.

It is preferable that the diameter of particles of conductors be as small as possible for preventing clogging of the nozzle and for forming a fine pattern, although it is dependent on the diameter of each nozzle and a desired pattern shape. Preferably, diameter of the particle is 0.1 μm or less. The compound is formed by a known method such as an electrolyzing method, an atomizing method, and a wet reducing method. The particle size is generally about 0.5 to 10 μm. However, when the conductor is formed by gas evaporation method, a nano-molecule protected by a dispersion agent is about 7 nm, which is minute. When the surfaces of the nano-particles are covered by a coating agent, the nano-particles are not coagulated in the solvent. The nano-particles are dispersed stably at a room temperature. That is, the nano-particles exhibit substantially the same behavior as that of liquid. Therefore, it is preferable to use a coating agent.

The step of discharging a compound may be performed under a low pressure. This is because subsequent steps of drying and baking can be omitted or shortened as solvent of the discharged compound is volatilized until it lands on the object being processed. After discharging a composition, one or both steps of drying and baking is carried out with laser irradiation, rapid thermal annealing, beating furnace, or the like under atmospheric pressure or low pressure. The steps of drying and baking are both heat treatment although their purposes, temperatures, and time differ. Drying is carried out, for example, at 100° C. for 3 minutes and baking is carried out at 200 to 350° C. for 15 to 120 minutes. In order to carry out the steps of drying and baking favorably, a substrate may be heated, of which temperature is set at 100 to 800° C. (preferably, 200 to 350° C.), though it depends on a material of the substrate and the like. Through this step, solvent in solution is volatilized or dispersant is removed chemically, and resin in the periphery cures and shrinks, thereby fusing and welding are accelerated. This step is carried out in an oxygen atmosphere, a nitrogen atmosphere, or in the air. However, this step is preferably carried out in an oxygen atmosphere in which solvent dissolved or dispersed with a metal element is easily removed.

Note that the conductive layer formed by the droplet discharging method is formed by randomly overlapping fine particles as conductors three-dimensionally. That is, the conductive layer is formed of three-dimensional agglomerate particles.

Accordingly, the surface thereof has fine projections and depressions. Further, as a grain diameter of the particles increases when the fine particles are baked by the heat of the light absorption layer and the heat retention time thereof. Therefore, a layer having large projections and depressions is formed.

The laser light may be irradiated by using a continuous oscillation or pulse oscillation gas laser or a solid state laser. As the former gas laser, an excimer laser, a YAG laser, and the like are used while a laser using crystals such as YAG and $YVO_4$ doped with Cr, Nd and the like is used as the latter solid state laser. In view of the absorption rate of the laser light, it is preferable to use a continuous oscillation laser. Further, what is called a hybrid laser irradiating method in which the pulse oscillation and the continuous oscillation are combined may be used as well. Although, depending on the heat resistance property of the substrate, it is preferable to apply heat treatment by irradiating laser light instantaneously for several micro seconds to several tens seconds. The rapid thermal annealing (RTA) is performed in an inert gas atmosphere by instantaneously applying heat for several micro seconds to several minutes by raising temperature rapidly using an infrared lamp or a halogen lamp for irradiating ultraviolet light to infrared light. This treatment is performed instantaneously, therefore, it is advantageous that only a thin film of the outermost surface can be substantially heated and an under-layer film is not affected.

Next, a gate insulating film 302 is formed on the gate electrode 301. The gate insulating film 302 is formed of a single layer or a multi-layer structure of an insulating film containing silicon nitride, silicon oxide, and other silicon by using a thin film forming method such as the plasma CVD method or the sputtering method. It is preferable to form the gate insulating layer in lamination in the order of a silicon nitride film (a silicon nitride oxide film), a silicon oxide film, and a silicon nitride film (a silicon nitride oxide film) from a side in contact with the gate electrode layer. With this structure, the gate electrode is in contact with the silicon nitride film, therefore, a deterioration due to oxidization can be prevented.

Next, the first semiconductor film 303 is formed on the gate insulating film 302. As the first semiconductor film 303, a film having any one of an amorphous semiconductor, a semi-amorphous semiconductor (also referred to as an SAS) in which an amorphous state and a crystalline state are mixed, a micro-crystalline semiconductor in which crystal grains of 0.5 to 20 nm can be observed in an amorphous semiconductor, and a crystalline semiconductor is used. In particular, a micro-crystalline state in which crystal grains of 0.5 to 20 nm can be observed is referred to as a micro crystal (μc). A film containing silicon, silicon germanium (SiGe) and the like can be formed of a semiconductor film in thickness of 10 to 60 nm.

An SAS has an intermediate structure between the amorphous structure and the crystalline structure (including a single crystalline and polycrystalline structures), which is a semiconductor having a third state that is stable in free energy. Also, SAS includes a crystalline region having a short-range order and lattice distortion. A crystalline region of 0.5 to 20 nm can be observed at least in a part of the film, and Raman spectrum is shifted to a low frequency side from 520 $cm^{-1}$ in the case where silicon is a main component. Diffraction peaks of (111) and (220) are measured by X-ray diffraction, which are caused by Si crystal grating. Also, hydrogen or halogen of at least 1 atomic % or more is included in order to terminate a dangling bond.

An SAS is formed by depositing silicon gas by glow discharge (plasma CVD). The silicon gas is typically $SiH_4$, as well as $Si_2H_6$, $SiH_2Cl_2$, $SiHCl_3$, $SiCl_4$, $SiF_4$ and the like. By diluting the silicon gas with hydrogen, or hydrogen and one or a plurality of noble gas elements such as helium, argon, krypton, and neon, SAS can be formed easily. The silicon gas is preferably diluted with a dilution ratio of 10 to 1000 times. The reaction production of a film by the glow discharge decomposition may be performed at a pressure of about 0.1 to 133 Pa. The glow discharge may be formed with a power of 1 to 120 MHz, more preferably with an RF power of 13 to 60 MHz. It is preferable that a temperature for heating the substrate be 300° C. or less, more preferably 100 to 250° C.

Also, the crystalline semiconductor film can be formed by crystallizing an amorphous semiconductor film by heating or irradiating laser. Further, the crystalline semiconductor film may be formed directly. In this case, a fluorine gas such as $GeF_4$ or $F_2$ and a silane gas such as $SiH_4$ and $Si_2H_6$ are used to form a crystalline semiconductor film directly by using heat or plasma.

Next, a conductive second semiconductor film 304 is formed. In the case of forming an n-channel type TFT, the conductive second semiconductor film 304 is added an element from group 15 of the Periodic Table of Elements, that is representatively phosphor or arsenic. In the case of forming a p-channel type TFT, an element from group 13 of the Periodic Table of Elements is added, that is representatively boron. The second semiconductor film 304 is deposited by the plasma CVD method by using a silicon gas added a gas containing elements of group 13 or 15 such as boron, phosphor, and arsenic. After forming the semiconductor film, the conductive second semiconductor film can be formed by applying solution containing elements of group 13 or 15 on the semiconductor film and irradiating laser light. As the laser light, laser light irradiated from a known pulse oscillation laser or a continuous oscillation laser is appropriately used.

Next, a first mask pattern 305 is formed on the conductive second semiconductor film 304 by the droplet discharging method. It is preferable that the first mask pattern 305 be formed of a heat resistant high molecular weight material which has an aromatic ring and heterocyclic ring as a main chain structure, has less aliphatic portion and contains hetero atom groups. Such a high molecular weight material is representatively polyimide or polybenzimidazole. In the case of using polyimide, a compound containing polyimide is discharged from a nozzle on the second semiconductor film 304 and baked at 200° C. for 30 minutes.

Next, a first semiconductor region 312 and a second semiconductor region 313 having desired shapes are formed by etching the first semiconductor film 303 and the second semiconductor film 304 by using the first mask pattern 305. As an etching gas, chlorine gas represented by $Cl_2$, $BCl_3$, $SiCl_4$, $CCl_4$ and the like, a fluorine gas represented by $CF_4$, $SF_6$, $NF_3$, $CHF_3$ and the like, or $O_2$ can be used. The first mask pattern 305 is removed after etching.

Next, a source electrode and a drain electrode 314 are formed on the second semiconductor region 313 by discharging a conductive material by the droplet discharging method. As the conductive material, a material similar to the material of the gate electrode 301 dissolved or dispersed in solvent can be used. Here, a compound containing Ag (hereinafter referred to as Ag paste) is selectively discharged and drying and baking treatments are appropriately performed by irradiating laser light or by heat treatment to form each electrode in thickness of 600 to 800 nm.

By performing the baking treatment in $O_2$ atmosphere, an organic substance such as binder (heat curable resin) and the like contained in the Ag paste is decomposed, thereby an Ag film containing few organic substances can be formed. Moreover, a surface of the film can be planarized. By discharging the Ag paste under a low pressure, solvent in the paste is evaporated and the subsequent heat treatment can be omitted or the heat treatment time can be shortened.

The source electrode and the drain electrode 314 are formed by etching after depositing a conductive film in advance by the sputtering method and the like and forming a mask pattern by the droplet discharging method. The mask pattern can be formed by using the aforementioned material.

Figure 3C:
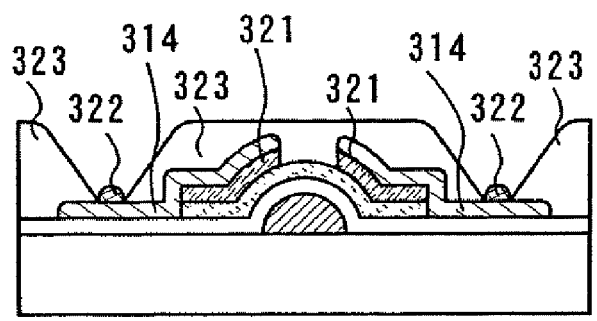

Next, as shown in FIG. 3C, the first semiconductor region 312 is exposed by etching the second semiconductor region with the source electrode and the drain electrode 314 as masks. Here, the second semiconductor region separated by etching is denoted as a third semiconductor region 321. For the etching condition, the aforementioned condition is appropriately applied. Further, in this embodiment mode, the second semiconductor region is etched by using the source electrode and the drain electrode, however, the invention is not limited to this step and the aforementioned mask patterns may be formed to be used for etching the semiconductor film.

Note that the first semiconductor region 312 can be formed by using an organic semiconductor material by the printing method, the spraying method, the spin coating method, the droplet discharging method and the like. In this case, as the aforementioned etching step is not required, the number of steps can be reduced. It is preferable that the organic semiconductor material used for the invention be a p-electron conjugated high molecular weight material having a conjugated double bond as its backbone. Representatively, a fusible high molecular weight material such as polythiophene, poly (3-alkylthiophene), polythiophene derivative, and pentacene can be used. As an organic semiconductor material that can be used in the invention, there is a material which can be used for forming a second semiconductor region by processing after depositing a fusible precursor. Such an organic semiconductor material which is formed through a precursor are polythienylene vinylene, poly(2,5-thienylene vinylene), polyacetylene, polyacetylene derivative, polyarylenevinylene, and the like.

In transforming the precursor into an organic semiconductor, a reactive catalyst such as hydrogen chloride gas is added as well as heat treatment is applied. A solvent for dissolving these fusible organic semiconductor material is representatively toluene, xylene, chlorobenzene, dichlorobenzene, anisole, chloroform, dichloromethane, γ butyl lactone, butylcellosolve, cyclohexane, NMP (N-methyl-2-pyrrolidone), cyclohexanone, 2-butanone, dioxane, dimethylformamide (DMF), or THF (tetrahydrofuran).

In the case of using an organic semiconductor for the first semiconductor region 312, a conductive layer formed of an organic conductive material such as polyacetylene, polyaniline, PEDOT (poly-ethylyenedioxythiophen), and PSS (poly-styrenesulphonate) can be formed. The conductive layer functions as a contact layer, or a source electrode and a drain electrode.

Moreover, a conductive layer formed of metal elements can be used instead of the third semiconductor region 321. In this case, as most organic semiconductor materials have a p-type semiconductor which transports holes as carriers as a material to transport charges, it is preferable to use metal of which work function is high in order to obtain an ohmic contact with the semiconductor layer.

In specific, metal, alloy or the like of gold, platinum, chromium, palladium, aluminum, indium, molybdenum, nickel and the like are preferable. By using a conductive paste using these metal or alloy materials, the conductive layer can be formed by the printing method, the roll coating method, and the droplet discharging method.

Further, the first semiconductor region formed of an organic semiconductor material, a conductive layer formed of an organic conductive material, and a conductive layer formed of a metal element may be laminated.

In the case where the first semiconductor region 312 is formed of an SAS, a self-aligned structure that end portions of the source region and the drain region and an end portion of the gate electrode form the same plane as well as a structure that the source region and the drain region cover the gate electrode. Furthermore, such a structure can be employed that the source region and the drain region are formed at a certain distance without covering the gate electrode. In this structure, an off current can be reduced, therefore, in the case of using the TFT as a switching element of a display device, contrast can be improved. Moreover, a multi-gate TFT may be used that the second semiconductor region covers a plurality of gate electrodes. In this case also, the off current can be reduced.

Next, it is preferable to deposit a passivation film on the source electrode and the drain electrode 314. The passivation film can be formed of silicon nitride, silicon oxide, silicon nitride oxide, silicon oxynitride, aluminum oxynitride, or aluminum oxide, diamond-like carbon (DLC), nitrogen-containing carbon and other insulating materials by a thin film forming method such as the plasma CVD method or the sputtering method.

Next, a second mask pattern 322 which has low wettability is formed. The second mask pattern is a mask pattern used for forming an interlayer insulating film that is formed in a subsequent step. The second mask pattern is formed of a similar material to that of the first mask pattern 103 described in Embodiment Mode 1.

Next, an interlayer insulating film 323 which has high wettability is formed by applying an insulating material in a region except for the second mask pattern. As the second mask pattern 322, an interlayer insulating film which has higher wettability as compared to the interlayer insulating film 323 and has a desired shape is formed. The interlayer insulating film 323 can be formed by using acryl resin, polyimide resin, polyester resin, epoxy resin, polyester, polyurethane, siloxane polymer, and polysilazane.

Figure 3D:
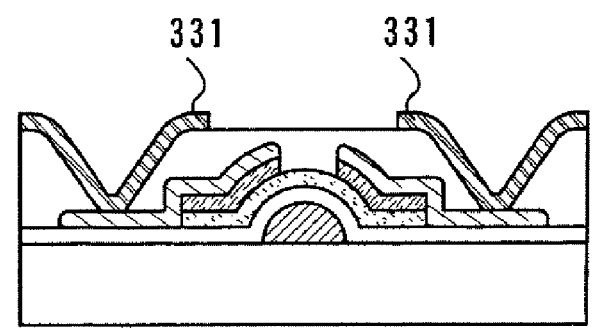

As shown in FIG. 3D, the second mask pattern 322 is removed by $O_2$ ashing, thereby the source electrode and the drain electrode 314 are exposed. In the case where a passivation film is deposited on the source electrode and the drain electrode, the passivation film is also removed. Subsequently, a conductive films 331 which connect to the source electrode and the drain electrode respectively are formed. Here, a paste obtained by dissolving or dispersing a conductive material in solvent is discharged by the droplet discharging method and baked, thereby the conductive film is formed. As a conductive material for the conductive film, a similar material to that of the source electrode and the drain electrode can be used. Note that the conductive film 331 functions as a connecting wiring or a pixel electrode.

By the aforementioned steps, a channel-etch type TFT can be formed.

Embodiment Mode 5

In this embodiment mode, steps of forming a channel-protective type (channel-stopper type) TFT are described with reference to FIG. 4.

Figure 4A:
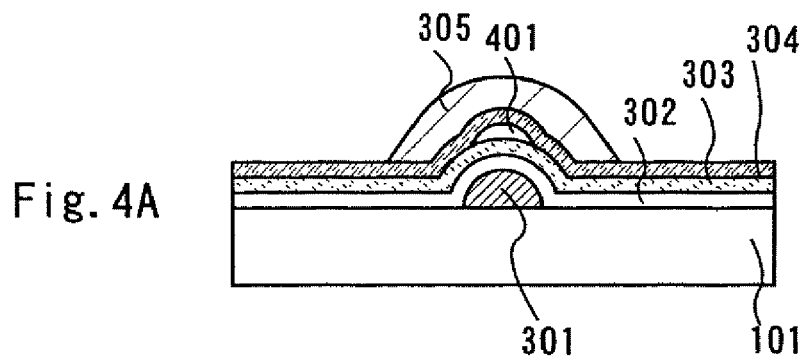
FIGS. 4A to 4E are sectional views showing manufacturing steps of a semiconductor device according to the invention.

As shown in FIG. 4A, the gate electrode 301, the gate insulating film 302, and the first semiconductor film 303 are formed on the substrate 101 similarly to Embodiment Mode 4.

Next, a protective film 401 is formed in a region on the first semiconductor film 303 which overlaps the gate electrode 301. The protective film 401 can be formed by using a similar method and material to that of the first mask pattern 305 described in Embodiment Mode 4.

Next, the second semiconductor film (a conductive semiconductor film) 304 is deposited similarly to Embodiment Mode 4. Next, the first mask pattern 305 is formed similarly to Embodiment Mode 4.

Figure 4B:
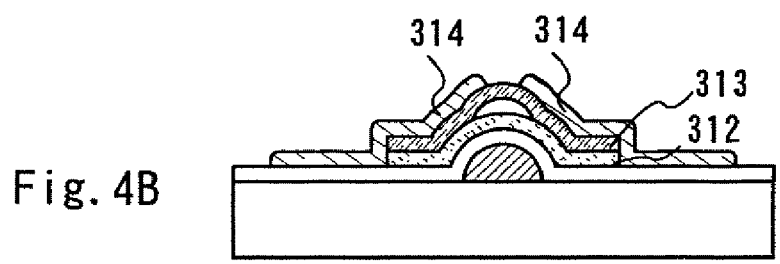

Next, as shown in FIG. 4B, the first semiconductor film is etched by using the first mask pattern, thereby the first semiconductor region 312 is formed. Then, the second semiconductor film is etched to form the second semiconductor region 313. Next, the source electrode and the drain electrode 314 are formed on the second semiconductor region 313.

Figure 4C:
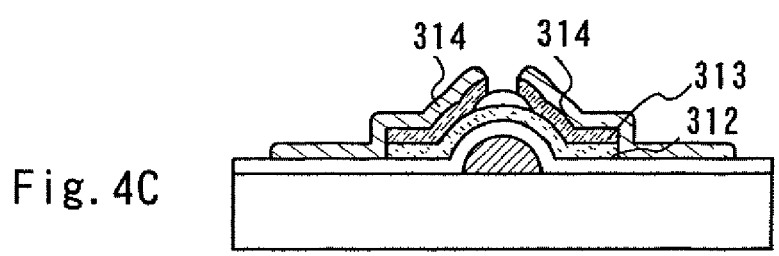

Next, as shown in FIG. 4C, the second semiconductor region is etched with the source electrode and the drain electrode 314 as masks to expose the protective film 401. At the same time, the second semiconductor film is separated and the third semiconductor region 321 which functions as the source region and the drain region is formed. In this embodiment mode, the second semiconductor film is etched by using the source electrode and the drain electrode, however, the invention is not limited to this step and the semiconductor film may be etched selectively by forming a mask similarly to the aforementioned first mask pattern.

Figure 4D:
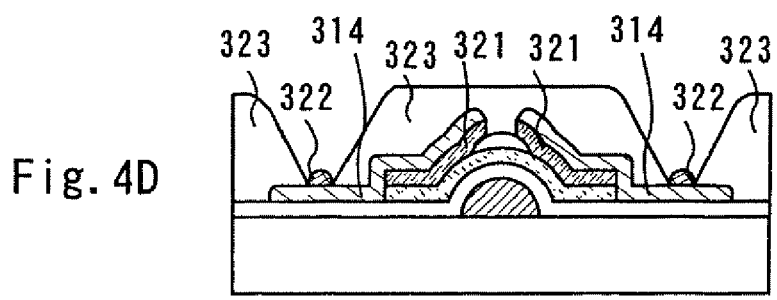

Next, a passivation film is deposited on the source electrode and the drain electrode 314 as shown in FIG. 4D. Then, after forming the second mask pattern 322 which has low wettability, the interlayer insulating film 323 is formed by using an insulating material which has high wettability.

Figure 4E:
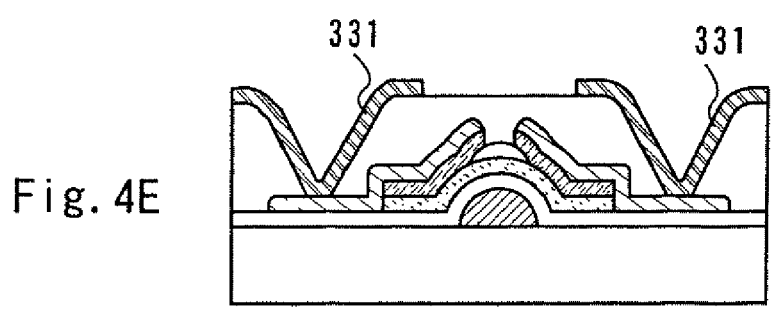

Next, as shown in FIG. 4E, after removing the second mask pattern 322, the conductive films 331 which connect to the source electrode and the drain electrode 314 respectively are formed similarly to Embodiment Mode 4.

By the aforementioned steps, a channel-protective type TFT can be formed. The protective film 401 functions as a channel-protective film, therefore, the first semiconductor region which is to be a channel region can be protected from damages due to overetching and the like when etching the semiconductor film to which impurities are added. Accordingly, a TFT which exhibits high mobility with a stable property can be obtained.

Embodiment Mode 6

In this embodiment mode, steps of forming a staggered TFT are described with reference to FIGS. 5A to 5E.

Figure 5A:
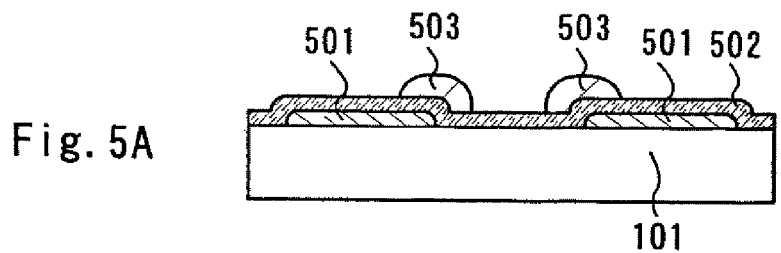
FIGS. 5A to 5E are sectional views showing manufacturing steps of a semiconductor device according to the invention.

As shown in FIG. 5A, a source electrode and a drain electrode 501 are formed on the substrate 101. The source electrode and the drain electrode 501 are formed by using a similar material to that of the source electrode and the drain electrode 314 described in Embodiment Mode 4. The droplet discharging method, the printing method, the electric field plating method, the PVD method, and the CVD method are used. In the case of using the PVD method or the CVD method, a mask pattern is formed by the method in Embodiment Mode 3 or the photolithography process, and etching is applied to form the mask pattern into a desired shape.

Next, a conductive first semiconductor film 502 containing impurities of group 13 or 15 of the Periodic Table of Elements is deposited. The first semiconductor film 502 is formed by a similar method to that for the second semiconductor film 303 in Embodiment Mode 4. Next, first mask patterns 503 used for etching a part of the first semiconductor film 502 on and between the source electrode and the drain electrode 501 are formed. The first mask pattern is formed by a similar material and manufacturing method to those of the first mask pattern 305 in Embodiment Mode 4.

Figure 5B:
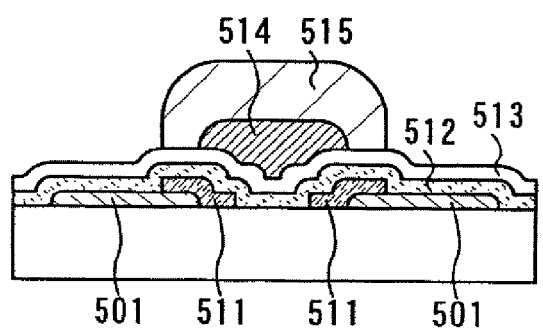

Next, as shown in FIG. 5B, a source region and a drain region 511 are formed by etching the first semiconductor film by a known method using the first mask pattern 503. Subsequently, a second semiconductor film 512 and a gate insulating film 513 are sequentially deposited. The second semiconductor film 512 and the gate insulating film 513 are each formed by appropriately using a material and a manufacturing method of the first semiconductor film 303 and the gate insulating film 302 described in Embodiment Mode 4.

Next, a gate electrode 514 is formed between the source region and the drain region 511. Subsequently, a second mask pattern 515 is formed. The gate electrode 514 and the second mask pattern 515 are each formed by using a material and a method for forming the gate electrode 301 and the first mask pattern 305 described in Embodiment Mode 4.

Figure 5C:
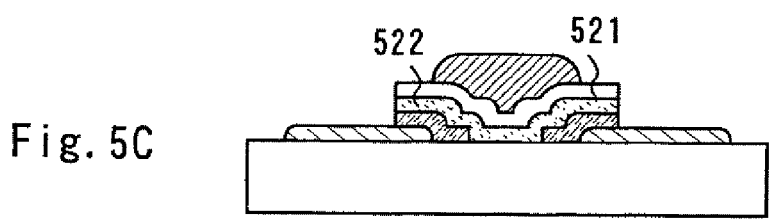

Next, as shown in FIG. 5C, the gate insulating film 513 is etched using the second mask pattern 515 to form a gate electrode 521. By forming a semiconductor region 522 by etching the second semiconductor film 512, a part of the source electrode and the drain electrode 501 is exposed.

Figure 5D:
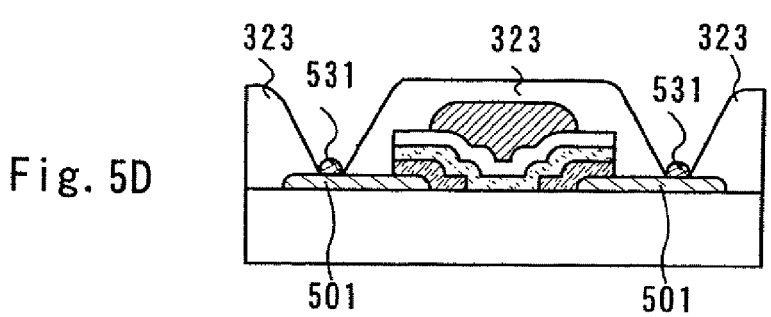

Next, as shown in FIG. 5D, after forming a third mask pattern 531 which has low wettability on a surface of the source electrode and the drain electrode 501 that are exposed, the interlayer insulating film 323 is formed by using a material which has high wettability. For the third mask pattern 531, the material and method for forming the second mask pattern 322 described in Embodiment Mode 4 is appropriately applied.

Figure 5E:
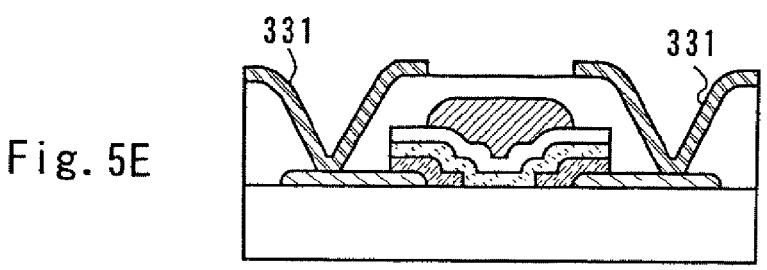

Next, as shown in FIG. 5E, after the third mask pattern 531 is removed, the conductive films 331 are formed.

By the aforementioned steps, a staggered TFT can be formed.

Embodiment Mode 7

In this embodiment, steps of forming a top gate coplanar TFT are described with reference to FIGS. 6A to 6D.

Figure 6A:
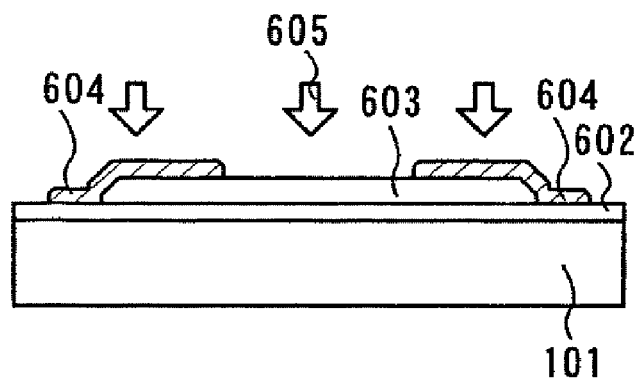
FIGS. 6A to 6D are sectional views showing manufacturing steps of a semiconductor device according to the invention.

As shown in FIG. 6A, a first insulating film 602 is deposited on the substrate 100. The first insulating film, which is provided for preventing impurities from entering from the substrate 101 in the TFT, is formed of a silicon oxide film, a silicon nitride film, a silicon oxynitride film, a silicon nitride oxide film and the like by a known method such as the PVD method and the CVD method. In the case where the substrate 101 is formed of a material from which impurities do not enter the TFT, that is representatively quartz and the like, the first insulating film 602 is not required to be provided.

Next, a semiconductor region 603 is formed on the first insulating film 602. The semiconductor region 603 is formed by etching the first semiconductor film 303 described in Embodiment Mode 4 by the methods in Embodiment Mode 1 or 3, or a known etching method to be formed into a desired shape.

Figure 6B:
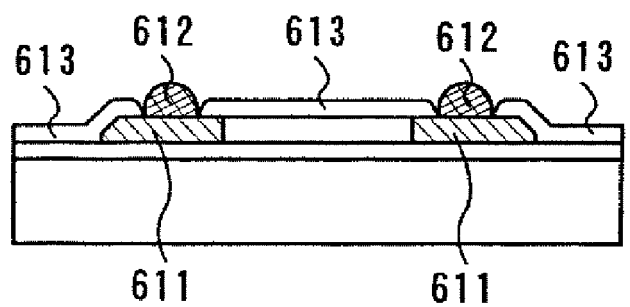

Next, after discharging solution 604 containing impurities of group 13 or 15 of the Periodic Table of Elements on the semiconductor region 603, laser light 605 is irradiated. By this step, conductive semiconductor regions (a source region and a drain region) 611 can be formed as shown in FIG. 6B. Accordingly, it is preferable that the solution containing impurities of group 13 or 15 of the Periodic Table of Elements be discharged on the semiconductor region which is to be a source region and a drain region later.

Next, as shown in FIG. 6B, a first mask pattern 612 which has low wettability is formed on the source region and the drain region 611. The first mask pattern 612 is provided for preventing the formation of a gate insulating film and an interlayer insulating film that are formed later, therefore, it is preferable to discharge the first mask pattern 612 in a region where a contact hole and a connecting wiring are formed later. The first mask pattern is formed by using a similar material and method for forming the second mask pattern.

Next, a material which has high wettability such as an organic SOG such as siloxane polymer and polysilazane and an inorganic SOG are formed by the droplet discharging method or the application method, and a gate insulating film 613 is formed through the drying and baking treatment. Note that the organic SOG and the inorganic SOG are repelled by the first mask pattern due to their high wettability. In this step, the first mask pattern 612 is dried, thus a compound 622 of the first mask pattern is left in or on the semiconductor region 603.

Figure 6C:
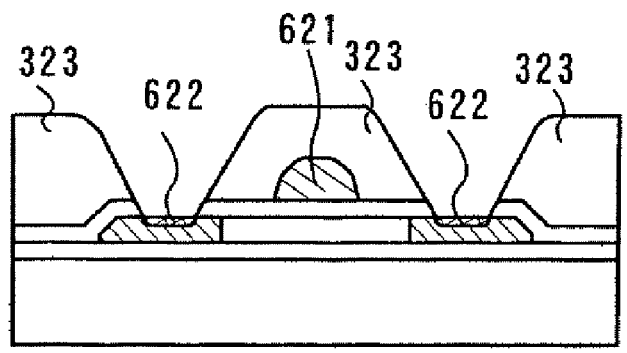
Figure 6D:
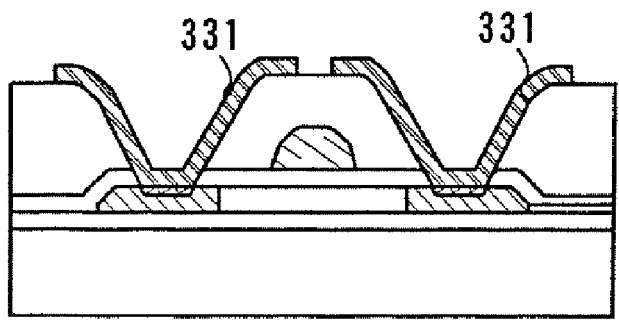

As shown in FIG. 6C, a gate electrode 621 is formed on the gate insulating film 613 between the source region and the drain region 611 on the semiconductor region 603. The gate electrode 621 is formed by using a similar material and method for forming the gate electrode 301 described in Embodiment Mode 4.

Next, an interlayer insulating film 323 is formed by applying an insulating material which has high wettability. As the compound 622 of the first mask pattern has low wettability, the insulating material which has high wettability is repelled. Therefore, the interlayer insulating film 323 can be formed selectively.

Next, conductive films 331 are formed.

By the aforementioned steps, a top gate coplanar TFT can be formed.

Embodiment Mode 8

In this embodiment mode, steps of forming a top gate coplanar TFT, which are different than those of Embodiment Mode 7 are described with reference to FIGS. 25A to 25D. In Embodiment Mode 7, a TFT of which gate insulating film is formed by the application method or the droplet discharging method is described. In this embodiment, a TFT of which gate insulating film is deposited by the CVD method or the PVD method is described.

Figure 25A:
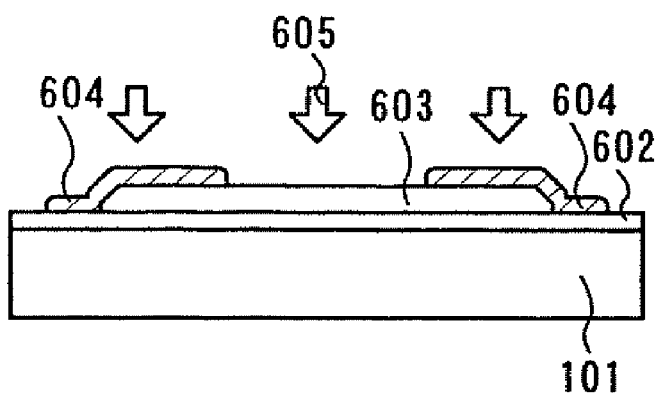
FIGS. 25A to 25D are sectional views showing manufacturing steps of a semiconductor device according to the invention.
Figure 25B:
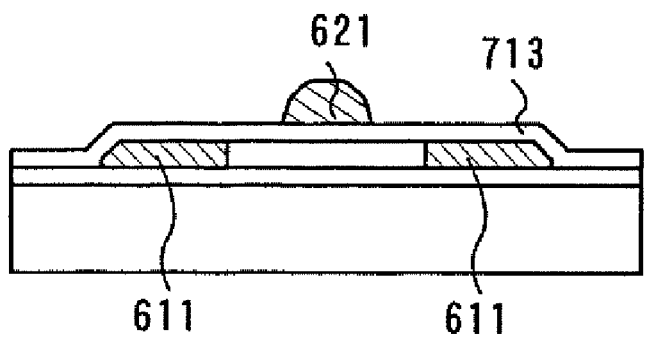

As shown in FIG. 25A, the semiconductor region 603 is formed similarly to Embodiment Mode 7. After discharging solution 604 containing impurities of group 13 or 15 of the Periodic Table of the Elements on the semiconductor region 603 by the droplet discharging method, the laser light 605 is irradiated and the conductive semiconductor regions (a source region and a drain region) 611 are formed as shown in FIG. 25B.

Next, a gate insulating film 713 is deposited on the semiconductor region and the first insulating film 602 by the CVD method or the PVD method. In this case, the gate insulating film is deposited on the entire surface of the substrate. Subsequently, the gate electrode 621 is formed on the gate insulating film 713 between the source region and the drain region 611 on the semiconductor region 603.

Figure 25C:
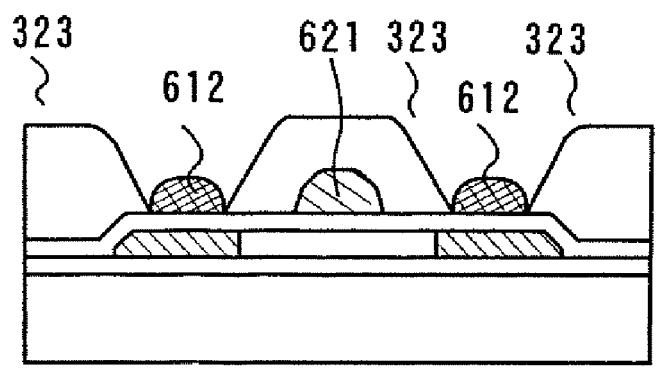

Next, the first mask pattern 612 which has low wettability is formed in a region where the source region and the drain region 611 and the gate insulating film 713 are overlapped as shown in FIG. 25C. The first mask pattern 612 is provided for preventing the formation of an interlayer insulating film that is formed later, therefore, it is preferable to discharge the first mask pattern in a region where a contact hole and a connecting wiring are formed later. Subsequently, the interlayer insulating film 323 is formed by applying an insulating material which has high wettability. As the first mask pattern has high wettability, the insulating material which has high wettability is repelled by the first mask pattern.

Figure 25D:
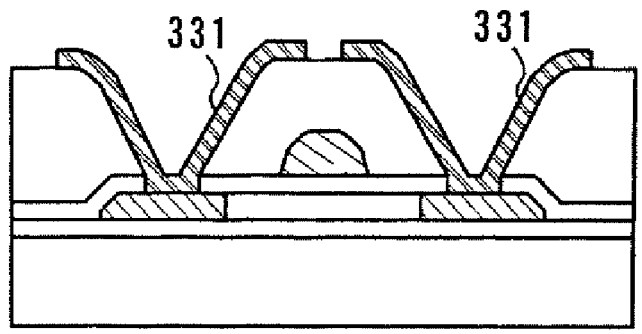

Next, as shown in FIG. 25D, the first mask pattern 612 is removed by $O_2$ ashing by using the interlayer insulating film 323 as a mask, thereby a portion of the gate insulating film 713 is exposed. Then, the exposed region of the gate insulating film is etched to expose the source region and the drain region. Subsequently, the conductive films 331 which connect to the source region and the drain region respectively are formed.

By the aforementioned steps, a top gate coplanar TFT can be formed. Also, by a similar step and a known method of forming a contact hole, a bottom gate coplanar TFT can be formed.

Embodiment Mode 9

Figure 20:
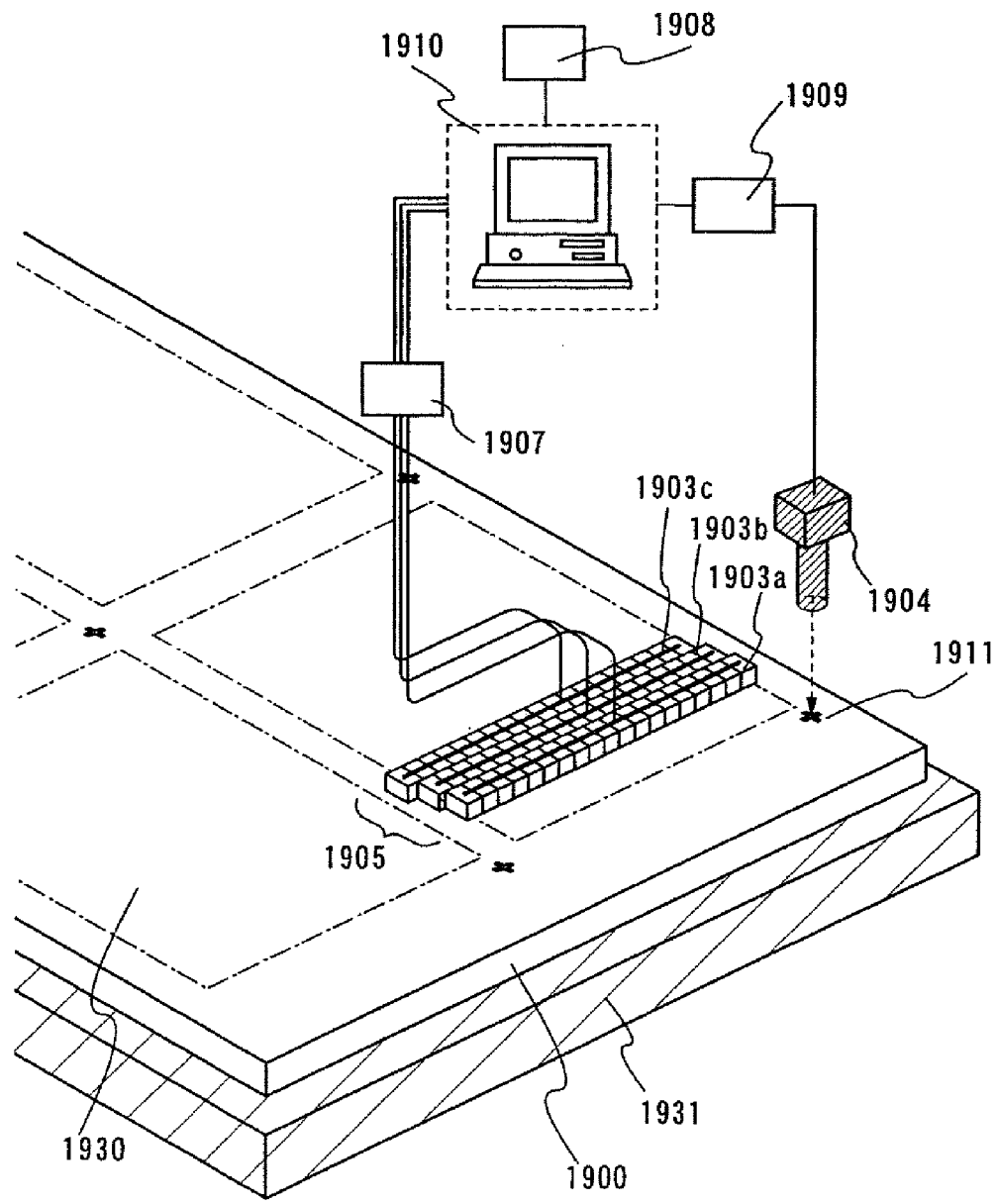
FIG. 20 is a diagram showing a structure of a droplet discharging apparatus which can be applied to the invention.

In this embodiment mode, one mode of a droplet discharging apparatus which can be used for forming the mask pattern in the aforementioned embodiment modes is described. In FIG. 20, a region where one panel 1930 is formed on a substrate 1900 is shown by a dotted line.

A droplet discharging apparatus 1905 has a head which includes a plurality of nozzles. In this embodiment mode, three heads (1903a, 1903b, and 1903c) which has ten nozzles each are provided, however, the number of nozzles and heads can be set according to the process area and steps.

Each head 1905 is connected to a control means 1907. A computer 1910 controls the control means 1907, thereby a programmed pattern can be drawn. A timing to draw may be, for example, determined on the basis of a market 1911 formed on the substrate 1900 fixed on a stage 1931. Alternatively, a base point may be determined on the basis of the edges of the substrate 1900. This is detected by an image pickup means 1904 such as a CCD, and converted into a digital signal by an video signal processing means 1909. The computer 1910 recognizes the digital signal and generates a control signal which is sent to the control means 1907. When drawing a pattern in this manner, it is preferable that a distance between a surface to form a pattern and a distal end of a nozzle be 0.1 to 5 cm, preferably 0.1 to 2 cm, and more preferably about 0.1 mm. With a short distance like this, landing precision of the droplets is increased.

At this time, data on the pattern to be formed on the substrate 1900 is stored in a memory medium 1908. On the basis of this data, a control signal is sent to the control means 1907, which can control each head 1903a, 1903b, and 1903c independently. That is, each nozzle of the head 1903a, 1903b, and 1903c can discharge droplets of different materials. For example, the nozzles of the heads 1903a and 1903b discharge droplets containing an insulating material, and the nozzle of the head 1903c can discharge droplets containing a conductive material.

Further, each nozzle of the head can also be controlled independently. As the nozzles can be controlled independently, droplets of different materials can be discharged from specific nozzles. For example, a nozzle for discharging droplets containing a conductive material and a nozzle for discharging droplets containing a material for an insulating material can be provided for the head 1903a, for example.

Furthermore, in the case of applying the droplet discharging treatment on the large area such as a step of forming an interlayer insulating film, it is preferable to discharge droplets containing a material for an interlayer insulating film from all the nozzles. Further, it is preferable to discharge droplets containing a material for an interlayer insulating film from all the nozzles of the plurality of heads. Consequently, throughput can be improved. It is needless to say that the droplet discharging treatment can be applied to the large area by scanning a plurality of the nozzles each of which discharges droplets containing a material for an interlayer insulating film in the step of forming an interlayer insulating film.

By scanning the head in zigzag or back and forth, a pattern can be formed on a large mother glass. At this time, it is preferable to scan the head and the substrate relatively a plurality of times. When scanning the head against the substrate, it is preferable to slant the head against a direction of movement.

It is preferable that a width of the head be equivalent to a width of one panel when forming a plurality of panels from a large mother glass. This is because a pattern can be formed by one scanning against a region where one panel 1930 is formed, thus high throughput can be expected.

The width of the head may be smaller than the width of the panel. At this time, a plurality of heads of which widths are small may be disposed in series to correspond to the width of one panel. By disposing a plurality of heads of which widths are small in series, a bending of the head can be prevented which is likely to occur as the width of the head becomes large. It is needless to say that a pattern can be formed by scanning a head of which width is small a plurality of times.

It is preferable that a step of discharging droplets of the solution by the droplet discharging method be performed under a low pressure. This is because the solvent in the solution is evaporated before the discharged solution lands on the object being processed, thus steps of drying and baking of the solution can be omitted. Further, it is preferable to perform under a low pressure since an oxide film and the like are not formed on a surface of the conductor. A step of dropping the solution may be performed in a nitrogen atmosphere and an organic gas atmosphere as well.

As the droplet discharging method, a piezoelectric method can be employed. The piezoelectric method is utilized for an ink jet printer for its superior controllability of droplets and high degree of freedom in the selection of ink. There are a vender type (representatively MLP (Multi Layer Piezo) type), a piston type (representatively an ML Chip (Multi Layer Ceramic Hyper Integrated Piezo Segments) type), a sidewall type and a roof wall type in the piezoelectric method. Depending on the solvent of the solution, the droplet discharging method using what is called a bubble-jet (Japanese registered trademark) method (thermal method) may be used in which the solution is pushed out by generating bubbles by a heater.

Embodiment 1

Figure 11:
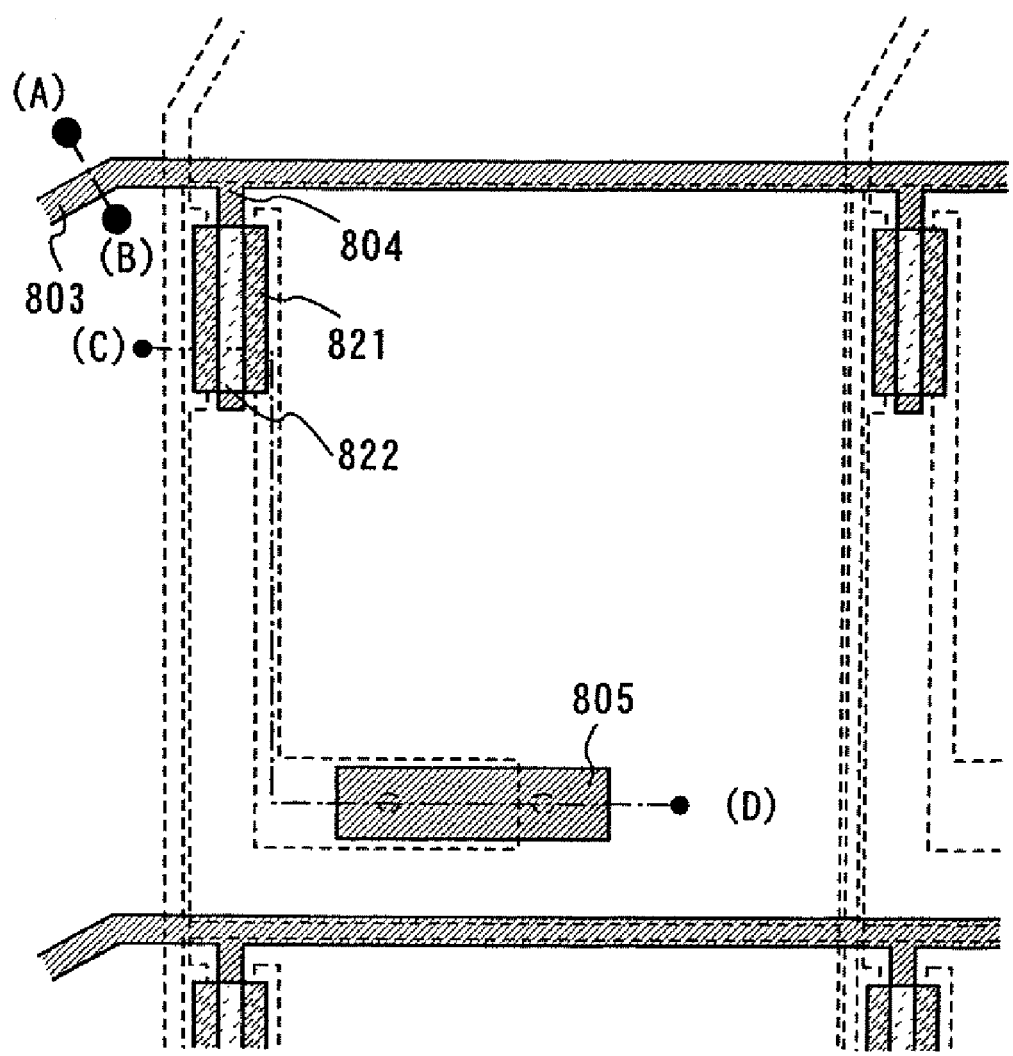
FIG. 11 is a top plan view showing a manufacturing step of a semiconductor device according to the invention.
Figure 12:
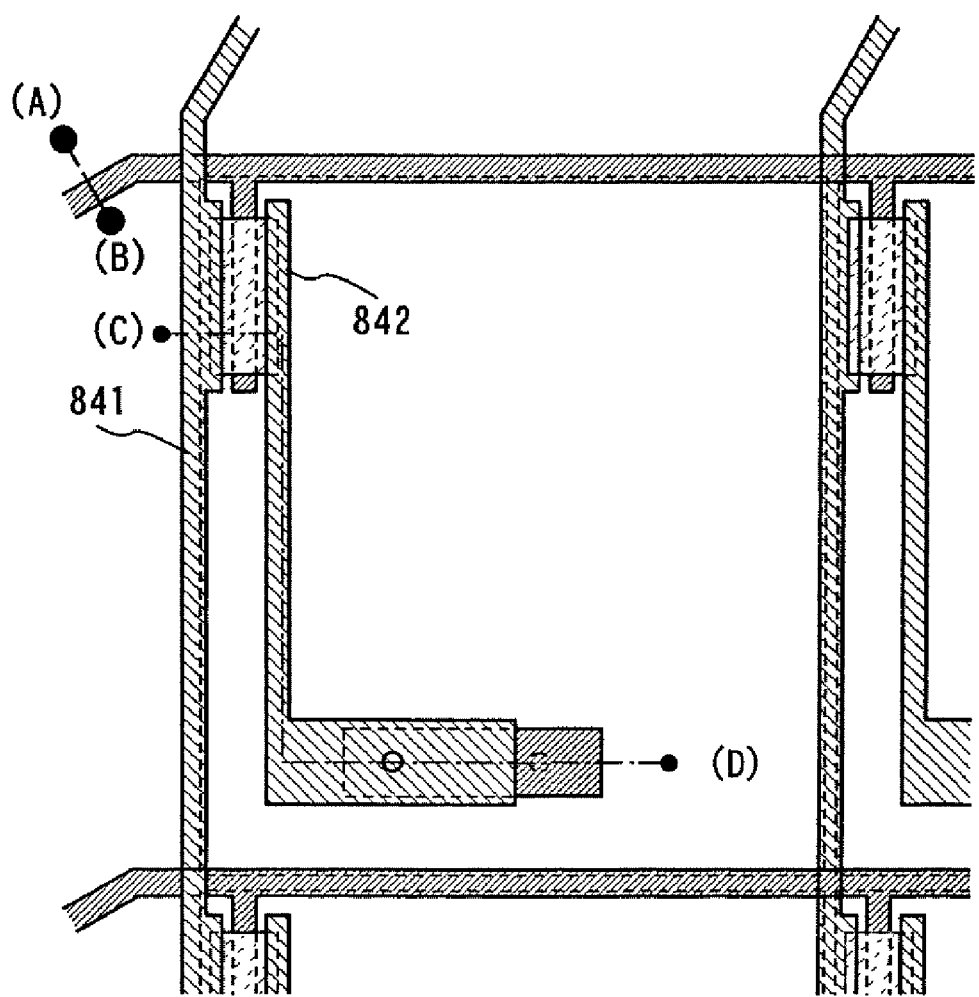
FIG. 12 is a top plan view showing a manufacturing step of a semiconductor device according to the invention.
Figure 13:
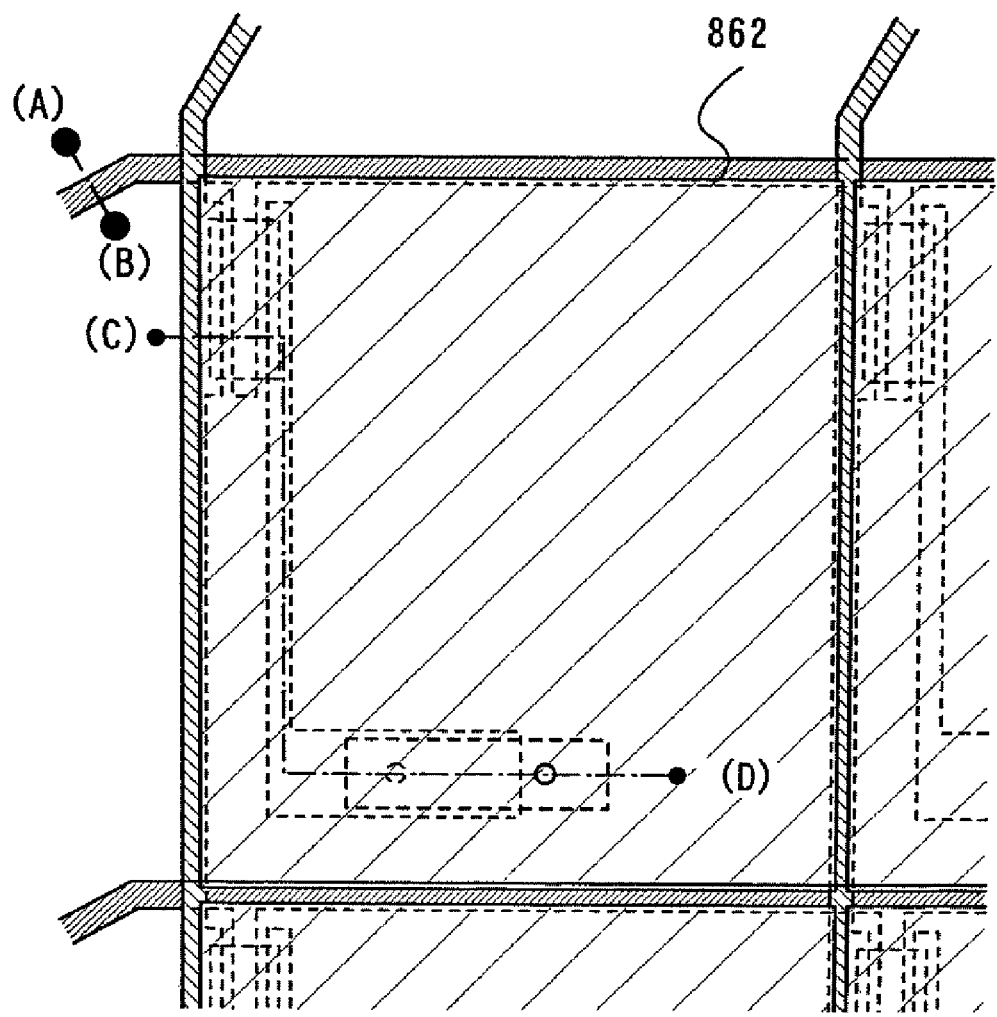
FIG. 13 is a top plan view showing a manufacturing step of a semiconductor device according to the invention.

Next, manufacturing methods of an active matrix substrate and a display panel comprising the active matrix substrate are described with reference to FIGS. 8 to 13. In this embodiment, a liquid crystal display panel is taken as an example of the display panel. FIGS. 8 to 10 each shows a vertical sectional structure of a pixel portion and a connecting terminal portion schematically. FIGS. 11 to 13 each shows a plan structure corresponding to A-B and C-D.

As shown in FIG. 8A, an insulating film 801 in thickness of 10 nm is formed by oxidizing the surface of a substrate 800 at 400° C. This insulating film functions as an etching stopper film of a conductive film which is formed later. Subsequently, a first conductive film 802 is formed on the insulating film 801 and first mask patterns 803 to 805 are formed by the droplet discharging method on the first conductive film. AN 100 glass substrate of Asahi Glass Co., Ltd. is used for the substrate 800 and a tungsten film in thickness of 100 nm is deposited for the first conductive film 802 by sputtering using tungsten as a target in an argon gas atmosphere. The first mask pattern is formed by discharging polyimide by the droplet discharging method and applying baking treatment at 200° C. for 30 minutes. The first mask pattern is discharged on a gate wiring layer, a gate electrode layer and a connecting conductive layer which are formed later.

Next, as shown in FIG. 8B, a portion of the first conductive film is etched by using the first mask patterns 803 to 805 to form a gate wiring layer 811, a gate electrode layer 812, and a connecting conductive layer 813. After that, the first mask patterns 803 to 805 are peeled off by using a peeling solution.

Next, a gate insulating film 814 is deposited by the plasma CVD method. The gate insulating film 814 is formed of a silicon oxynitride film in thickness of 110 nm (H: 1.8%, N: 2.6%, O: 63.9%, Si: 31.7%) by the plasma CVD method using $SiH_4$ and $N_2O$ (flow rate $Si_4:N_2O=1:200$) in a chamber heated at 400° C.

Then, a first semiconductor film 815 and a second semiconductor film 816 having an n-channel type are deposited. The first semiconductor film 815 is formed of an amorphous silicon film in thickness of 150 nm by the plasma CVD method. Next, a semi-amorphous silicon film is formed in thickness of 50 nm by using silane gas and phosphine gas after removing an oxide film on the surface of the amorphous silicon film.

Next, second mask patterns 817 and 818 are formed on the second semiconductor film. The second mask patterns are formed by discharging polyimide on the second semiconductor film 816 by the droplet discharging method and applying heat treatment at 200° C. for 30 minutes. The second mask pattern 817 is discharged in a region where a semiconductor region is formed later.

Next, as shown in FIG. 8C, the second semiconductor film 816 is etched by using the second mask pattern to form first semiconductor regions 821 and 822 (a source region and a drain region). The second semiconductor film 816 is etched by using a mixture gas of which flow rate is $CF_4:O_2=10:9$. After that, the second mask patterns 817 and 818 are peeled off by using peeling solution.

Next, a third mask pattern 823 is formed. The third mask pattern is formed by discharging polyimide on portions of the first semiconductor regions 821 and 822, and the first semiconductor film 815 by the droplet discharging method and applying heat treatment at 200° C. for 30 minutes.

Next, as shown in FIG. 8D, the first semiconductor film 815 is etched by using the third mask pattern 823 to form a second semiconductor region 831. Note that FIG. 8D schematically shows a vertical sectional structure while FIG. 11 shows plan structure corresponding to A-B and C-D. After that, the third mask pattern 823 is peeled off by using peeling solution.

Next, as shown in FIG. 8E, a fourth mask pattern 832 which has low wettability is formed. The fourth mask pattern which has low wettability is formed by discharging solution obtained by dissolving fluoride silane coupling agent in solvent in a region where the gate insulating film 814 and the connecting conductive layer 813 overlap. Note that the fourth mask pattern 832 is a protective film for forming a fifth mask pattern which is used for forming contact holes in a region where a drain electrode to be formed later and the connecting conductive layer 813 are connected to each other.

Next, a fifth mask pattern 833 is formed by using a material which has high wettability. the fifth mask pattern is a mask for forming a first contact hole, which is formed by discharging polyimide by the droplet discharging method and applying heat treatment at 200° for 30 minutes. At this time, as the fourth mask pattern 832 has low wettability while the fifth mask pattern 833 has high wettability, the fifth mask pattern 833 is not formed in a region where the fourth mask pattern is formed.

Next, as shown in FIG. 9A, the fourth mask pattern 832 is removed by oxygen ashing to expose a portion of the gate insulating film. Subsequently, the exposed gate insulating film is etched by using the fifth mask pattern 833. The gate insulating film is etched by using $CHF_3$. After that, the fifth mask pattern 833 is peeled off by oxygen ashing and etching using peeling solution.

Next, a source wiring layer 841 and a drain wiring layer 842 are formed by the droplet discharging method. At this time, the drain wiring layer 842 is formed so as to be connected to the second semiconductor region 822 and the connecting conductive layer 813. The source wiring layer 841 and the drain wiring layer 842 are formed by discharging solution dispersed with Ag (silver) particles and applying heat treatment at 100° C. for 30 minutes for drying, and baking at 230° C. for one hour in an atmosphere containing 10% of oxygen. Next, a protective film 843 is formed. The protective film is formed of a silicon nitride film in thickness of 100 nm by the sputtering method using a silicon target in a mixed gas atmosphere of argon and nitrogen (flow rate $Ar:N_2=1:1$).

FIG. 12 shows a plan view corresponding to A-B and C-D of FIG. 9A.

Next, as shown in FIG. 9B, sixth mask patterns 851 and 852 which have low wettability are formed in a region where the protective film 843 and the connecting conductive layer 813 are overlapped, and a region where the gate wiring layer and the source wiring layer are connected to a connecting terminal. After that, an interlayer insulating film 853 is formed. The sixth mask pattern is a mask for an interlayer insulating film which is formed later. After discharging the solution obtained by dissolving fluoride silane coupling agent in solvent by the droplet discharging method as the sixth mask pattern and discharging polyimide as an insulating material which has high wettability by the droplet discharging method, both layers are baked at 200° C. for 30 minutes and 300° C. for one hour respectively.

Next, as shown in FIG. 9C, after etching the sixth mask pattern 851 by using mixed gas of $CF_4$, $O_2$, and He (flow rate $CF_4:O_2:He=8:12:7$), portions of the protective film 843 and the gate insulating film 814 are etched to form a second contact hole. By this etching step, the protective film 843 and the gate insulting film 814 in a region where the gate wiring layer and the source wiring layer are connected to a connecting terminal are etched.

After depositing the second conductive film 861, a seventh mask pattern is formed. The second conductive film is formed by depositing indium tin oxide (ITO) containing silicon oxide in thickness of 110 nm by the sputtering method, dropping polyimide by the droplet discharging method in a region where a pixel electrode is formed later, and baking at 200° C. for 30 minutes.

In this embodiment, a pixel electrode is formed of ITO containing silicon oxide for manufacturing a light-transmitting liquid crystal display panel, however, the pixel electrode may be formed by forming a predetermined pattern using a compound containing indium tin oxide (ITO), zinc oxide (ZnO), tin oxide ($SnO_2$) and the like and applying baking treatment. In the case of manufacturing a reflective type liquid crystal display panel, a compound containing metal particles such as Ag (silver), Au (gold), Cu (copper), W (tungsten), and Al (aluminum) can be used.

Next, as shown in FIG. 9D, a pixel electrode 871 is formed by etching the second conductive film by using the seventh mask pattern. Through this etching step, the second conductive film formed in a region where the gate wiring layer and the source wiring layer are connected to the connecting terminal is etched as well. After that, the seventh mask pattern is peeled off by using peeling solution. Note that FIG. 13 shows a plan view corresponding to A-B and C-D in FIG. 9D.

The pixel electrode 871 is connected to the connecting conductive layer 813 through the second contact hole. The connecting conductive layer 813 is connected to the drain wiring layer 842, therefore, the pixel electrode 871 and the drain wiring layer 842 are electrically connected. In this embodiment, the drain wiring layer 842 is formed of silver (Ag) and the pixel electrode 871 is formed of ITO containing silicon oxide, however, these are not directly connected to each other. Accordingly, the silver is not oxidized and the drain wiring layer 842 and the pixel electrode 871 can be electrically connected without increasing contact resistance.

Further, the pixel electrode can be formed by selectively discharging solution containing a conductive material by the droplet discharging method, without the etching step. Moreover, the pixel electrode can be formed by discharging conductive solution after forming a mask pattern which has low wettability in a region where the pixel electrode is not formed. In this case, the mask pattern can be removed by $O_2$ ashing. The mask pattern may be left without being removed.

By the aforementioned steps, an active matrix substrate can be formed.

Figure 10A:
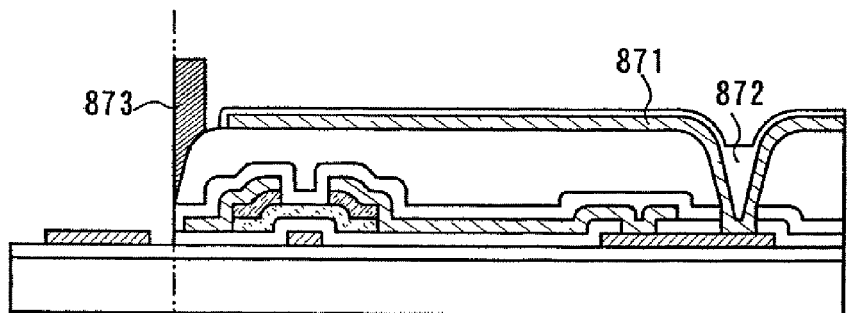
FIGS. 10A to 10C are sectional views showing manufacturing steps of a semiconductor device according to the invention.

Next, as shown in FIG. 10A, an insulating film is deposited by the printing method and the spin coating method so as to cover the pixel electrode 871, thus an alignment film 872 is formed through rubbing treatment. Note that the alignment film 872 can be formed by an oblique deposition method as well. Subsequently, a sealant 873 is formed in a periphery of the pixels by the droplets discharging method.

Figure 10B:
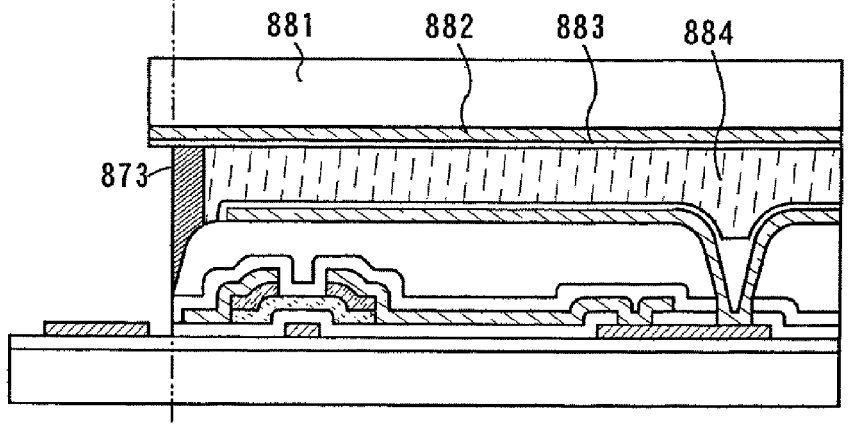

Next, as shown in FIG. 10B, a liquid crystal material is dropped inside a closed loop formed of the sealant 873 by a dispenser method (dropping method).

Figure 28A:
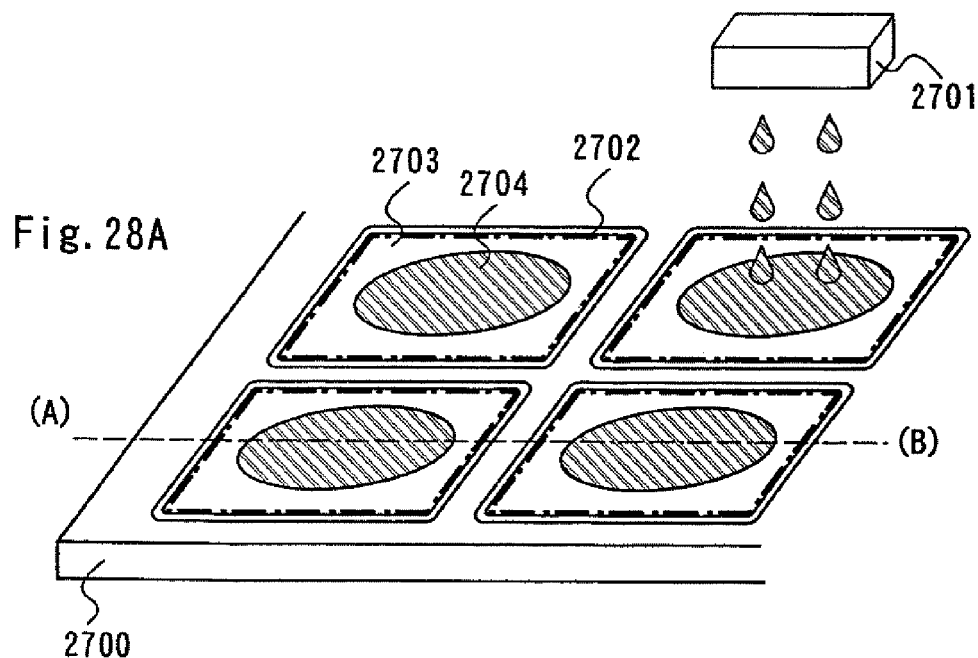
FIGS. 28A and 28B are views showing a droplet dropping method which can be applied to the invention.
Figure 28B:
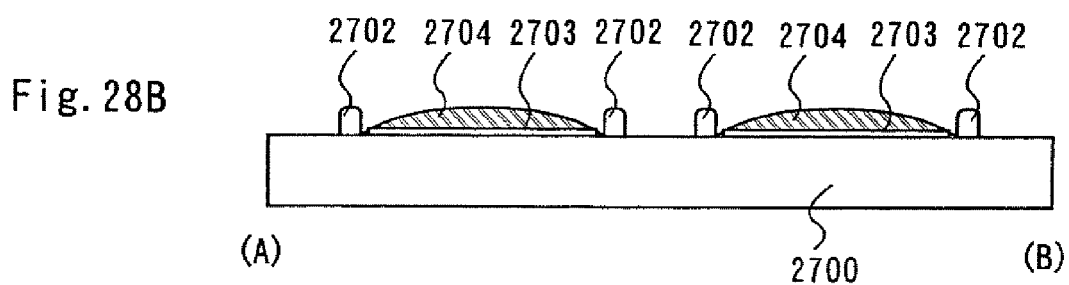

Here, FIG. 28 shows a step of dropping a liquid crystal material by One Drop Filling method on an active matrix substrate. FIG. 28A shows a perspective view of a step of dropping a liquid crystal material by a dispenser 2701 while FIG. 28B is a sectional view of A-B in FIG. 28A.

A liquid crystal material 2704 is dropped or discharged from the dispenser 2701 so as to cover the pixel portion 2703 surrounded by the sealant 2702. The dispenser 2701 may be moved or the substrate 2700 may be moved with the dispenser

2701 fixed to form a liquid crystal layer. Further, a liquid crystal may be dropped at a time by providing a plurality of the dispensers 2701.

As shown in FIG. 28B, the liquid crystal material 2704 is selectively dropped or discharged in a region surrounded by the sealant 2702.

Next, the substrate is adhered in a vacuum atmosphere with a counter substrate 881 on which an alignment film 883 and a counter electrode 882 are provided, irradiated with ultraviolet ray for curing, thus a liquid crystal layer 884 is formed by filling a liquid crystal material.

Fillers may be mixed in the sealant 873 and a color filter, a shielding film (black matrix) or the like may be formed on the counter substrate as well. Further, the liquid crystal layer 884 may be formed by a dipping method that the counter substrate is adhered and then liquid crystals are filled by using a capillary phenomenon.

Although the liquid crystal material is dropped on the pixel portion here, a substrate having the pixel portion may be adhered after dropping the liquid crystal material on the counter substrate side.

Figure 10C:
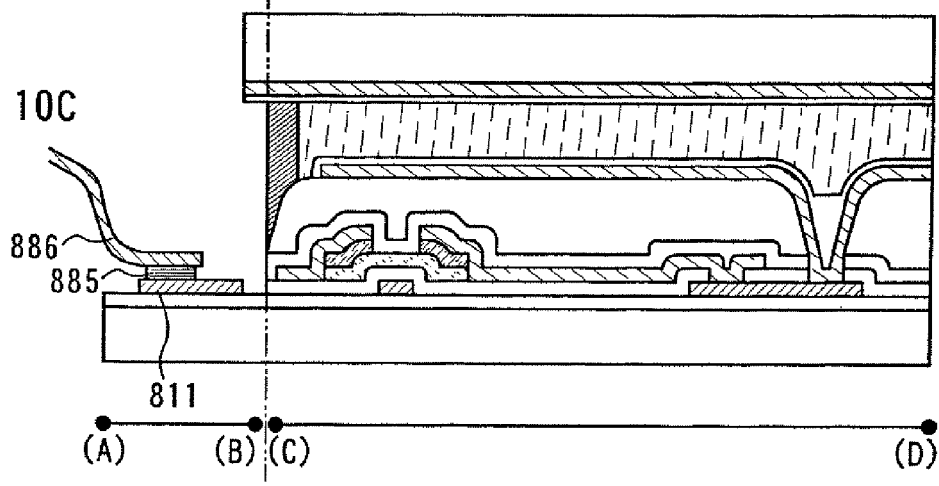

Next, as shown in FIG. 10C, a liquid crystal display panel can be formed by adhering connecting terminals (a connecting terminal 886 connected to the gate wiring layer, a connecting terminal connected to the source wiring layer which is not shown) through an anisotropic conductive layer 885 to the gate wiring layer 811 and the source wiring layer (not shown) respectively.

The interlayer insulating film 853 and the alignment film 872 can be formed on the entire surface of the substrate. In this case, after forming a mask by the droplet discharging method before forming the sealant, these insulating films are removed by a known etching method, thereby the source wiring layer and the gate wiring layer are exposed.

By the aforementioned steps, a liquid crystal display panel can be manufactured. Note that a protective circuit for preventing electrostatic discharge, representatively a diode and the like may be provided between the connecting terminal and the source wiring (gate wiring) or in the pixel portion. In this case, by forming a diode in a similar step as described above and connecting the gate wiring layer of the pixel portion and a drain wiring layer or a source wiring layer of the diode, an operation as a diode can be obtained as well.

Note that any of Embodiment Modes 1 to 9 can be applied to this embodiment. In this embodiment, a manufacturing method of a liquid crystal display panel is described as a display panel, however, the invention is not limited to this and can be applied to a light emitting display device having a light emitting substance formed of an organic material or an inorganic material as a light emitting layer, and an active display panel such as a DMD (Digital Micromirror Device), a PDP (Plasma Display Panel), an FED (Field Emission Display), and an electrophoresis display device (electronic paper).

Embodiment 2

In this embodiment, a display panel using a passive matrix substrate is described with reference to FIGS. 26A to 26D. In this embodiment, an EL (Electro Luminescence) display panel (a light emitting display panel) is described as an example of a display panel.

Figure 26A:
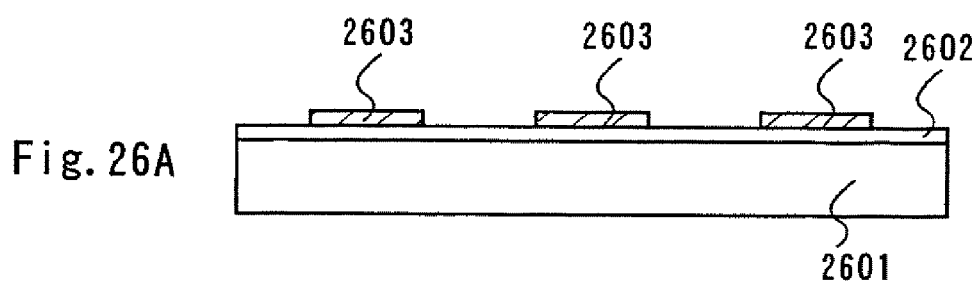
FIGS. 26A to 26D are sectional views showing manufacturing steps of a semiconductor device according to the invention.

As shown in FIG. 26A, a first pixel electrode 2602 formed of a light-transmitting conductive film is formed on a substrate 2601 which transmits light. A plurality of the first pixel electrodes 2602 are provided in parallel. In this embodiment, the first pixel electrode is formed by drawing while discharging solution in parallel containing a composition of ITO and $ZnO_2$ and baking.

Next, a plurality of first insulating films 2603 are formed which cross the first electrode at even intervals on the first pixel electrode 2602. As the first insulating film, an insulating film such as $SiO_2$ and SiN is formed and etched in parallel.

Figure 26B:
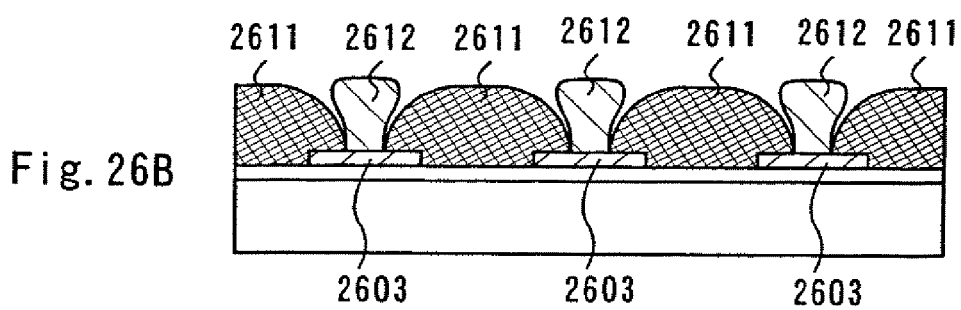

Next, as shown in FIG. 26B, a mask pattern 2611 which has low wettability is formed in a region where an organic EL layer is formed later, that is a portion of the adjacent first insulating films 2603 and a region therebetween. As the mask pattern which has low wettability, solution containing FAS is discharged by the droplet discharging method.

Note that the organic EL layer contains a material formed of an inorganic material in some cases.

Next, by discharging solution which has high wettability in a region where the mask pattern which has low wettability is not formed, that is an outer edge of the mask pattern, drying and baking treatment are performed to form a second insulating film 2612. In this embodiment, polyimide is discharged.

According to the composition, viscosity, and surface tension of the solution which has high wettability, the second insulating film 2612 of which cross section has a reverse tapered shape can be formed as shown in FIG. 26B.

Figure 27A:
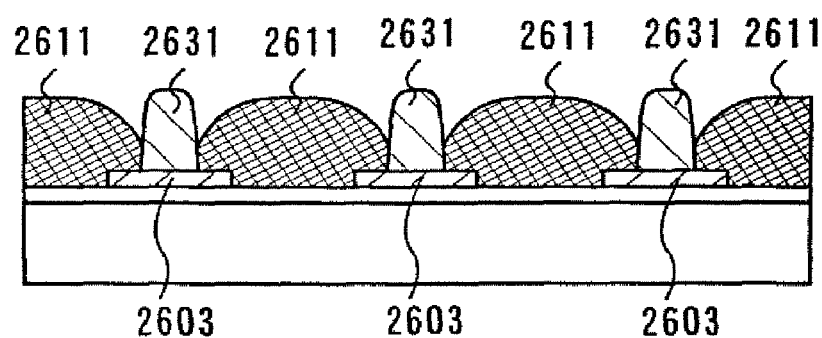
FIGS. 27A and 27B are sectional views showing manufacturing steps of a semiconductor device according to the invention.

Depending on the composition, viscosity, and surface tension of the solution which has high wettability, the second insulating film 2631 of which cross section has a forward tapered shape can be formed as shown in FIG. 27.

Figure 26C:
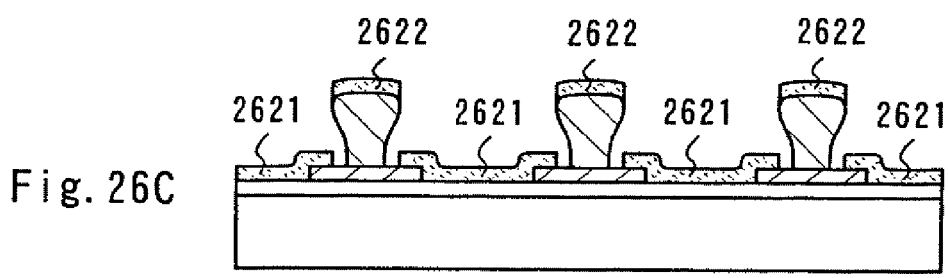

Next, as shown in FIG. 26C, the mask pattern 2611 is removed by $O_2$ ashing. Next, by evaporating an organic EL material, an organic EL layer 2621 is formed on the adjacent first insulating films 2603 and a region therebetween. By this step, an organic EL material 2622 is deposited on the second insulating film 2612 as well.

Figure 26D:
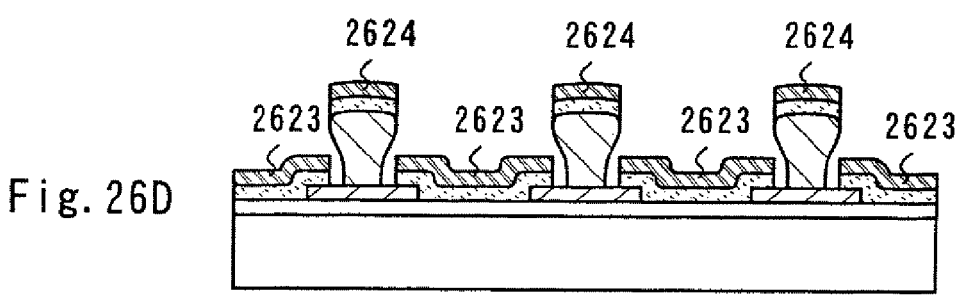

Next, as shown in FIG. 26D, a second pixel electrode 2623 is formed by depositing a conductive material. By this step, a second conductive material 2624 is deposited on the organic EL material 2622 formed on the second insulating film 2612. In this embodiment, the second pixel electrode is formed of Al, Al—Li alloy, Ag—Mg alloy and the like.

In the case where the second insulating film 2612 has a reverse tapered shape in its cross section, the organic EL layer 2621 and the pixel electrode 2623 are prevented from being deposited by a head of the second insulating film 2612, therefore, they can be separated by the second insulating film 2612 without using a known photolithography process.

Figure 27B:
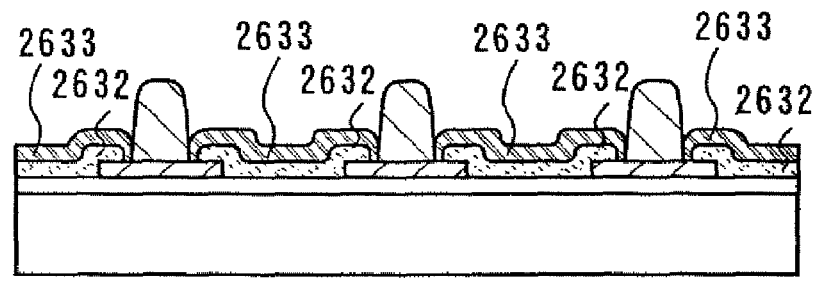

In the case where the second insulating film 2631 has a forward tapered shape in its cross section, the organic EL material 2622 and the second pixel electrode 2623 can be formed by discharging an organic EL material and a conductive material between each of the second insulating films 2631 by the droplet discharging method as shown in FIG. 27B.

After that, an organic EL display panel can be manufactured by depositing a protective film.

Note that any of Embodiment Modes 1 to 9 can be applied to this embodiment. In this embodiment, a manufacturing method of an organic EL display panel is described as a display panel, however, the invention is not limited to this and can be applied to a passive type display device such as a liquid crystal display device, a DMD (Digital Micromirror Device), a PDP (Plasma Display Panel), an FED (Field Emission Display), and an electrophoresis display device (electronic paper).

In this embodiment, an insulating film for insulating an organic EL layer can be formed without using a known photolithography.

Embodiment 3

In this embodiment, mounting of driver circuits (a signal driver circuit 1402 and scan driver circuits 1403a and 1403b) to a display panel described in the aforementioned embodiment is described with reference to FIGS. 14A to 14C.

Figure 14A:
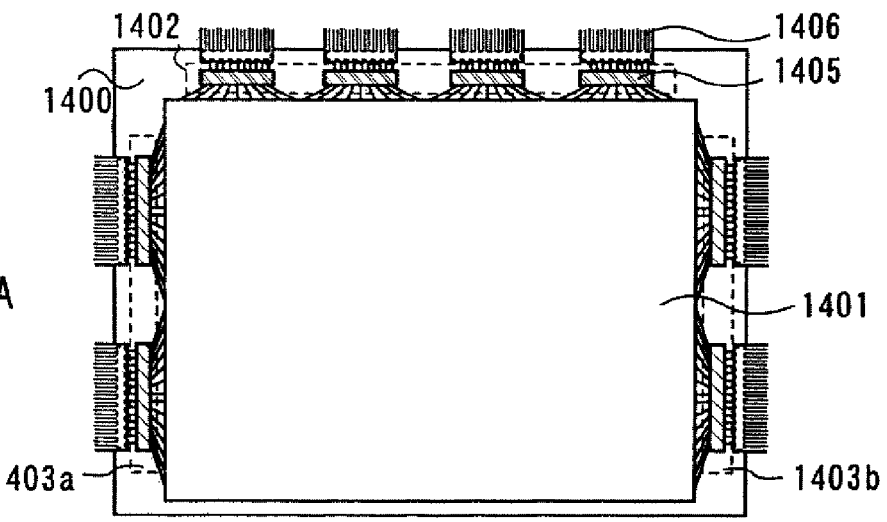
FIGS. 14A to 14C are top plan views showing mounting methods of driver circuits of a semiconductor device according to the invention.

As shown in FIG. 14A, the signal driver circuit 1402 and the scan driver circuits 1403a and 1403b are mounted in the periphery of the pixel portion 1401. In FIG. 14A, IC chips 1405 are mounted on a substrate 1400 as the signal driver circuit 1402 and the scan driver circuits 1403a and 1403b and the like. Then, the IC chips 1405 and an external circuit are connected through an FPC (Flexible Printed Circuit).

Figure 14B:
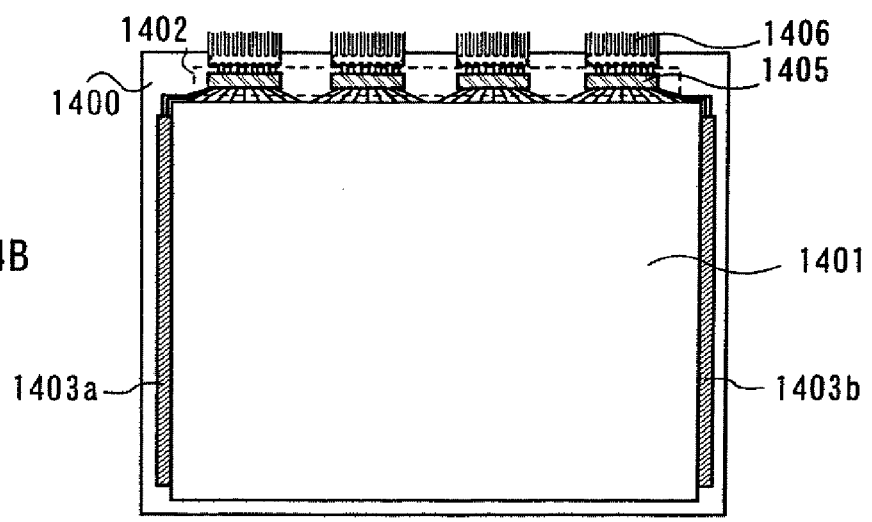

As shown in FIG. 14B, the pixel portion 1401 and the scan driver circuits 1403a and 1403b and the like are integrally formed on the substrate and the signal driver circuit 1402 and the like are mounted as an IC chip independently in some cases where TFTs are formed of an SAS or a crystalline semiconductor. In FIG. 14B, the IC chip 1405 is mounted on the substrate 1400 as the signal driver circuit 1402 by the COG method. The IC chip 1405 and an external circuit are connected through an FPC 1406.

Figure 14C:
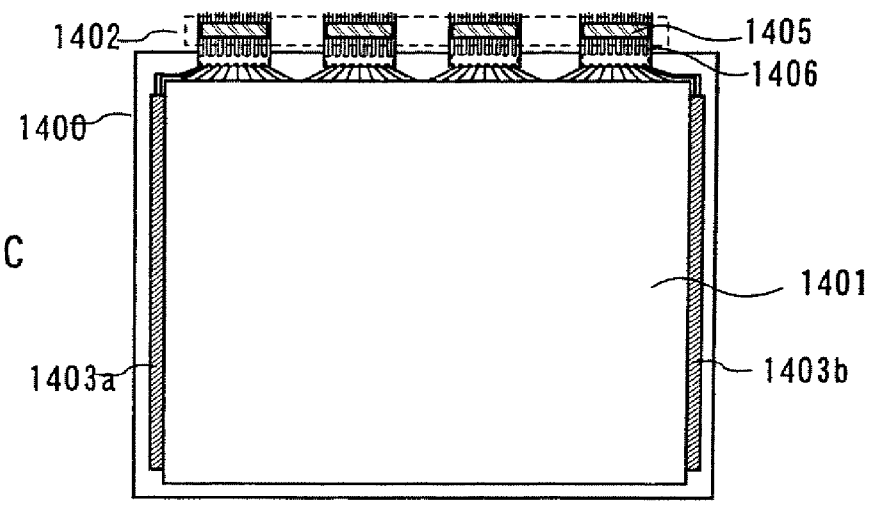

As shown in FIG. 14C, the signal driver circuit 1402 and the like are mounted by a TAB method in some cases in stead of the COG method. The IC chip 1405 and an external circuit are connected through the FPC 1406. In FIG. 14C, the signal driver circuit is mounted by the TAB method, however, the scan driver circuit may be mounted by the TAB method as well.

By mounting the IC chip by the TAB method, a large pixel portion can be provided relatively to the substrate and a narrower frame can be realized.

The IC chip is formed by using a silicon wafer, however, an IC formed on a glass substrate (hereinafter referred to as a driver IC) may be provided instead of the IC chip. The IC chip is taken out of a circular silicon wafer, therefore, a mother substrate is restricted in shape. A driver IC, on the other hand, is advantageous in improving productivity since a mother substrate is glass of which shape is not restricted. Therefore, a shape and a size of a driver IC can be freely designed. In the case of forming a driver IC as its long side being 15 to 80 mm, a required number thereof can be reduced as compared to the case of mounting an IC chip. As a result, the number of connecting terminals can be reduced, which improves a production yield.

A driver IC can be formed by using a crystalline semiconductor formed on a substrate, which can be formed by irradiating continuous oscillation laser light. A semiconductor film obtained by irradiating the continuous oscillation laser light has less crystal defects and crystal grains having large diameter. As a result, a transistor having such a semiconductor film has favorable mobility and response which enables a high speed drive and is preferable for a driver IC.

Embodiment 4

In this embodiment, a mounting method of the driver circuits (the signal driver circuit 1402 and the scan driver circuits 1403a and 1403b) to a display panel described in the aforementioned embodiment is described with reference to FIGS. 15A to 15D. the driver circuits may be mounted by a connecting method using an anisotropic conductive material, a wire bonding method and the like, one of which is described with reference to FIGS. 15A to 15D. In this embodiment, an example of using a driver IC for the signal driver circuit 1402 and the scan driver circuits 1403a and 1403b is described. An IC chip can be used appropriately instead of the driver IC.

Figure 15A:
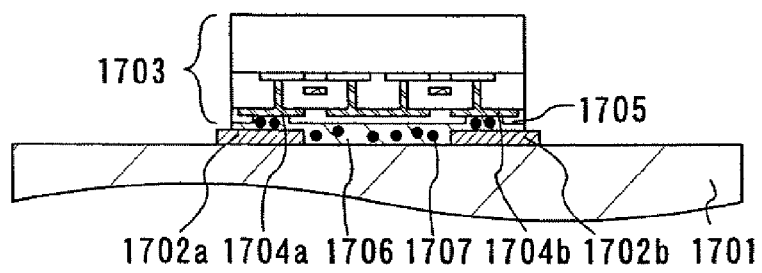
FIGS. 15A to 15D are sectional views showing mounting methods of driver circuits of a semiconductor device according to the invention.

FIG. 15A shows an example of mounting a driver IC 1703 on an active matrix substrate 1701 by using an anisotropic conductive material. Each of the source wiring, the gate wiring (not shown) and the like and electrode pads 1702a and 1702b as extraction electrodes of the wirings are formed on the active matrix substrate 1701.

Connecting terminals 1704a and 1704b are provided on the surface of the driver IC 1703 and a protective insulating film 1705 is formed in the periphery thereof.

The driver IC 1703 is fixed on the active matrix substrate 1701 with an anisotropic conductive adhesive 1706 and the connecting terminals 1704a and 1704b, and the electrode pads 1702a and 1702b are electrically connected through conductive particles 1707 contained in the anisotropic conductive adhesive. The anisotropic conductive adhesive is adhesive resin containing dispersed conductive particles (particle diameter of about 3 to 7 μm), which are, for example, epoxy resin, phenol resin and the like. The conductive particles (particle diameter of about several to several hundreds μm) are formed of alloy particles of one or a plurality of elements selected from gold, silver, copper, palladium, or platinum. Also, the particles having a multi-layer structure of these elements may be used. Moreover, particles obtained by coating resin particles with alloy of one or a plurality of elements selected from gold, silver, copper, palladium, or platinum may be used as well.

Instead of the anisotropic conductive adhesive, an anisotropic conductive film formed in film on the base film may be transferred to be used. The anisotropic conductive film is also dispersed with similar conductive particles to the anisotropic conductive adhesive. By using the conductive particles 1707 of suitable size and density mixed in the anisotropic conductive adhesive 1706, the driver IC can be mounted to the active matrix substrate in such a mode. This mounting method is suitable for the mounting methods of the driver ICs of FIGS. 14A and 14B.

Figure 15B:
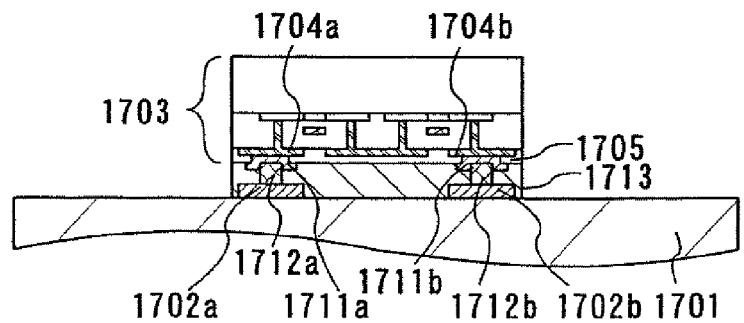

FIG. 15B shows an example of a mounting method using a contractile force of organic resin, in which buffer layers 1711a and 1711b are formed of Ta, Ti and the like on the surface of the connecting terminal of the driver IC, and Au is formed in thickness of about 20 μm by an electroless plating method and the like to form bumps 1712a and 1712b. By providing light curable insulating resin 1713 between the driver IC and the active matrix substrate, a contractile force of light curable resin can be utilized to mount the electrodes welded in pressure. This mounting method is suitable for a mounting method of the driver ICs of FIGS. 14A and 14B.

Figure 15C:
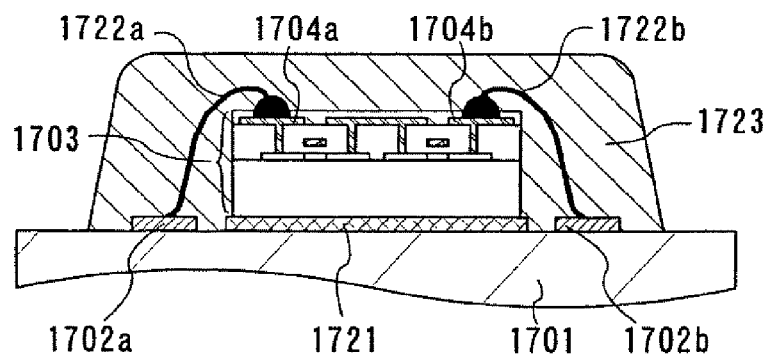

As shown in FIG. 15C, the driver IC 1703 is fixed on the active matrix substrate 1701 by an adhesive 1721, and the connecting terminal of the driver IC and the electrode pads 1702a and 1702b may be connected by wirings 1722a and 1722b. Then, organic resin 1723 is used for sealing. This mounting method is suitable for a mounting method of the driver ICs of FIGS. 14A and 14B.

Figure 15D:
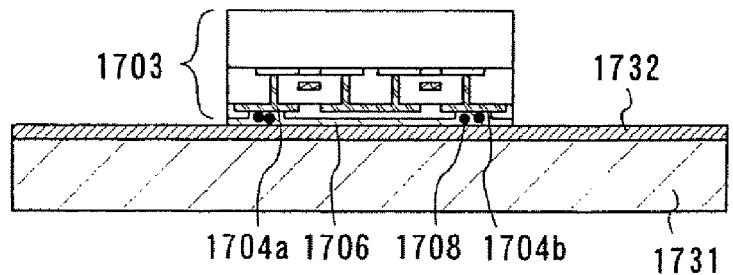

As shown in FIG. 15D, a wiring 1732 on an FPC (Flexible Printed Circuit) 1731 may be provided with the driver IC 1703 through the anisotropic conductive adhesive 1706 containing the conductive particles 1708. This structure is quite effective for applying to an electronic apparatus such as a portable terminal whose housing is limited in size. This mounting method is suitable for the mounting methods of the driver IC of FIG. 14C.

The mounting method of the driver IC is not particularly limited and a known COG method, the wire bonding method, the TAB method, or reflow processing using a solder bump can be employed. In the case of applying the reflow processing, it is preferable to use plastic which has high heat resistance such as a polyimide substrate, an HT substrate (Nippon Steel Chemical Group Co., Ltd.), and ARTON (JSR Corporation) formed of norbornene resin having a polarity group.

Embodiment 5

In the liquid crystal display panel described in Embodiment 4 of which semiconductor layer is formed of an SAS, description is made on a driver circuit on a scan line side formed on the substrate 1400 as shown in FIGS. 14B and 14C.

Figure 21:
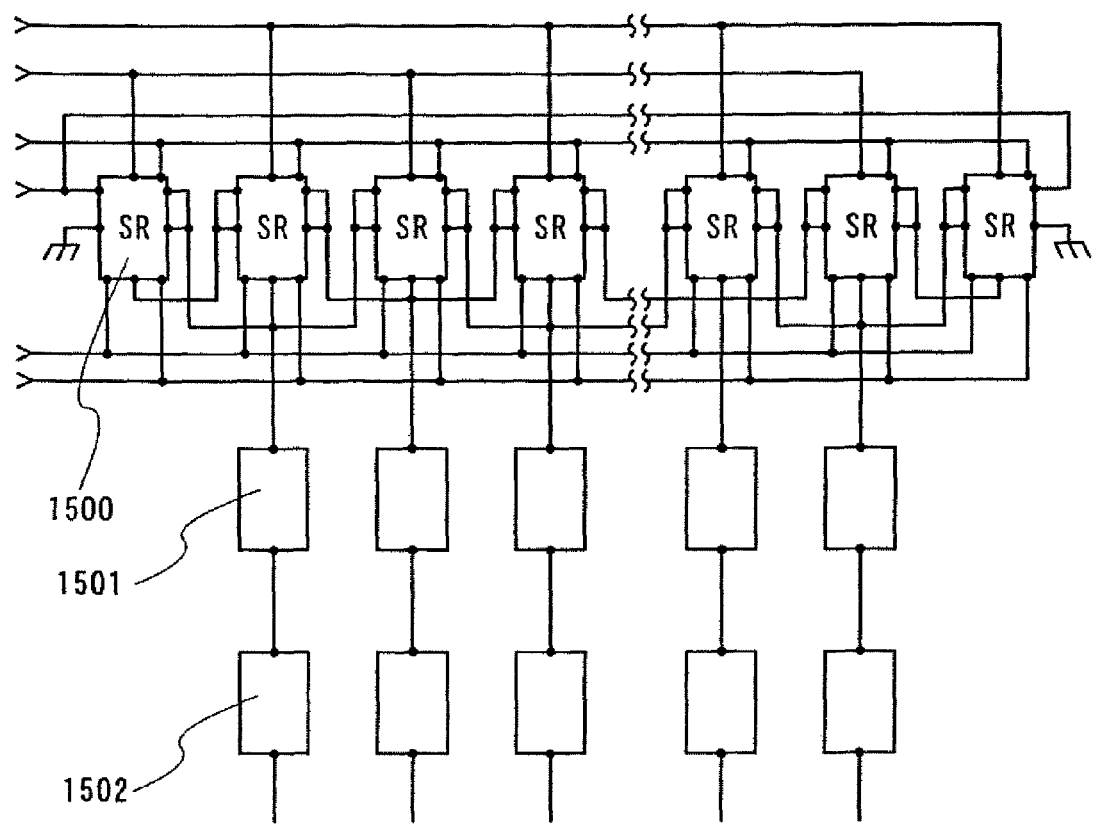
FIG. 21 is a diagram showing a circuit configuration in the case of forming a scan driver circuit using TFTs in a liquid crystal display panel according to the invention.

FIG. 21 is a block diagram of a scan driver circuit formed of n-channel TFTs using an SAS of which electric field effect mobility is 1 to 15 $cm^2/V \cdot sec$.

In FIG. 21, a block denoted by 1500 corresponds to a pulse output circuit which outputs sampling pulses for one stage and a shift register is formed of n pulse output circuits. A pixel is connected to an end of a buffer circuit 1501.

Figure 22:
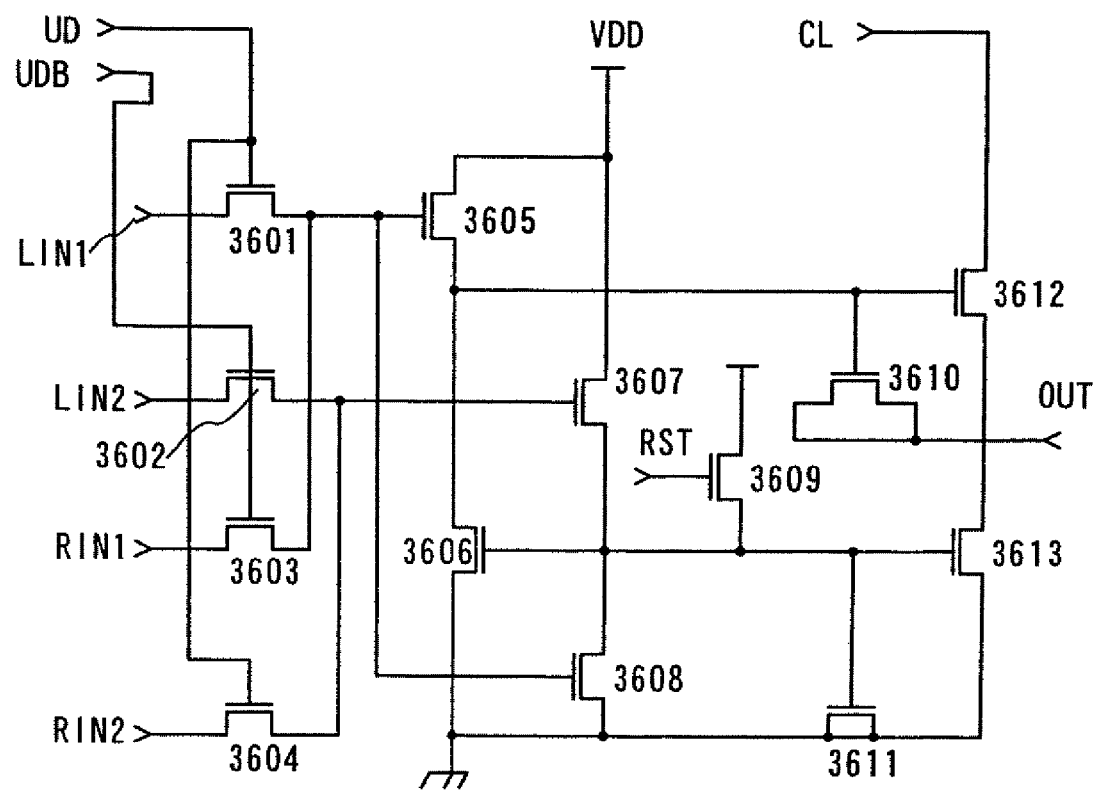
FIG. 22 is a diagram showing a circuit configuration in the case of forming a scan driver circuit using TFTs in a liquid crystal display panel according to the invention (shift register circuit).

FIG. 22 shows a specific configuration of the pulse output circuit 1500 which is formed of n-channel TFTs 3601 to 3612. In consideration of operating characteristics of the n-channel TFT using an SAS, the size of the TFT may be determined. For example, provided that a channel length is 8 μm, a channel width can be set in a range from 10 to 80 μm.

Figure 23:
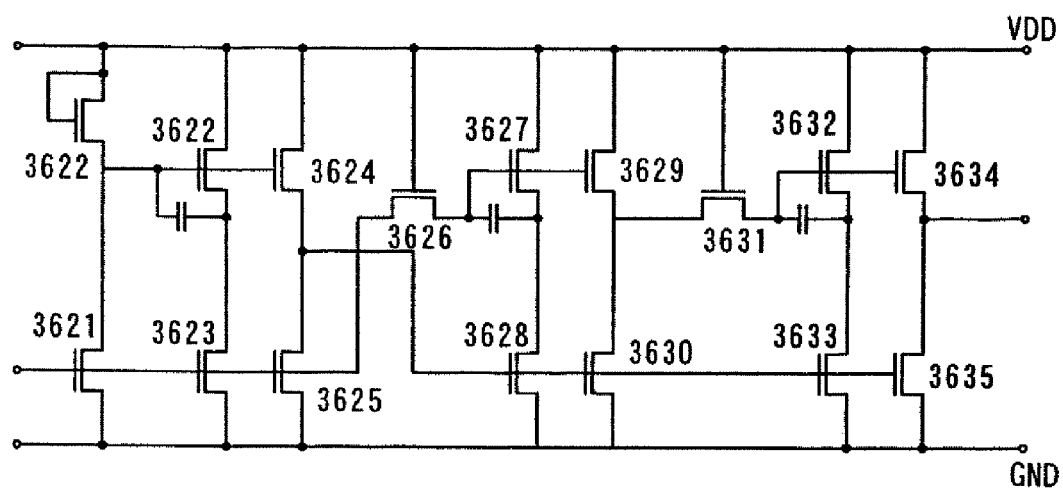
FIG. 23 is a diagram showing a circuit configuration in the case of forming a scan driver circuit using TFTs in a liquid crystal display panel according to the invention (buffer circuit).

FIG. 23 shows a specific configuration of the buffer circuit 1501. The buffer circuit is formed of n-channel TFTs 3621 to 3636 as well. In consideration of operating characteristics of the n-channel TFT using an SAS, the size of the TFT may be determined. For example, provided that a channel length is 10 μm, a channel width can be set in a range from 10 to 1800 μm.

Embodiment 6

In this embodiment, a description is made on a display module. Here, a liquid crystal module is described as an example of the display module with reference to FIG. 16.

Figure 16:
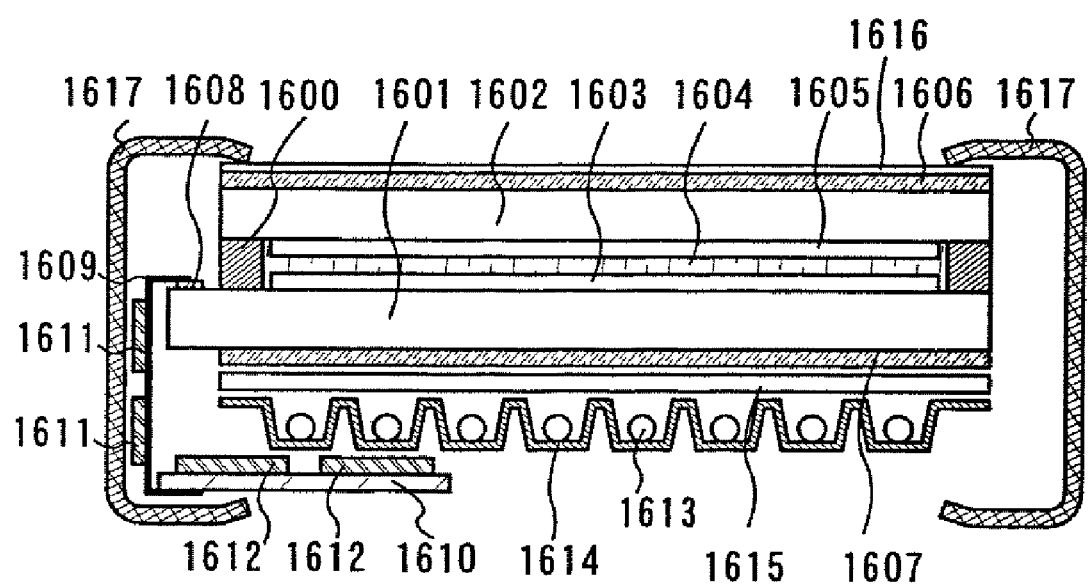
FIG. 16 is a view showing a structure of a liquid crystal display module according to the invention.

In the liquid crystal module shown in FIG. 16, an active matrix substrate 1601 and a counter substrate 1602 are fixed with a sealant 1600, with a pixel portion 1603 and a liquid crystal layer 1604 interposed therebetween which form a display region.

A colored layer 1605 is required in the case of performing a color display. In the case of an RGB method, colored layers corresponding to red, green, and blue are provided for each pixel. Polarizers 1606 and 1607 are provided outside the active matrix substrate 1601 and the counter substrate 1602. A protective film 1616 is formed on the surface of the polarizer 1606 for alleviating external shocks.

The connecting terminal 1608 provided on the active matrix substrate 1601 is connected to a wiring substrate 1610 through an FPC 1609. A pixel driver circuit (an IC chip, a driver IC and the like) 1611 is provided for the FPC and the connecting wiring. The wiring substrate 1610 is incorporated with an external circuit 1612 such as a control circuit and a power source circuit.

A cold cathode tube 1613, a reflector 1614, and an optical film 1615 are a backlight unit as a light source which projects light to a liquid crystal display panel. The liquid crystal panel, the light source, the wiring substrate, the FPC and the like are maintained and protected by a bezel 1617.

Embodiment 7

In this embodiment, an exterior of a light emitting display module is described with reference to FIGS. 30A and 30B as an example of a display module. FIG. 30A is a top plan view of a panel formed of a first substrate and a second substrate sealed with a first sealant 1205 and a second sealant 1206. FIG. 30B is a sectional view along A-A' in FIG. 30A.

In FIG. 30A, reference numeral 1201 shown by a dotted line denotes a signal (source line) driver circuit, 1202 denotes a pixel portion, and 1203 denotes a scan (gate line) driver circuit. In this embodiment, a signal driver circuit 1201, a pixel portion 1202, and a scan driver circuit 1203 are in a region which is sealed by the first sealant and the second sealant. It is preferable to use epoxy resin which has high viscosity containing fillers as the first sealant. It is preferable to use epoxy resin which has low viscosity as the second sealant. It is also preferable that the first sealant 1205 and the second sealant 1206 do not transmit moisture or oxygen as much as possible.

Further, a drying agent may be provided between the pixel portion 1202 and the sealant 1205. In the pixel portion, a drying agent may be provided on the scan line or the signal line. As the drying agent, it is preferable to use a substance which absorbs moisture ($H_2O$) by a chemical absorption such as oxide of alkali earth metal such as calcium oxide (CaO) and barium oxide (BaO). However, a substance which absorbs moisture by physical absorption such as zeolite and silica gel may be used as well.

In addition, resin which has high moisture permeability containing particles of drying agent can be fixed on the second substrate 1204. Here, the resin which has high moisture permeability is, for example, acryl resin such as ester acrylate, ether acrylate, ester urethane acrylate, ether urethane acrylate, butadiene urethane acrylate, special urethane acrylate, epoxy acrylate, amino resin acrylate, and acryl resin acrylate. Besides, epoxy resin such as bisphenol A type liquid epoxy resin, bisphenol A type solid epoxy resin, epoxy resin containing bromine, bisphenol F type resin, bisphenol AD type resin, phenol resin, cresol resin, novolac type resin, cycloaliphatic ring epoxy resin, Epi-Bis type epoxy resin, glycidyl ester resin, glycidyl amine resin, heterocyclic epoxy resin, and modified epoxy resin can be used. Also, other substances may be used as well. An inorganic substance such as siloxane polymer, polyimide, PSG (Phosphor Silicate Glass), and BPSG (Boron Phosphorous Silicon Glass) may be used.

By providing a drying agent in a region overlapped with the scan line and fixing resin which has high moisture permeability containing particles of drying agent on the second substrate, it can be suppressed that moisture enters to a display element and a deterioration caused thereby, without decreasing the aperture ratio.

Note that reference numeral 1210 denotes a connecting wiring for transferring a signal inputted to the signal driver circuit 1201 and the scan driver circuit 1203, which receives a video signal and a clock signal from an FPC (Flexible Printed Circuit) 1209 as an external input terminal through a connecting wiring 1208.

Next, a sectional structure is described with reference to FIG. 30B. A driver circuit and a pixel portion are formed on a first substrate 1200, which have a plurality of semiconductor elements such as TFTs. The signal driver circuit 1201 as the driver circuit and the pixel portion 1202 are shown. Note that the signal driver circuit 1201 comprises a CMOS circuit formed of a combination of an n-channel type TFT 1221 and a p-channel type TFT 1222.

In this embodiment, TFTs of a signal driver circuit, a scan driver circuit, and a pixel portion are formed on the same substrate. Accordingly, the volume of a light emitting display device can be reduced.

The pixel portion 1202 is formed of a plurality of pixels including a switching TFT 1211, a driving TFT 1212, and a first pixel electrode (anode) 1213 formed of a reflective conductive film electrically connected to a drain of the driving TFT 1212.

An interlayer insulating film 1220 for these TFTs 1211, 1212, 1221, and 1222 can be formed by using a material containing an inorganic material (silicon oxide, silicon nitride, silicon oxynitride and the like), and an organic material (polyimide, polyamide, polyimide amide, benzocyclobutene, or siloxane polymer) as a main component. By using siloxane polymer as a source material of the interlayer insulating film, an insulating film having a structure of silicon oxygen as a backbone structure and hydrogen and/or alkyl group as a side chain can be obtained.

Further, an insulator (referred to as a bank, a partition, a barrier, and the like) 1214 is formed at both ends of the first pixel electrode (anode) 1213. In order to obtain a favorable coverage of a film for the insulator 1214, the insulator 1214 is formed so that its top portion and the bottom portion have curved surfaces having curvatures. The insulator 1214 can be formed by using a material containing inorganic material (silicon oxide, silicon nitride, silicon oxynitride, silicon nitride oxide and the like) or an organic material (polyimide, polyamide, polyimide amide, benzocyclobutene, or siloxane polymer) as a main component. Further, by using siloxane polymer as a source material for the insulator, an insulating film having silicon and oxygen as a backbone structure and hydrogen and/or alkyl group as a side chain can be obtained. Also, the insulator 1214 may be covered with an aluminum nitride film, an aluminum nitride oxide film, a thin film containing carbon as a main component, or a protective film (planarizing layer) formed of a silicon nitride film. By using an organic material dissolved or dispersed with a material which absorbs visible light, such as a black pigment and dye, stray light from a light emitting element which is formed later can be absorbed. As a result, contrast of each element is improved. Further, by providing the interlayer insulating film 1220 formed of an insulator which shields light, a light shielding effect can be obtained with the insulator 1214.

A layer 1215 containing a light emitting substance is selectively formed on the first pixel electrode (anode) 1213 by using evaporation of an organic compound material.

The layer containing a light emitting substance can have a known structure appropriately. Here, a structure of the layer 1215 containing a light emitting substance is described with reference to FIGS. 31A to 31F.

Figure 31A:
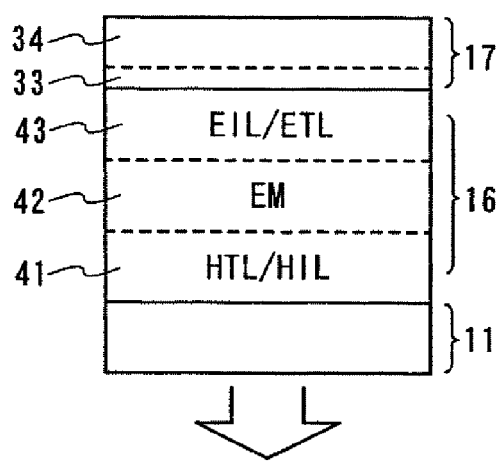
FIGS. 31A to 31F are diagrams showing modes of a light emitting element which can be applied to the invention.

FIG. 31A shows an example of forming a first pixel electrode 11 using a light-transmitting oxide conductive material which contains 1 to 15 atomic % of silicon oxide. A layer 16 containing light emitting substances in which a hole injection layer or a hole transporting layer 41, a light emitting layer 42, an electron transporting layer or an electron injection layer 43 are laminated is provided thereon. A second pixel electrode 17 is formed of a first electrode layer 33 containing alkali metal or alkali earth metal such as LiF and MgAg and a second electrode layer 34 formed of a metal material such as aluminum. A pixel having this structure can emit light from the first pixel electrode 11 side as shown by an arrow in FIG. 31A.

Figure 31B:
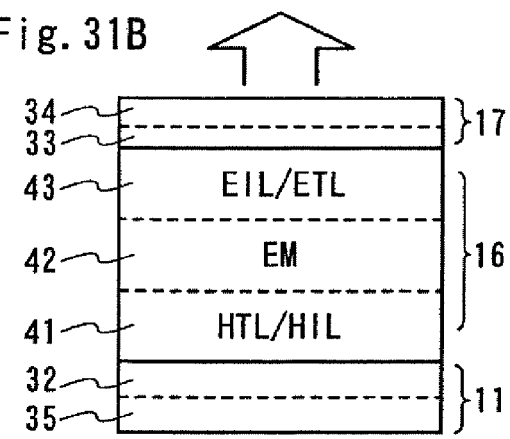

FIG. 31B shows an example of emitting light from the second pixel electrode 17. The first pixel electrode 11 is formed of a first electrode layer 35 formed of metal such as aluminum and titanium, or a metal material containing the aforementioned metal and nitrogen at a concentration equal to or less than the stoichiometric composition ratio, and a second electrode layer 32 formed of oxide conductive material containing silicon oxide at a concentration of 1 to 15 atomic %. The layer 16 containing light emitting substances in which the hole injection layer or the hole transporting layer 41, the light emitting layer 42, the electron transporting layer or the electron injection layer 43 are laminated is provided thereon. The second pixel electrode 17 is formed of a third electrode layer 33 containing alkali metal or alkali earth metal such as LiF and CaF and a fourth electrode layer 34 formed of a metal material such as aluminum. By forming both of the layers in thickness of 100 m or less so as to be able to transmit light, light can be emitted from the second pixel electrode 17.

Figure 31C:
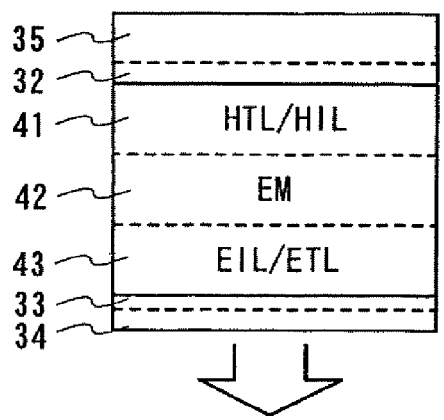
Figure 31D:
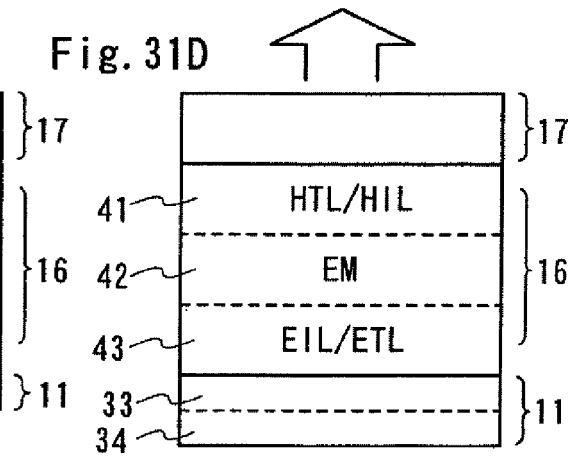
Figure 31E:
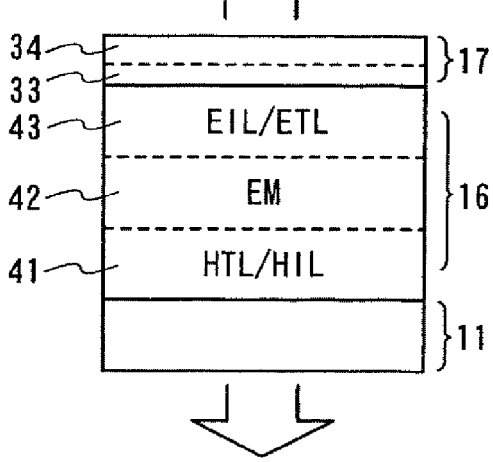

FIG. 31E shows an example of emitting light in both directions, that is from the first electrode and the second electrode. A light-transmitting conductive film which has high work function is used for the first pixel electrode 11 while a light-transmitting conductive film which has low work function is used for the second pixel electrode 17. Representatively, the first pixel electrode 11 is formed of an oxide conductive material containing silicon oxide at a concentration of 1 to 15 atomic % and the second pixel electrode 17 is formed of the third electrode layer 33 containing alkali metal or alkali earth metal such as LiF and CaF and the fourth electrode layer 34 formed of a metal material such as aluminum in thickness of 100 nm or less respectively.

FIG. 31C shows an example of emitting light from the first pixel electrode 11 in which layers containing light emitting substances are laminated in the order of an electron transporting layer or the electron injection layer 43, the light emitting layer 42, the hole injection layer or the hole transporting layer 41. The second pixel electrode 17 is formed of the second electrode layer 32 formed of an oxide conductive material containing silicon oxide at a concentration of 1 to 15 atomic % and the first electrode layer 35 formed of metal such as aluminum and titanium or a metal material containing the aforementioned metal and nitrogen at a concentration equal to or less than the stoichiometric composition ratio in this order from the layer 16 containing a light emitting substance. The first pixel electrode 11 is formed of the third electrode layer 33 containing alkali metal or alkali earth metal such as LiF and CaF and the fourth electrode layer 34 formed of a metal material such as aluminum. By forming both of the layers in thickness of 100 m or less so as to be able to transmit light, light can be emitted from the first pixel electrode 11.

FIG. 31D shows an example of emitting light from the second pixel electrode 17 in which layers containing light emitting substances are laminated in the order of the electron transporting layer or the electron injection layer 43, the light emitting layer 42, the hole injection layer or the hole transporting layer 41. The first pixel electrode 11 has a similar structure as the second pixel electrode of FIG. 31A and is formed in enough thickness to reflect light emitted from the layer containing light emitting substances. The second pixel electrode 17 is formed of an oxide conductive material containing silicon oxide at a concentration of 1 to 15 atomic %. By forming the hole injection layer or the hole transporting layer 41 using a metal oxide as an inorganic substance (representatively molybdenum oxide or vanadium oxide), a hole injection property is improved as oxygen brought in when forming the second pixel electrode 17 is supplied, thus a driving voltage can be decreased.

Figure 31F:
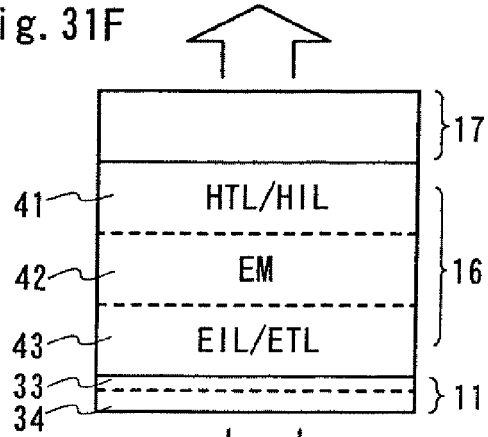

FIG. 31F shows an example of emitting light in both directions, that is from the first pixel electrode and the second pixel electrode. A light-transmitting conductive film which has low work function is used for the first pixel electrode 11 and a light-transmitting conductive film which has high work function is used for the second pixel electrode 17. Representatively, the first pixel electrode 11 is formed of the third electrode layer 33 containing alkali metal or alkali earth metal such as LiF and CaF, and the fourth electrode layer 34 formed of a metal material such as aluminum, and the second pixel electrode 17 is formed of an oxide conductive material containing silicon oxide at a concentration of 1 to 15 atomic %.

In this manner, a light emitting element 1217 formed of the first pixel electrode (anode) 1213, the layer 1215 containing light emitting substances, and the second pixel electrode (cathode) 1216 is formed as shown in FIG. 30B. The light emitting element 1217 emits light to the second substrate 1204 side.

For sealing the light emitting element 1217, a protective laminated layer 1218 is formed. The protective laminated layer 1218 is formed by a lamination of a first inorganic insulating film, a relaxation film, and a second inorganic insulating film. Next, the protective laminated layer 1218 and the second substrate 1204 are adhered with a first sealant 1205 and a second sealant 1206. Note that it is preferable that the second sealant be dropped by using an apparatus for dropping a sealant such as an apparatus for dropping liquid crystals as shown in FIG. 28 of Embodiment 1. After applying a sealant on an active matrix substrate by dropping or discharging from a dispenser, the second substrate and the active matrix substrate can be adhered in vacuum and sealed by ultraviolet curing.

Note that a phase-contrast plate 1229 of ½λ or ¼λ and an antireflection film 1226 are provided on the surface of polarizer 1225 which is fixed on the surface of the second substrate 1204. Further, the phase-contrast plate of ¼λ and the phase-contrast plate of ½λ and the polarizer 1225 may be sequentially provided in this order from the second substrate 1204. By providing the phase-contrast plate and the polarizer, it can be prevented that external light reflects on the pixel electrode. The first pixel electrode 1213 and the second pixel electrode 1216 are formed of a conductive film which transmits light or does not transmit light and the interlayer insulating film 1220 is formed of a material which absorbs visible light or an organic material dissolved or dispersed with a material which absorbs visible light, thereby external light is not reflected on each pixel electrode, therefore, the phase-contrast plate or the polarizer do not have to be used.

The connecting wiring 1208 and the FPC 1209 are electrically connected to each other by an anisotropic conductive film or anisotropic conductive resin 1227. Further, it is preferable to seal a connecting portion between each wiring layer and a connecting terminal with sealing resin. According to this structure, it can be prevented that moisture from a sectional portion enters to the light emitting element, causing deterioration.

Note that a space filled with inert gas, for example, nitrogen gas may be provided between the second substrate 1204 and the protective laminated layer 1218. Accordingly, moisture and oxygen can be further prevented.

A colored layer can be provided between the pixel portion 1202 and the polarizer 1225. In this case, by providing a light emitting element which can emit white light in a pixel portion and a colored layer expressing RGB, a full color display can be performed. Further, by providing a light emitting element which can emit blue color in the pixel portion and providing a color conversion layer and the like separately, a full color display can be performed. Also, light emitting elements which emit red, green and blue can be formed in each pixel portion and also a colored layer can be used as well. Such a display module has high color purity and can perform high resolution display.

A light emitting display module can be formed by using a substrate formed of a film, resin, or the like for one or both of the first substrate 1200 or the second substrate 1204. By sealing without using a counter substrate in this manner, improved lightweight, compact, and thin display device can be formed.

Note that any one of Embodiment Modes 1 to 9 can be applied to this embodiment. In this embodiment, a light emitting display module is described as a display module, however, the invention is not limited to this and can be applied to display modules such as a light emitting display device, a DMD (Digital Micromirror Device), a PDP (Plasma Display Panel), an FED (Field Emission Display), and an electrophoresis display device (electronic paper).

Embodiment 8

By incorporating the display module described in Embodiment 6 or 7 into a housing, various electronic apparatuses can be manufactured. The electronic apparatuses include a television apparatus, a video camera, a digital camera, a goggle type display (a head mounted display), a navigation system, an audio reproducing apparatus (a car audio system, an audio component set and the like), a notebook personal computer, a game machine, a portable information terminal (a mobile computer, a portable phone, a portable game machine, an electronic book or the like), an image reproducing apparatus provided with a memory medium (specifically an apparatus provided with a display which reproduces a memory medium such as a Digital Versatile Disc (DVD) and can display the reproduced image), and the like. Here, as examples of these electronic apparatuses, FIGS. 17 and 18 show a television apparatus and block diagrams thereof and FIGS. 19A and 19B each shows a digital camera.

Figure 17:
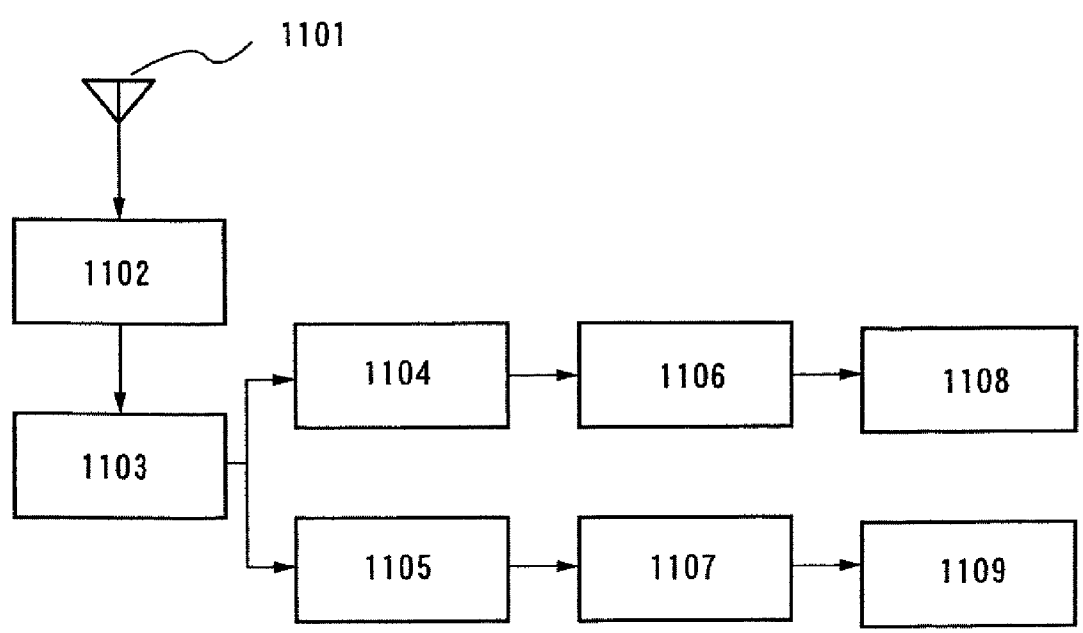
FIG. 17 is a block diagram showing a structure of an electronic apparatus.
Figure 18:
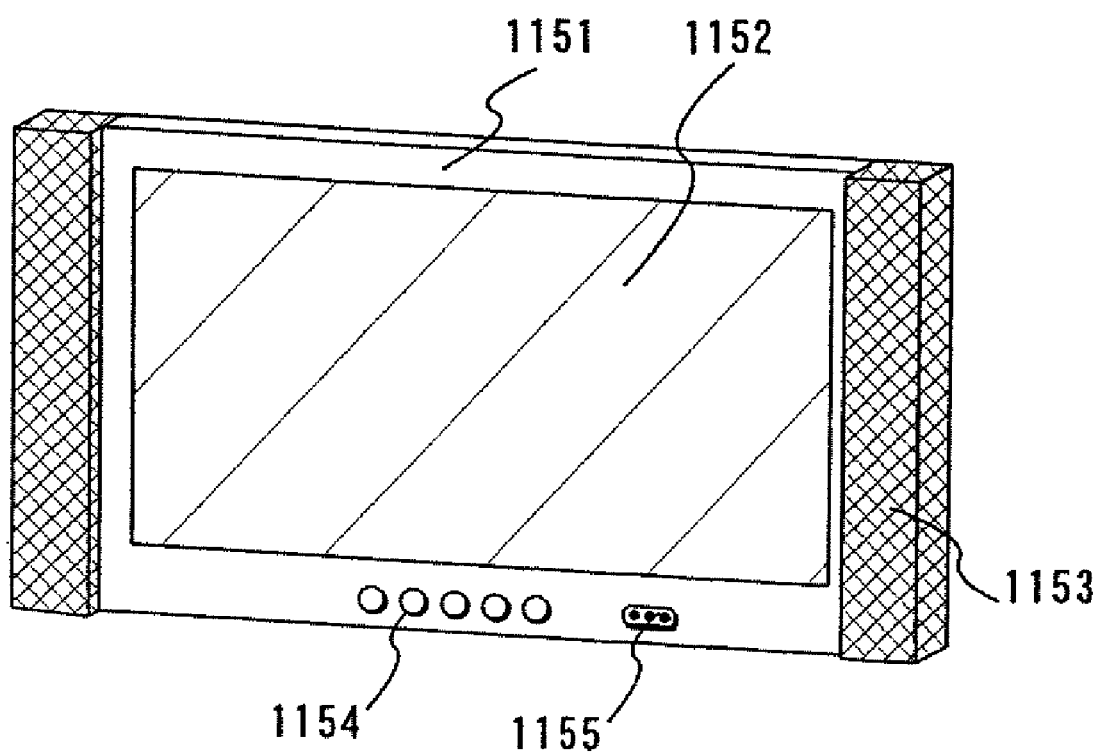
FIG. 18 is a diagram showing an example of an electronic apparatus.

FIG. 17 shows a typical structure of a television apparatus which receives an analog television broadcast, In FIG. 17, an electric wave for television broadcast received by an antenna 1101 is inputted to a tuner 1102. The tuner 1102 generates and outputs an intermediate frequency (IF) signal by mixing a high frequency television signal inputted from the antenna 1101 with a signal of local oscillation frequency controlled according to a desired receiver frequency.

The IF signal taken out from the tuner 1102 is amplified to a required voltage by an intermediate frequency amplifier (an IF amplifier) 1103, and then a video detection is performed by a video detection circuit 1104 as well as a sound detection is performed by a sound detection circuit 1105. The video signal outputted from the video detection circuit 1104 is separated into a luminance signal and a color signal by a video signal processing circuit 1106 and become a video signal through a predetermined video signal processing, and then outputted to a video system output portion 1108 of a liquid crystal display device, a light emitting display device, a DMD (Digital Micromirror Device), a PDP (Plasma Display Panel), an FED (Field Emission Display), an electrophoresis display device (electronic paper) and the like as one of the invention.

Further, a signal outputted from the sound detection circuit 1105 becomes a sound signal through a processing such as an FM demodulation by the sound system processing circuit 1107, then appropriately amplified, and outputted to a sound system output portion 1109 such as a speaker.

A television apparatus using the invention is not limited to an application to an analog broadcast such as a ground-based broadcast such as VHF band and UHF band, a cable broadcast, or a BS broadcast, but can be applied to a digital terrestrial television broadcast, a cable digital broadcast or a BS digital broadcast.

FIG. 18 shows a perspective view of the television apparatus seen from a front side, including a housing 1151, a display portion 1152, a speaker portion 1153, an operating portion 1154, a video input terminal 1155 and the like. FIG. 17 shows a structure thereof.

The display portion 1152 is an example of the video system output portion 1108 of FIG. 17, which displays an image.

The speaker portion 1153 is an example of the sound system output portion of FIG. 17, which outputs sound.

The operating portion 1154 is provided with a power source switch, a volume switch, a switch selector, a tuner switch, a selection switch and the like. By pressing the switches, ON/OFF of the power source, selection of images, control of sound, selection of a tuner and the like are operated. Although not shown, the aforementioned selection can also be performed by a remote controller type operating portion.

The video input terminal 1155 is a terminal for inputting a video signal from outside a VTR, a DVD, a game machine and the like into the television apparatus.

In the case where the television apparatus described in this embodiment is a wall-mounted television apparatus, a portion for hanging on wall is provide on the back of the main body.

By using a display device as an example of a semiconductor device of the invention for a display portion of the television apparatus, a low cost television apparatus can be manufactured with high throughput and yield. Further, by using a semiconductor device of the invention for a CPU which controls the video detection circuit, the video processing circuit, the sound detection circuit, and the sound processing circuit of the television apparatus, a low cost television apparatus can be manufactured with high throughput and yield. Accordingly, the invention can be applied particularly to a large display medium such as a wall-mounted television apparatus, an information display board at train stations, airports and the like, an advertisement display board on the streets and the like.

Figure 19A:
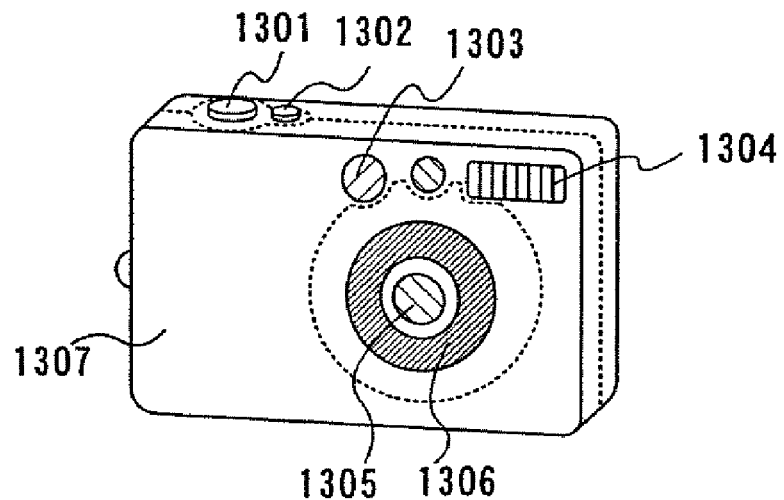
FIGS. 19A and 19B are diagrams showing examples of an electronic apparatus.
Figure 19B:
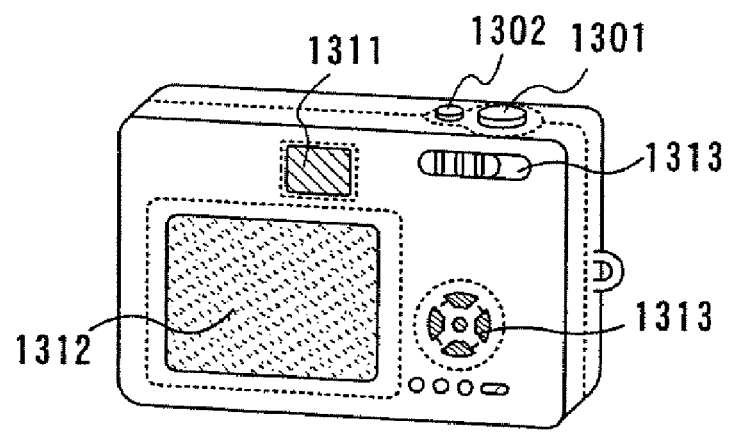

FIGS. 19A and 19B show examples of a digital camera. FIG. 19A is a perspective view of the digital camera seen from the front while FIG. 19B is a perspective view thereof seen from the back. In FIG. 19A, the digital camera includes a release button 1301, a main switch 1302, a finder 1303, a flash 1304, a lens 1305, a camera cone 1306, and a housing 1307.

In FIG. 19B, a finder eyepiece window 1311, a monitor 1312, and an operating button 1313 are provided.

By pressing the release button 1301 to a half position, a focus adjusting assembly and an exposure adjusting assembly are operated, and a shutter opens when the release button 1301 is pressed to the bottom position.

By pressing or rotating the main switch 1302, ON/OFF of the power source of the digital camera is switched.

The finder 1303 is disposed above the lens 1305 on the front of the digital camera, which is used for checking a shooting range and a position of focus from the finder eyepiece window 1311 shown in FIG. 19B.

The flash 1304 is disposed at an upper front portion of the digital camera, which irradiates fill light when the object luminance is low as the shutter opens with the release button pressed.

The lens 1305 is disposed on the front of the digital camera. The lens is formed of a focusing lens, a zoom lens and the like and constitutes an imaging optical system with the shutter and an aperture which are not shown. Moreover, an image sensor such as a CCD (Charge Coupled Device) is provided in the back of the lens.

The camera corn 1306 moves the lens for adjusting the focus of the focusing lens, the zoom lens and the like. When shooting an image, the lens 1305 is moved forward by sending out the camera cone. When carried, the lens 1305 is stowed for compactness. In this embodiment, an object can be shot by zooming by sending out the camera cone, however, the invention is not limited to this structure and may be a digital camera which is capable of shooting an image by zooming without sending out the camera cone according to a structure of an imaging optical system in the housing 1307.

The finder eyepiece window 1311 is provided on upper back portion of the digital camera, which is used for checking a shooting range and a position of focus.

The operating button 1313 is a button having various functions provided on the back of the digital camera, which includes a set-up button, a menu button, a display button, a function button, a selection button, and the like.

By using a display device as one mode of a semiconductor device of the invention for a monitor, a low cost digital camera can be manufactured with high throughput and yield. In addition, by using a CPU as one mode of a semiconductor device of the invention for a CPU which performs processing by receiving an input of the button having various functions, the main switch, the release button and the like, a CPU which controls each of a circuit which performs an auto focusing operation and an auto focus adjusting operation, a timing circuit which controls driving of stroboscopic light and CCD (Charge Coupled Device), an image pick-up circuit which generates a video signal from a signal photoelectrically converted by an image sensor such as a CCD, an A/D converter circuit which converts a video signal generated in the image pick-up circuit into a digital signal, a memory interface which writes and reads out video data of memory, a low cost digital camera can be manufactured with high throughput and high yield.

This application is based on Japanese Patent Applications serial no. 2004-009232 and 2004-134898 filed in Japan Patent Office on Jan. 16, 2004 and Apr. 28, 2004 respectively, the contents of which are hereby incorporated by reference.

What is claimed is:

1. A method for manufacturing a semiconductor device comprising:
   forming a film pattern over a substrate by discharging a droplet containing gallium and zinc in a solvent;
   heating the film pattern in an oxygen atmosphere at a low pressure to remove the solvent;
   forming a gate insulating film over the film pattern; forming a semiconductor layer over the gate insulating film;
   forming a source electrode and a drain electrode over the semiconductor layer;
   forming a mask pattern having a liquid repellent surface by discharging a solution so as to be in contact with the source electrode and the drain electrode;
   forming an interlayer insulating film over the source electrode and the drain electrode by discharging a lyophilic solution;
   removing the mask pattern; and
   forming a conductive film over the interlayer insulating film after removing the mask pattern.

2. A method for manufacturing a semiconductor device according to claim 1, wherein the film pattern is a gate wiring.

3. A method for manufacturing a semiconductor device according to claim 1, wherein a viscosity of the droplet is 5 to 20 mPa·s.

4. A method for manufacturing a semiconductor device according to claim 1, wherein the discharging step is performed under a low pressure.

5. A method for manufacturing a semiconductor device according to claim 1, wherein the droplet contains gallium-doped zinc oxide.

6. A method for manufacturing a semiconductor device according to claim 1, wherein a surface tension of the droplet is 40 mN/m or less.

7. A method for manufacturing a semiconductor device comprising:
   forming a film pattern over a substrate by discharging a droplet containing indium and zinc in a solvent;
   heating the film pattern in an oxygen atmosphere at a low pressure to remove the solvent;
   forming a gate insulating film over the film pattern;
   forming a semiconductor layer over the gate insulating film;
   forming a source electrode and a drain electrode over the semiconductor layer;
   forming a mask pattern having a liquid repellent surface by discharging a solution so as to be in contact with the source electrode and the drain electrode;
   forming an interlayer insulating film over the source electrode and the drain electrode by discharging a lyophilic solution;
   removing the mask pattern; and
   forming a conductive film over the interlayer insulating film after removing the mask pattern.

8. A method for manufacturing a semiconductor device according to claim 7, wherein the film pattern is a gate wiring.

9. A method for manufacturing a semiconductor device according to claim 7, wherein a viscosity of the droplet is 5 to 20 mPa·s.

10. A method for manufacturing a semiconductor device according to claim 7, wherein the discharging step is performed under a low pressure.

11. A method for manufacturing a semiconductor device according to claim 7, wherein the droplet contains indium zinc oxide.

12. A method for manufacturing a semiconductor device according to claim 7, wherein a surface tension of the droplet is 40 mN/m or less.

13. A method for manufacturing a semiconductor device comprising:
   forming a film pattern over a substrate by printing a material containing gallium and zinc in a solvent; and
   heating the film pattern in an oxygen atmosphere at a low pressure to remove the solvent;
   forming a gate insulating film over the film pattern;
   forming a semiconductor layer over the gate insulating film;
   forming a source electrode and a drain electrode over the semiconductor layer;
   forming a mask pattern having a liquid repellent surface by discharging a solution so as to be in contact with the source electrode and the drain electrode;
   forming an interlayer insulating film over the source electrode and the drain electrode by discharging a lyophilic solution;
   removing the mask pattern; and
   forming a conductive film over the interlayer insulating film after removing the mask pattern.

14. A method for manufacturing a semiconductor device according to claim 13, wherein the film pattern is a gate wiring.

15. A method for manufacturing a semiconductor device according to claim 13, wherein the material contains gallium-doped zinc oxide.

16. A method for manufacturing a semiconductor device according to claim 13, wherein a surface tension of the material is 40 mN/m or less.

17. A method for manufacturing a semiconductor device comprising:
   forming a film pattern over a substrate by printing a material containing indium and zinc in a solvent; and
   heating the film pattern in an oxygen atmosphere at a low pressure to remove the solvent;
   forming a gate insulating film over the film pattern;
   forming a semiconductor layer over the gate insulating film;
   forming a source electrode and a drain electrode over the semiconductor layer;
   forming a mask pattern having a liquid repellent surface by discharging a solution so as to be in contact with the source electrode and the drain electrode;
   forming an interlayer insulating film over the source electrode and the drain electrode by discharging a lyophilic solution;
   removing the mask pattern; and
   forming a conductive film over the interlayer insulating film after removing the mask pattern.

18. A method for manufacturing a semiconductor device according to claim 17, wherein the film pattern is a gate wiring.

19. A method for manufacturing a semiconductor device according to claim 17, wherein the material contains indium zinc oxide.

20. A method for manufacturing a semiconductor device according to claim 17, wherein a surface tension of the material is 40 mN/m or less.

* * * * *